United States Patent
Chiang et al.

(10) Patent No.: US 11,677,010 B2
(45) Date of Patent: Jun. 13, 2023

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Kuo-Cheng Chiang, Zhubei (TW); Chen-Feng Hsu, Hsinchu (TW); Chao-Ching Cheng, Hsinchu (TW); Tzu-Chiang Chen, Hsinchu (TW); Tung Ying Lee, Hsinchu (TW); Wei-Sheng Yun, Taipei (TW); Yu-Lin Yang, Baoshan Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 39 days.

(21) Appl. No.: 17/080,575

(22) Filed: Oct. 26, 2020

(65) Prior Publication Data
US 2021/0057539 A1    Feb. 25, 2021

Related U.S. Application Data

(63) Continuation of application No. 16/837,853, filed on Apr. 1, 2020, now Pat. No. 10,818,777, which is a
(Continued)

(51) Int. Cl.
*H01L 29/66* (2006.01)
*H01L 21/02* (2006.01)
(Continued)

(52) U.S. Cl.
CPC ...... *H01L 29/6656* (2013.01); *H01L 21/0245* (2013.01); *H01L 21/02172* (2013.01);
(Continued)

(58) Field of Classification Search
CPC ... H01L 29/66795; H01L 29/785–7851; H01L 29/42392; H01L 29/0673;
(Continued)

(56) References Cited

U.S. PATENT DOCUMENTS 8,384,069 B2 * 2/2013 Pernel ................. H01L 29/0673
977/750
9,209,247 B2   12/2015 Colinge et al.
(Continued)

FOREIGN PATENT DOCUMENTS

TW    201724278 A    7/2017
TW    201735268 A    10/2017

OTHER PUBLICATIONS

Non-Final Office Action issued in related U.S. Appl. No. 15/798,270, dated Oct. 4, 2018.
(Continued)

*Primary Examiner* — Errol V Fernandes
*Assistant Examiner* — Jeremy J Joy
(74) *Attorney, Agent, or Firm* — McDermott Will & Emery LLP

(57) ABSTRACT

In a method of manufacturing a semiconductor device, a fin structure, in which first semiconductor layers and second semiconductor layers are alternately stacked, is formed. A sacrificial gate structure is formed over the fin structure. A source/drain region of the fin structure, which is not covered by the sacrificial gate structure, is etched, thereby forming a source/drain space. The first semiconductor layers are laterally etched through the source/drain space. An inner spacer made of a dielectric material is formed on an end of each of the etched first semiconductor layers. A source/drain epitaxial layer is formed in the source/drain space to cover the inner spacer. A lateral end of each of the first semiconductor
(Continued)

layers has a V-shape cross section after the first semiconductor layers are laterally etched.

20 Claims, 36 Drawing Sheets

Related U.S. Application Data continuation-in-part of application No. 15/798,270, filed on Oct. 30, 2017, now Pat. No. 10,714,592.

(51) Int. Cl.
  *H01L 21/3105* (2006.01)
  *H01L 21/8238* (2006.01)
  *H01L 29/78* (2006.01)

(52) U.S. Cl.
  CPC .. *H01L 21/02236* (2013.01); *H01L 21/31056* (2013.01); *H01L 21/823814* (2013.01); *H01L 21/823864* (2013.01); *H01L 29/7848* (2013.01)

(58) Field of Classification Search
  CPC ......... H01L 29/78696; H01L 29/66439; H01L 29/775; H01L 21/823431; H01L 21/823821; H01L 27/0886; H01L 27/1211; H01L 27/0924
  See application file for complete search history.

(56) References Cited

U.S. PATENT DOCUMENTS

| | | | |
|---|---|---|---|
| 9,236,267 B2 | 1/2016 | De et al. | |
| 9,362,355 B1* | 6/2016 | Cheng | H01L 29/4991 |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,570,551 B1 | 2/2017 | Balakrishnan et al. | |
| 9,576,814 B2 | 2/2017 | Wu et al. | |
| 9,608,116 B2* | 3/2017 | Ching | H01L 21/283 |
| 9,954,058 B1* | 4/2018 | Mochizuki | H01L 29/42392 |
| 2005/0169096 A1 | 8/2005 | Lee et al. | |
| 2013/0161756 A1 | 6/2013 | Glass et al. | |
| 2014/0001441 A1 | 1/2014 | Kim et al. | |
| 2015/0090958 A1* | 4/2015 | Yang | H01L 29/0847 257/27 |
| 2015/0123176 A1 | 5/2015 | Maeda et al. | |
| 2015/0270340 A1* | 9/2015 | Frank | H01L 21/31111 438/151 |
| 2015/0340457 A1* | 11/2015 | Xie | H01L 29/78618 257/288 |
| 2015/0372104 A1* | 12/2015 | Liu | H01L 29/36 257/77 |
| 2015/0372115 A1* | 12/2015 | Koh | H01L 29/66545 438/301 |
| 2015/0380313 A1 | 12/2015 | Ching et al. | |
| 2016/0020305 A1* | 1/2016 | Obradovic | H01L 29/7391 438/157 |
| 2016/0027870 A1 | 1/2016 | Cheng et al. | |
| 2016/0027929 A1* | 1/2016 | Cheng | H01L 29/1037 438/151 |
| 2016/0190246 A1* | 6/2016 | Frank | H01L 27/1203 257/347 |
| 2016/0204277 A1* | 7/2016 | Yang | H01L 29/66742 438/151 |
| 2016/0211322 A1* | 7/2016 | Kim | H01L 29/78696 |
| 2016/0365440 A1 | 12/2016 | Suk et al. | |
| 2017/0005188 A1 | 1/2017 | Cheng et al. | |
| 2017/0069763 A1* | 3/2017 | Doris | H01L 29/78684 |
| 2017/0104061 A1 | 4/2017 | Peng et al. | |
| 2017/0104062 A1 | 4/2017 | Bi et al. | |
| 2017/0110541 A1 | 4/2017 | Xu et al. | |
| 2017/0110554 A1* | 4/2017 | Tak | H01L 29/42392 |
| 2017/0194430 A1* | 7/2017 | Wood | H01L 29/0673 |
| 2017/0213888 A1 | 7/2017 | Chang et al. | |
| 2017/0213911 A1 | 7/2017 | Balakrishnan et al. | |
| 2017/0221893 A1* | 8/2017 | Tak | H01L 21/823431 |
| 2017/0222006 A1* | 8/2017 | Suh | H01L 29/42392 |
| 2017/0229555 A1* | 8/2017 | Balakrishnan | H01L 29/7853 |
| 2017/0250261 A1* | 8/2017 | Kim | H01L 29/78696 |
| 2017/0365604 A1* | 12/2017 | Suh | H01L 27/092 |
| 2018/0190829 A1 | 7/2018 | Song et al. | |
| 2018/0358435 A1* | 12/2018 | Mochizuki | H01L 29/0673 |
| 2019/0058052 A1 | 2/2019 | Frougier et al. | |
| 2019/0280088 A1 | 9/2019 | Xu et al. | |
| 2019/0371917 A1 | 12/2019 | Lee et al. | |
| 2019/0378915 A1 | 12/2019 | Frougier et al. | |
| 2020/0027736 A1* | 1/2020 | Yoshida | H01L 29/0673 |
| 2020/0168742 A1 | 5/2020 | Wang et al. | |

OTHER PUBLICATIONS

Final Office Action issued in related U.S. Appl. No. 15/798,270, dated Mar. 5, 2019.
Non-Final Office Action issued in related U.S. Appl. No. 15/798,270, dated Jul. 31, 2019.
Final Office Action issued in U.S. Appl. No. 15/798,270, dated Dec. 16, 2019.
Non-Final Office Action issued in related U.S. Appl. No. 16/657,723, dated Dec. 5, 2019.
Notice of Allowance issued in related U.S. Appl. No. 15/798,270, dated Mar. 9, 2020.
Final Office Action issued in related U.S. Appl. No. 16/657,723, dated Mar. 25, 2020.
Notice of Allowance issued in U.S. Appl. No. 16/837,853, dated Jun. 22, 2020.

* cited by examiner

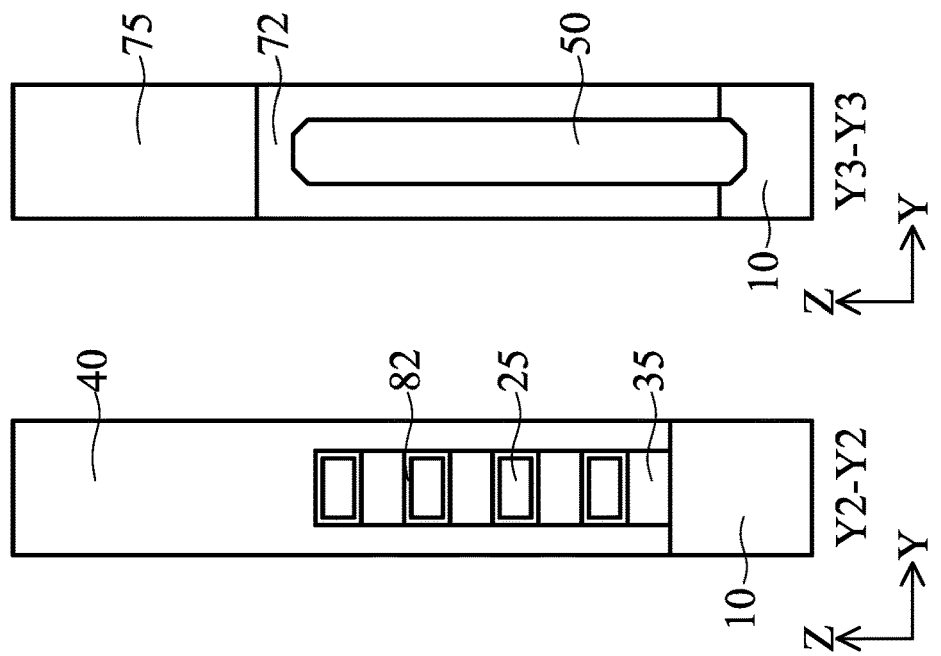
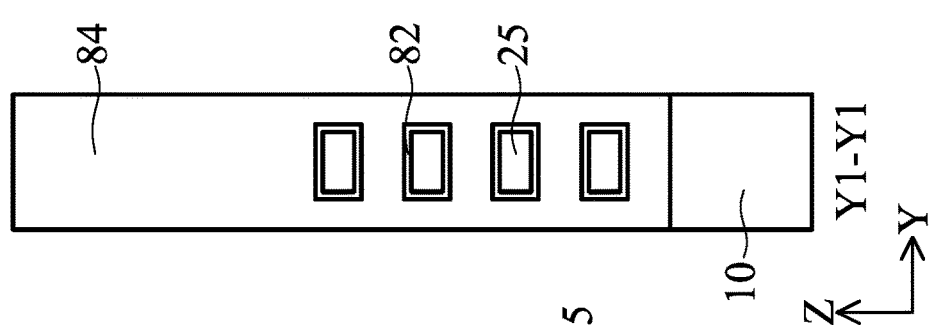
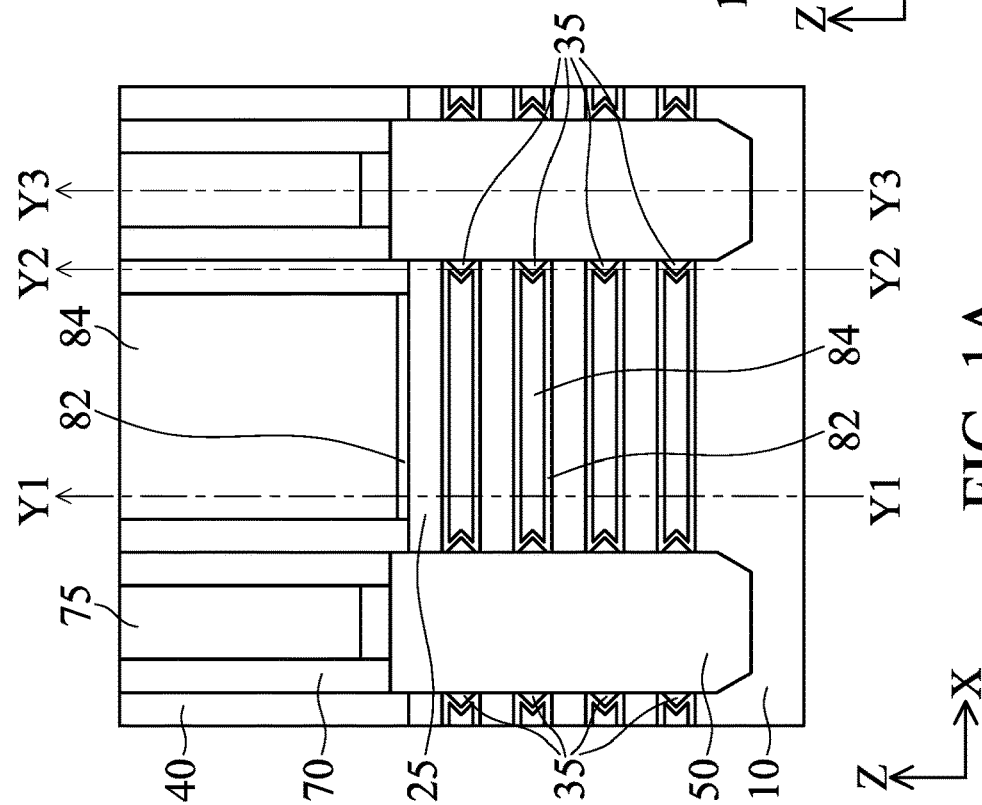

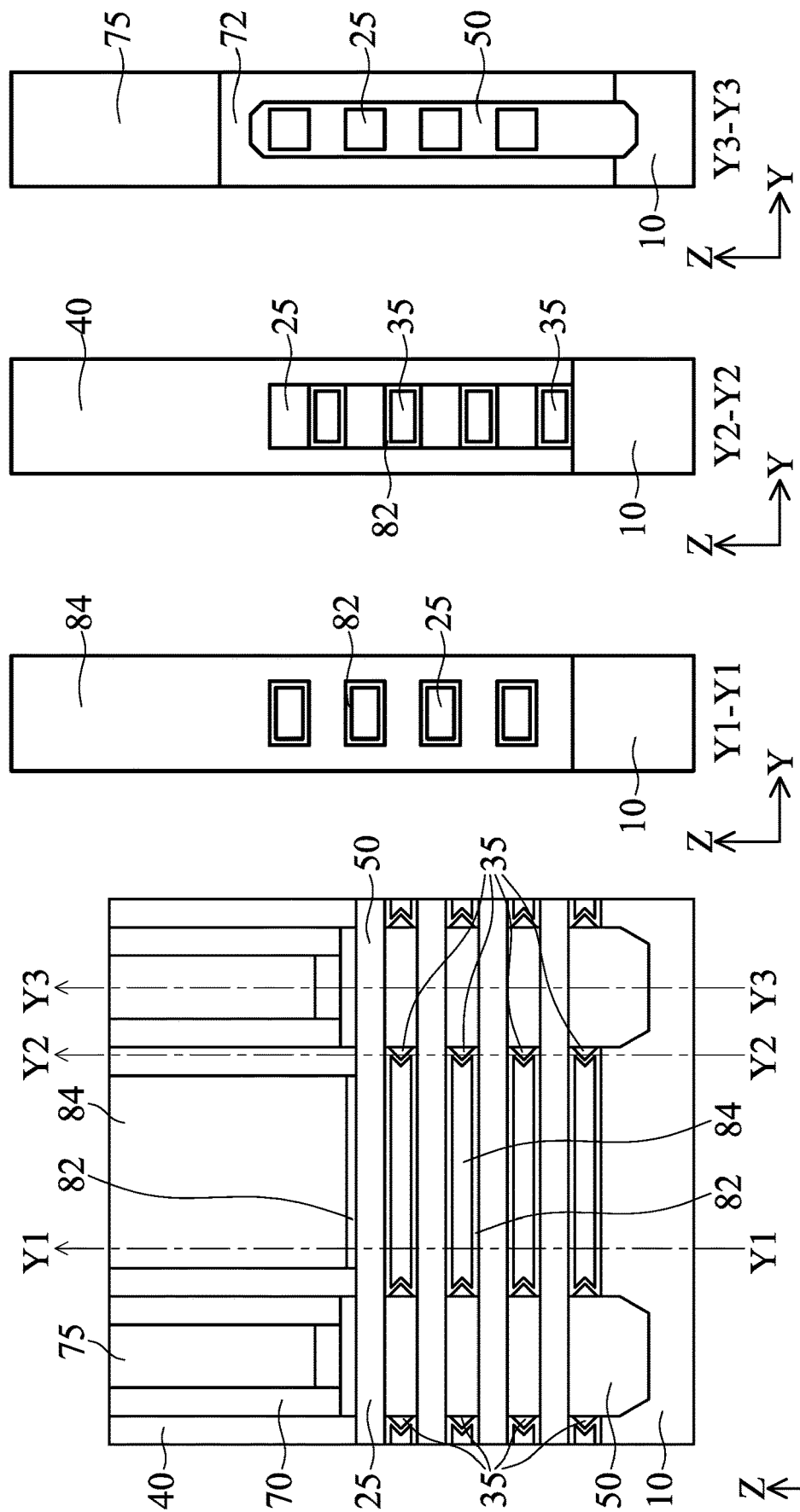

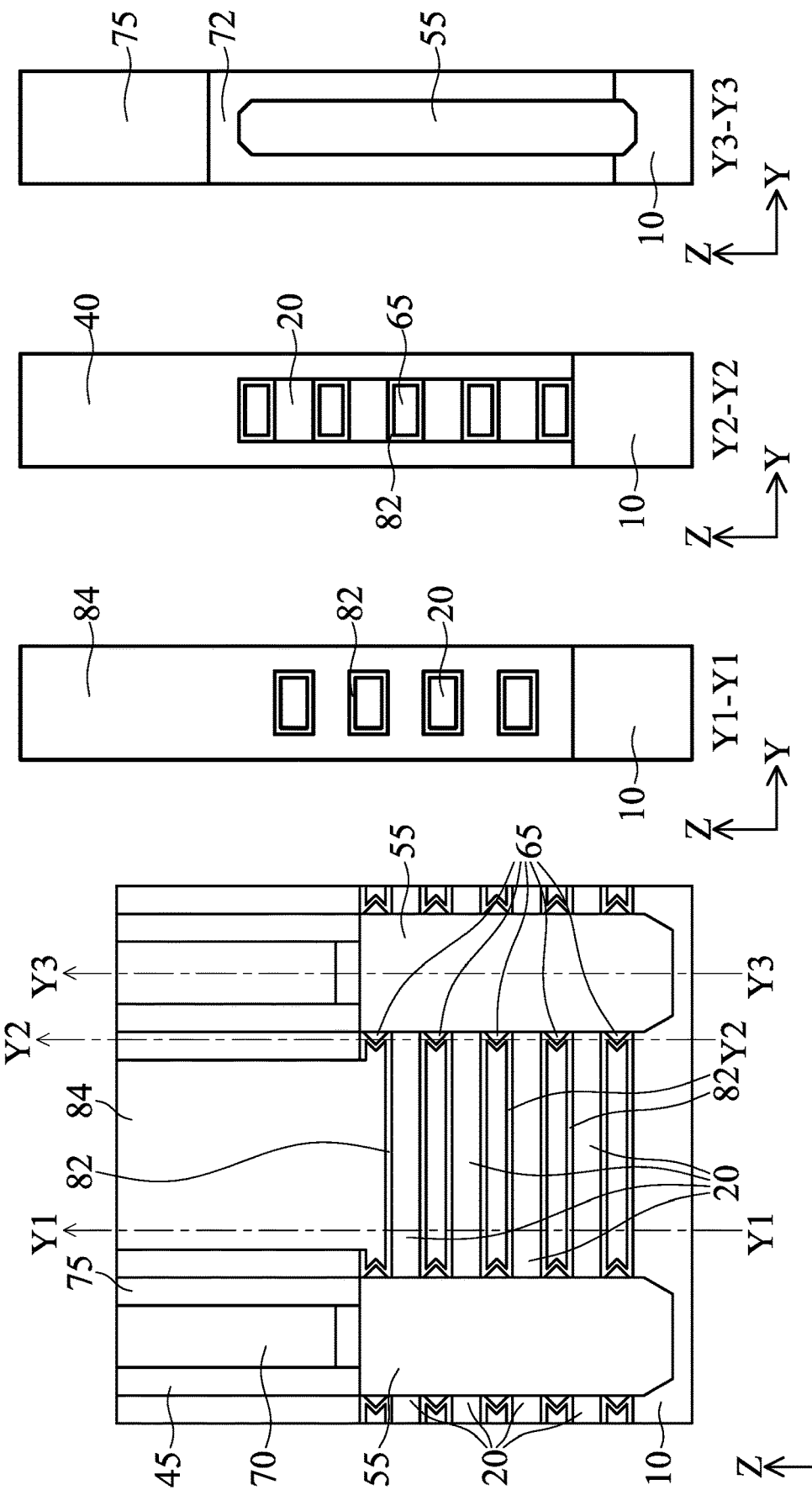

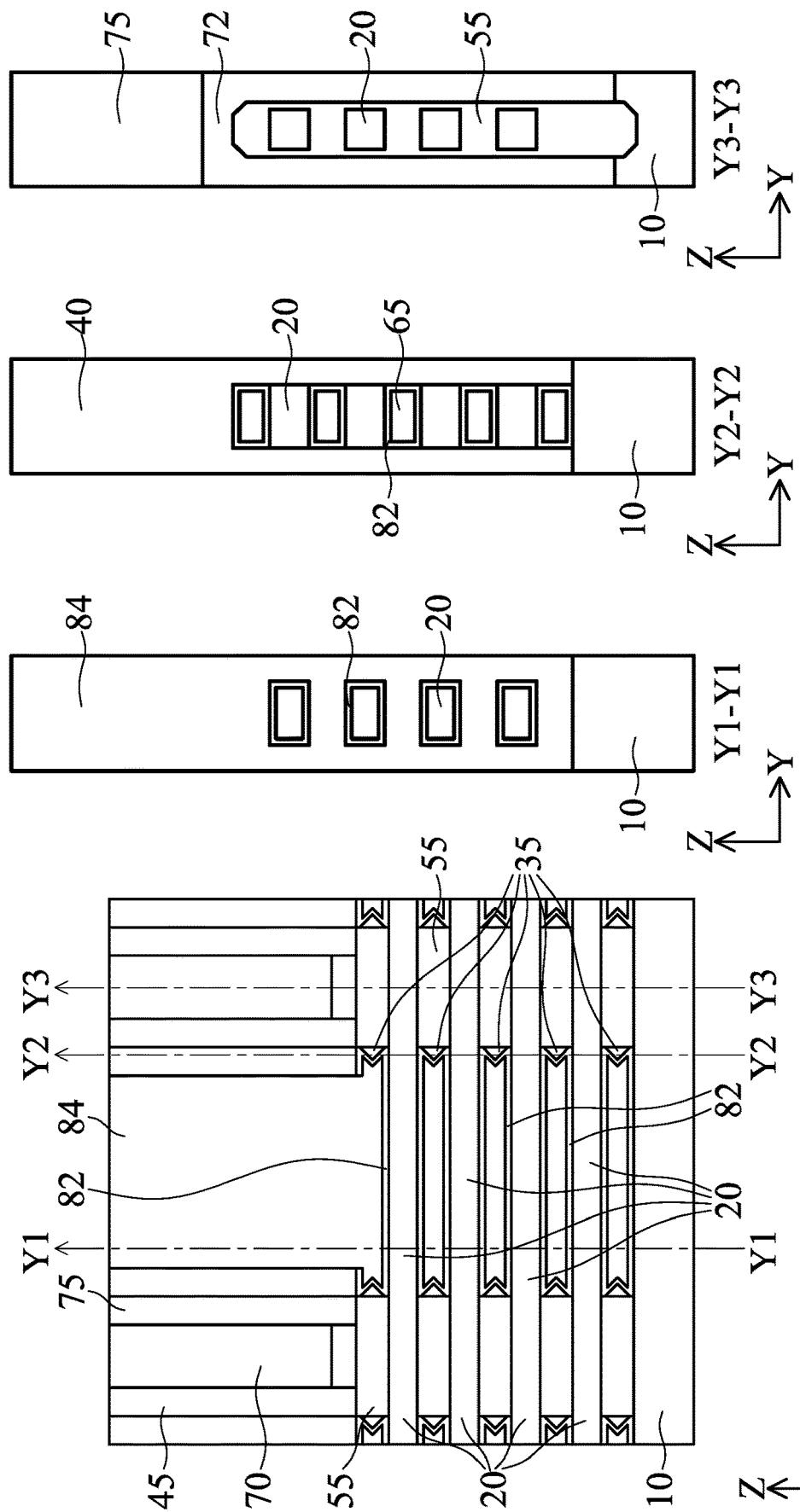

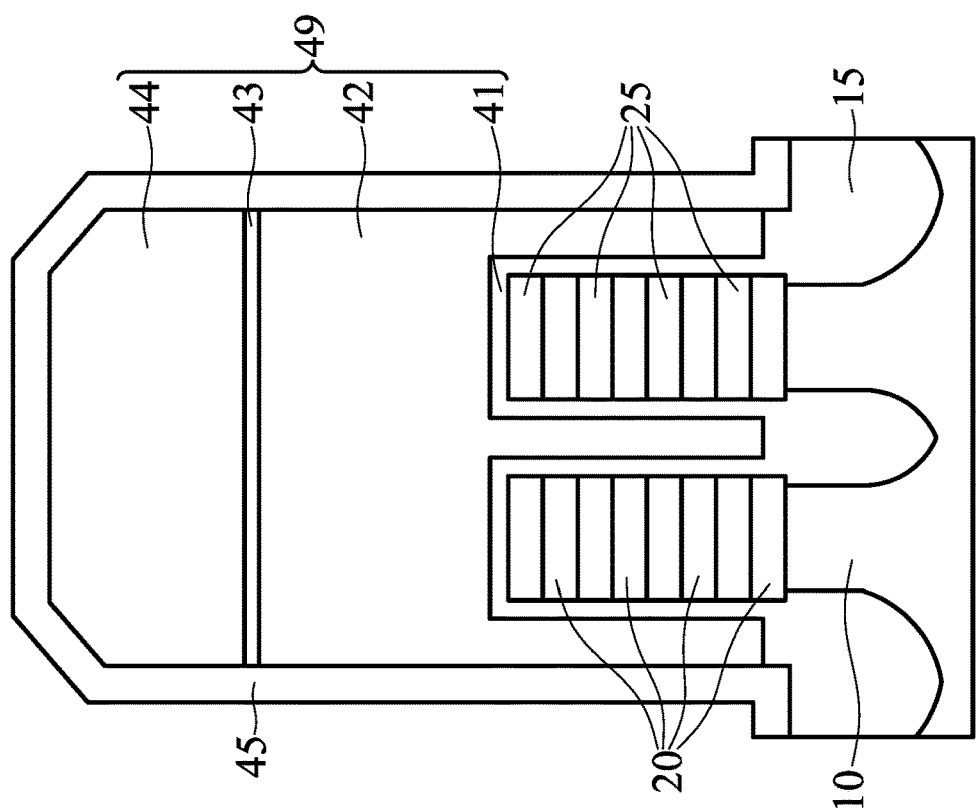
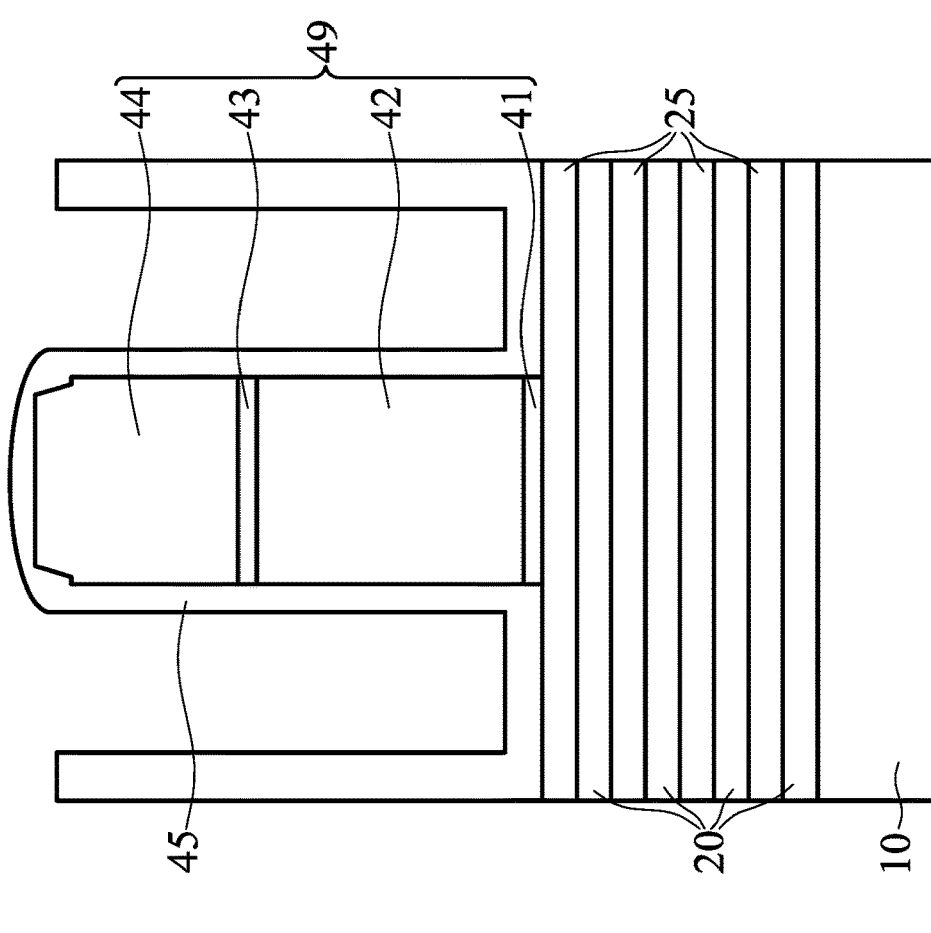
FIG. 6A
FIG. 6B

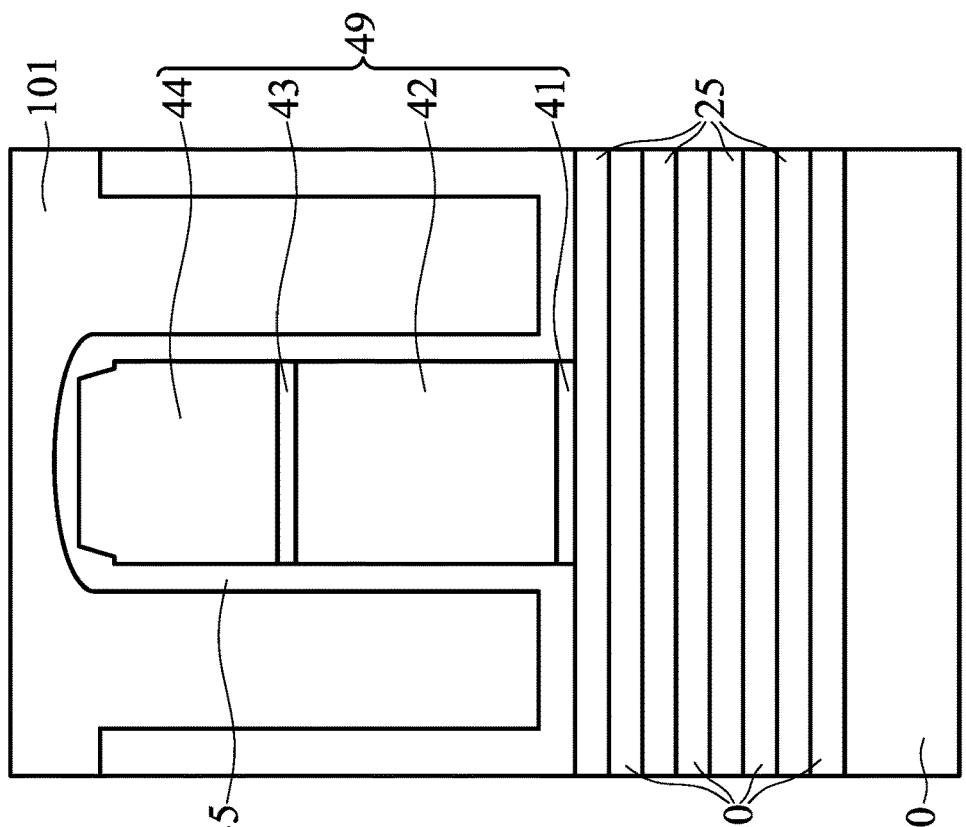
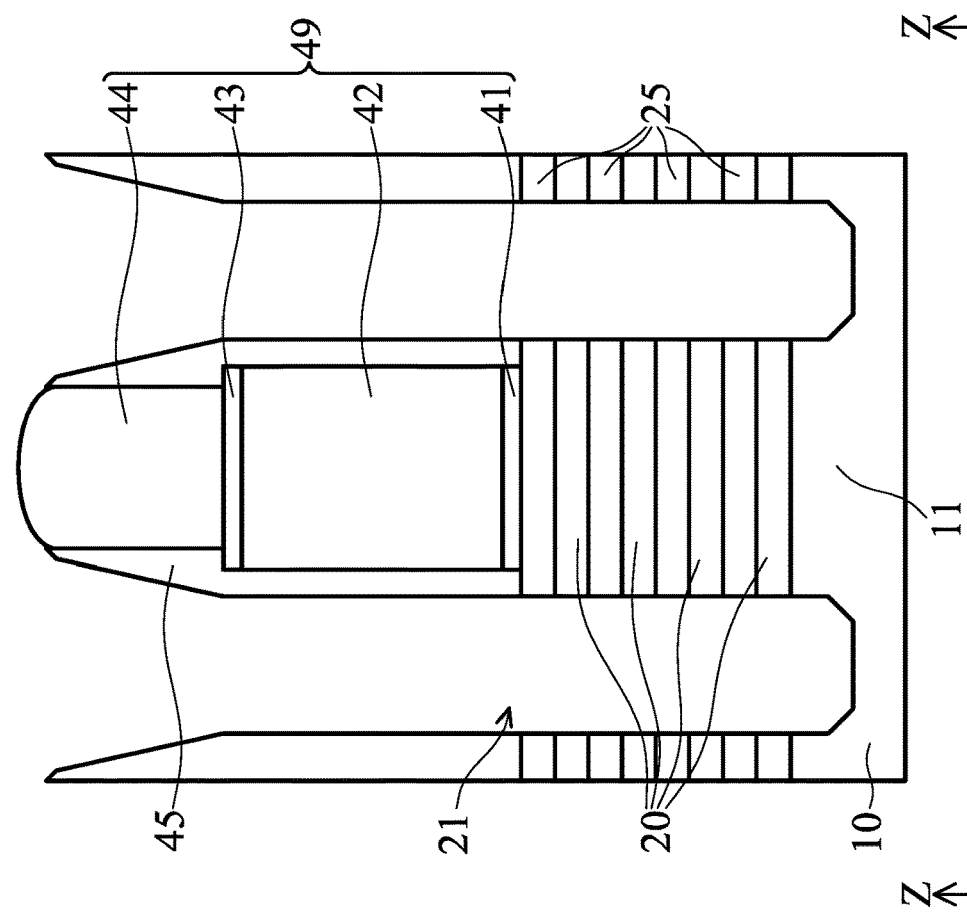
FIG. 7A
FIG. 7B

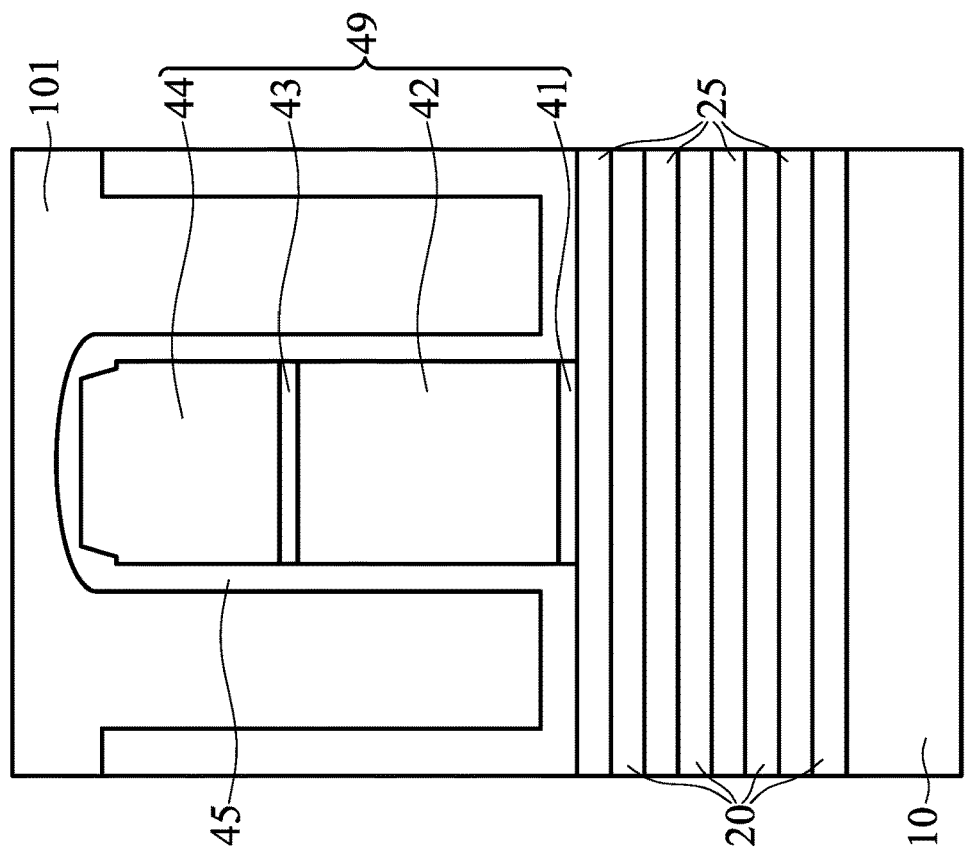
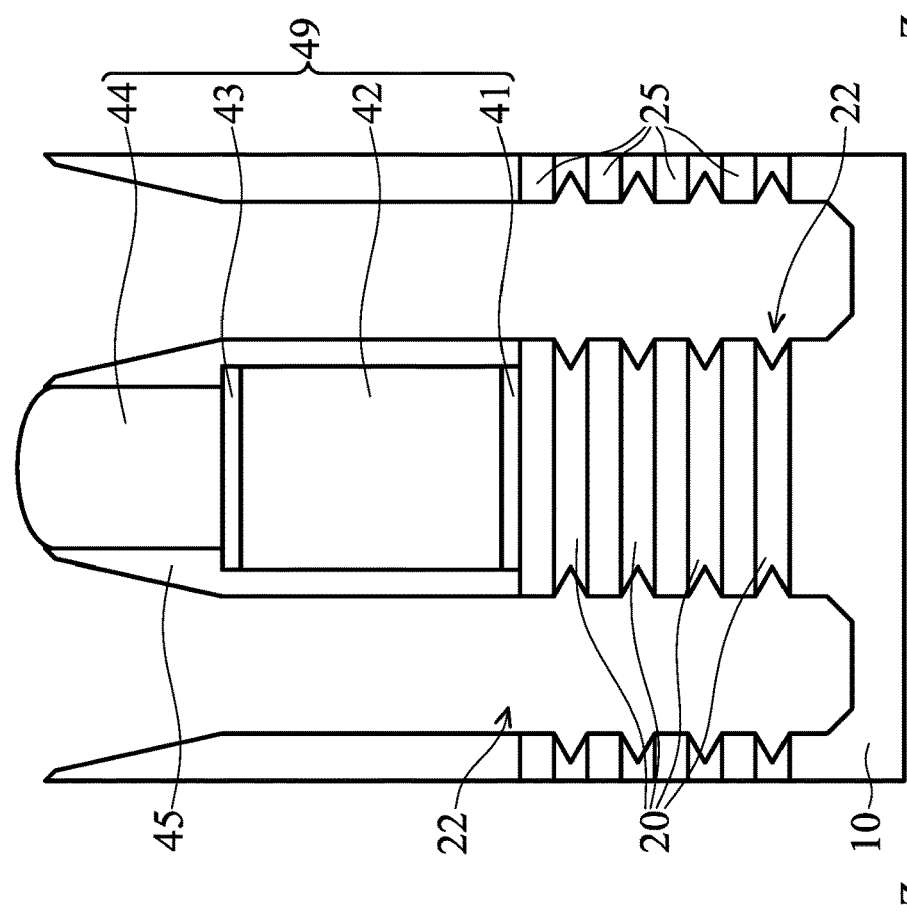

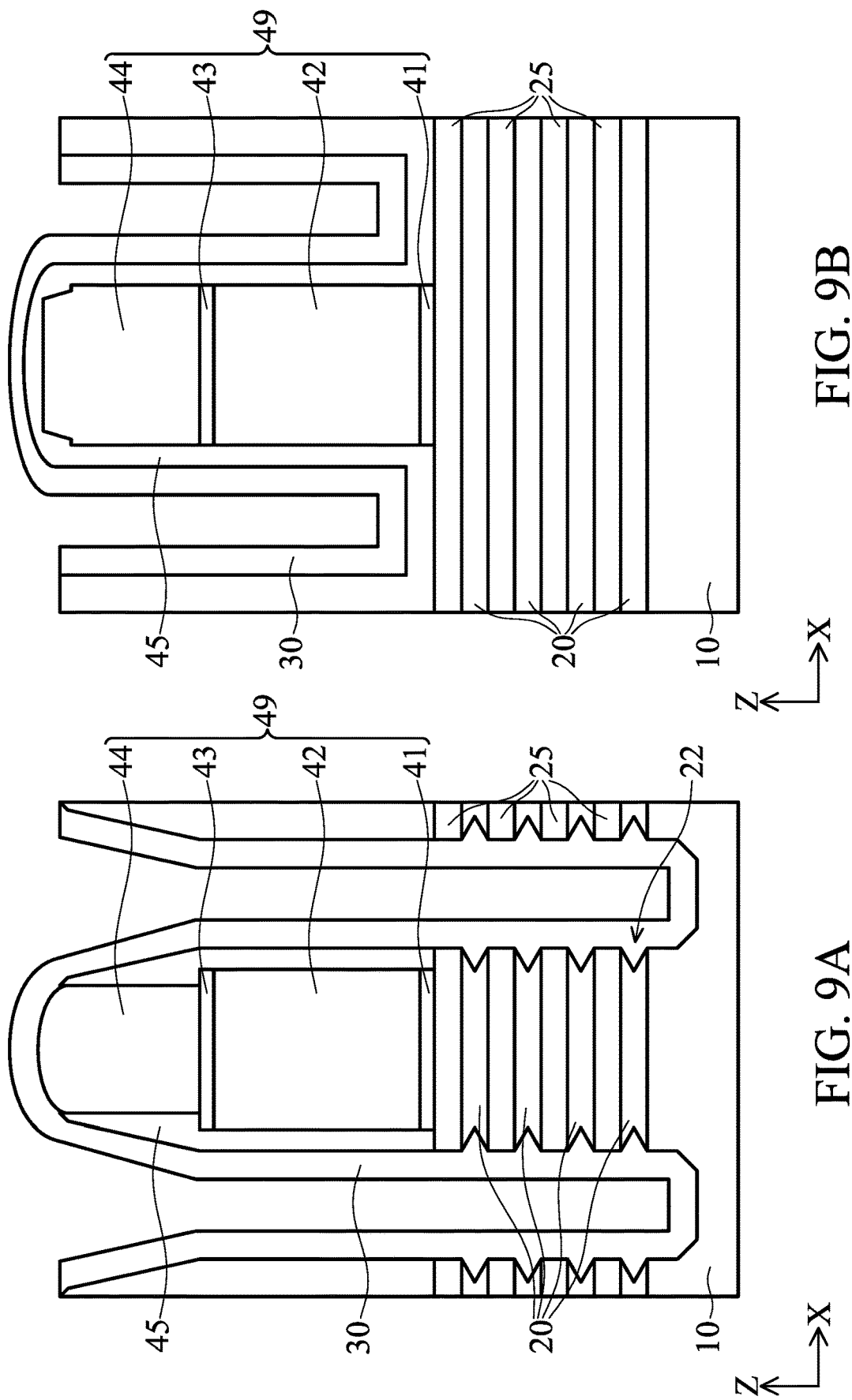

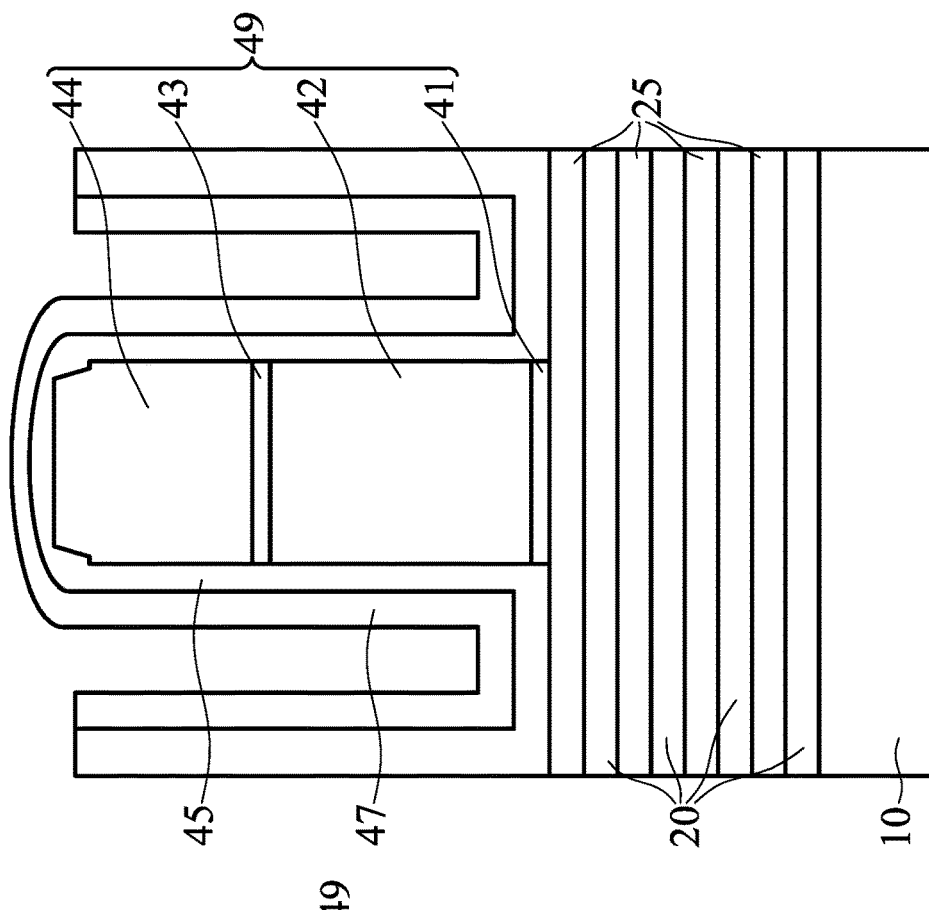
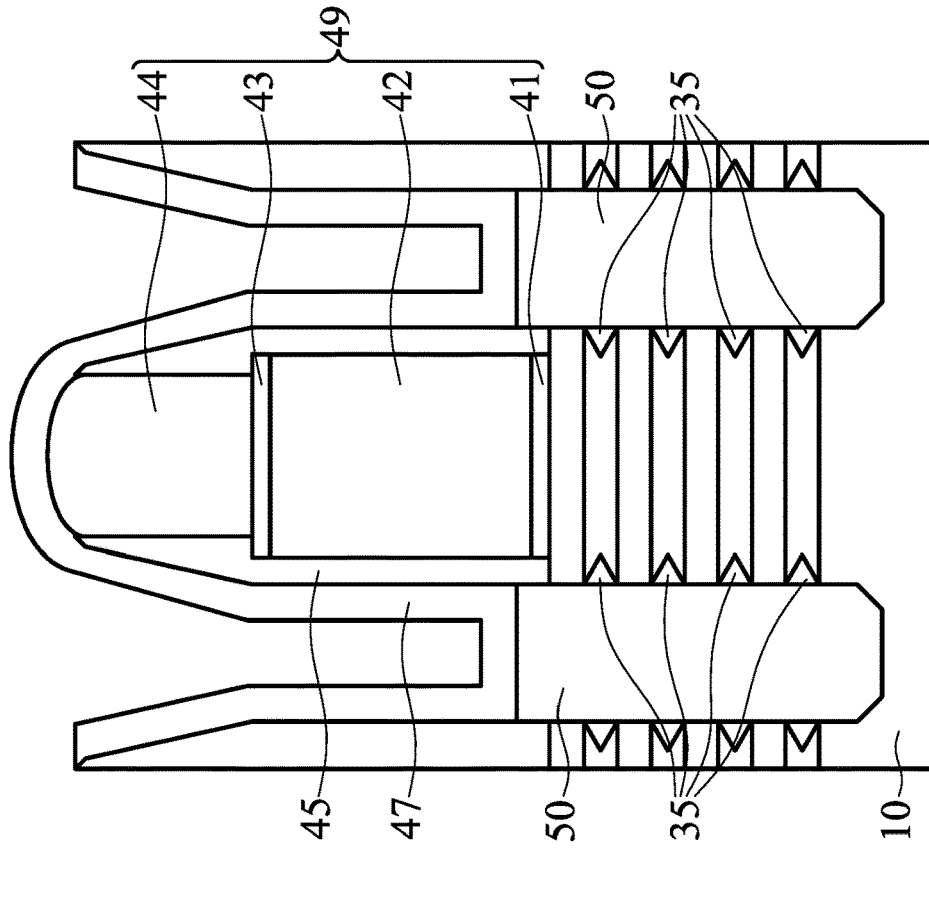
FIG. 12A
FIG. 12B

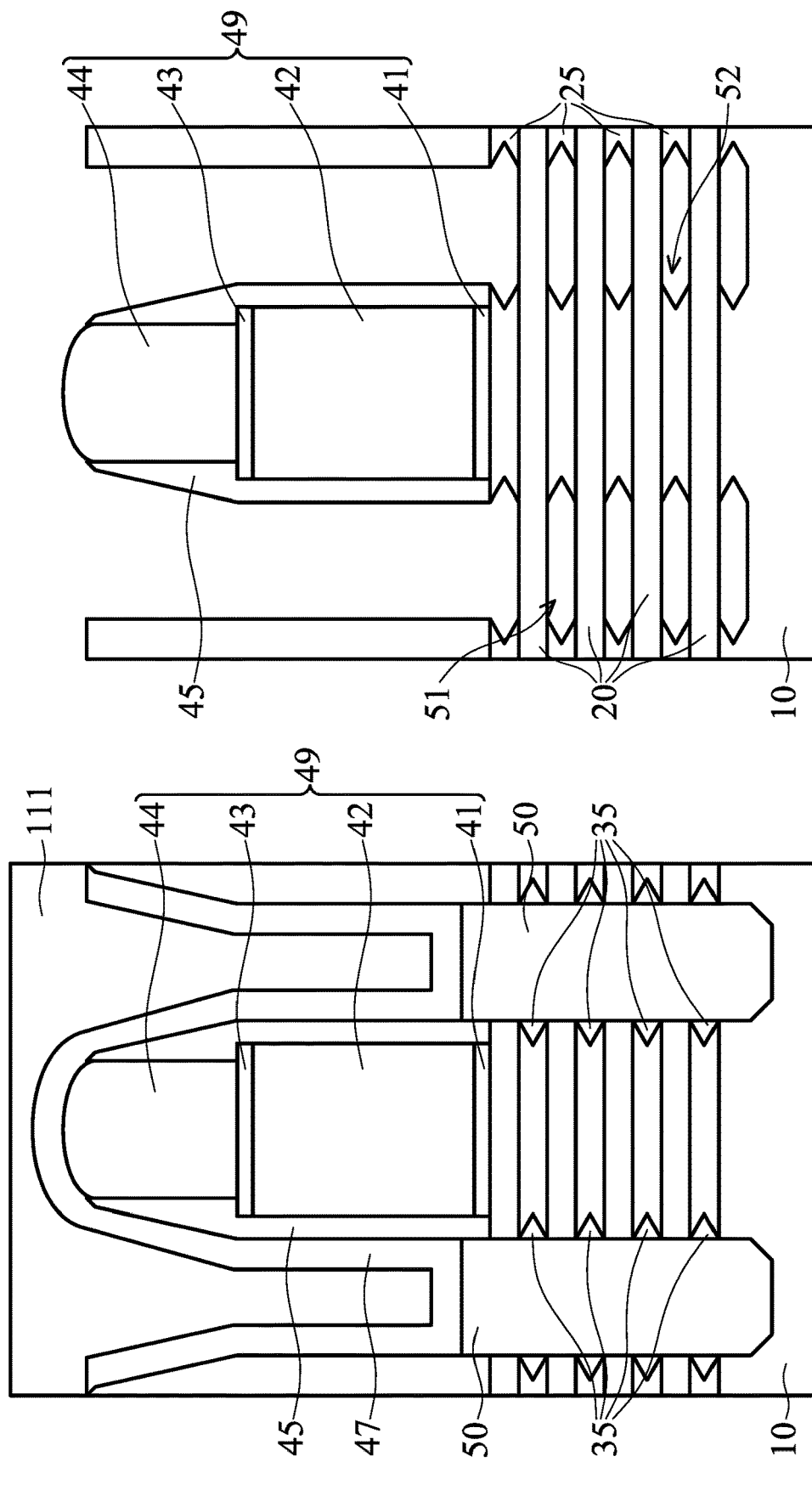

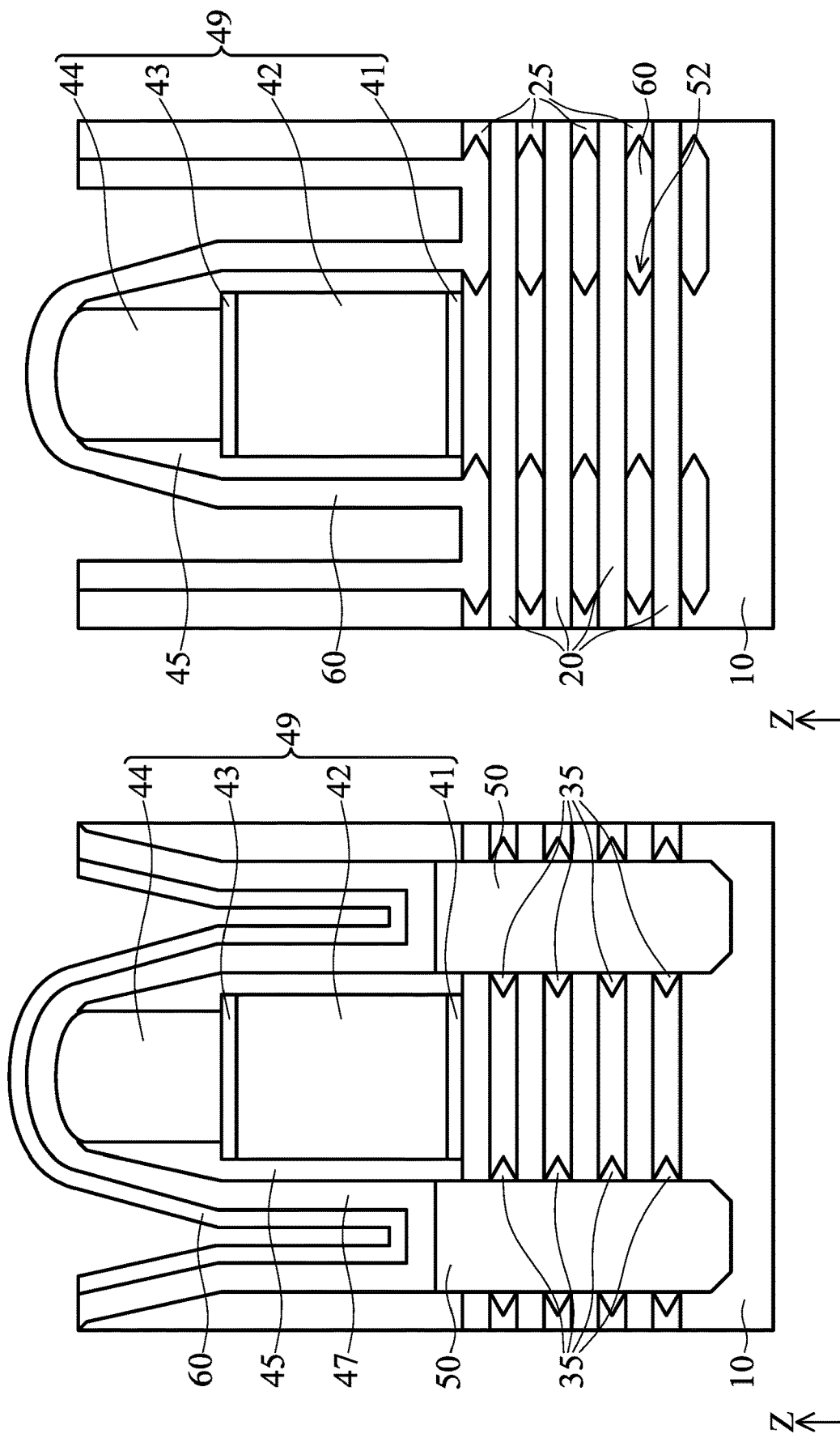

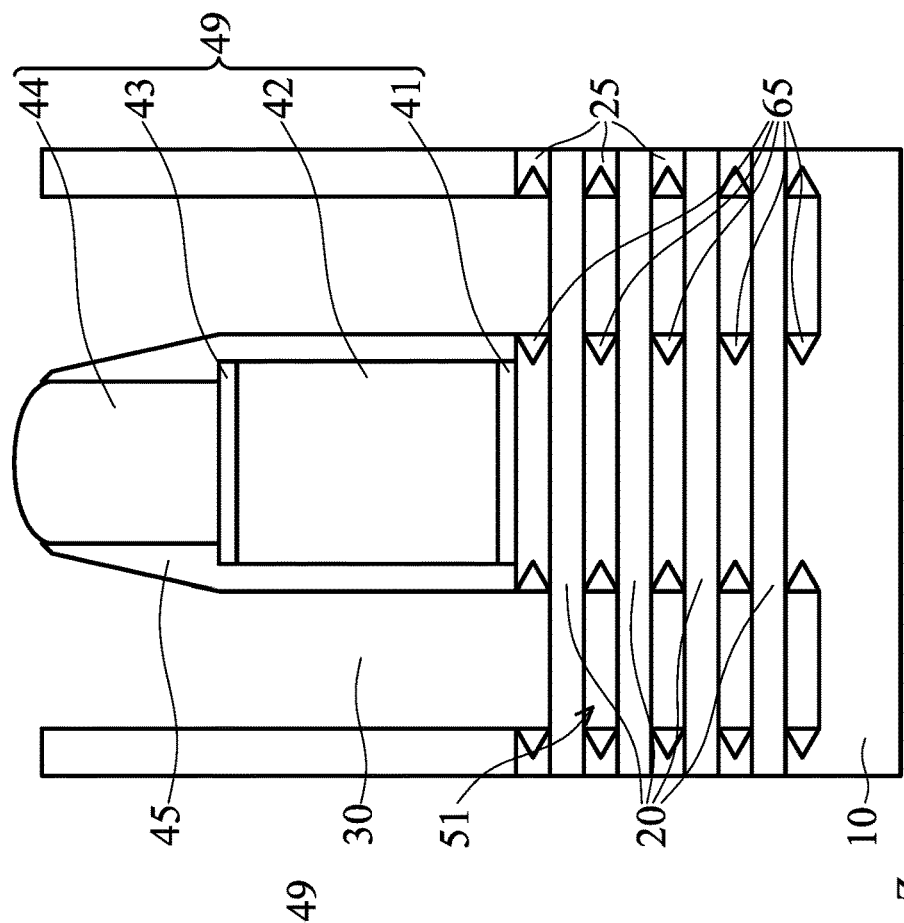
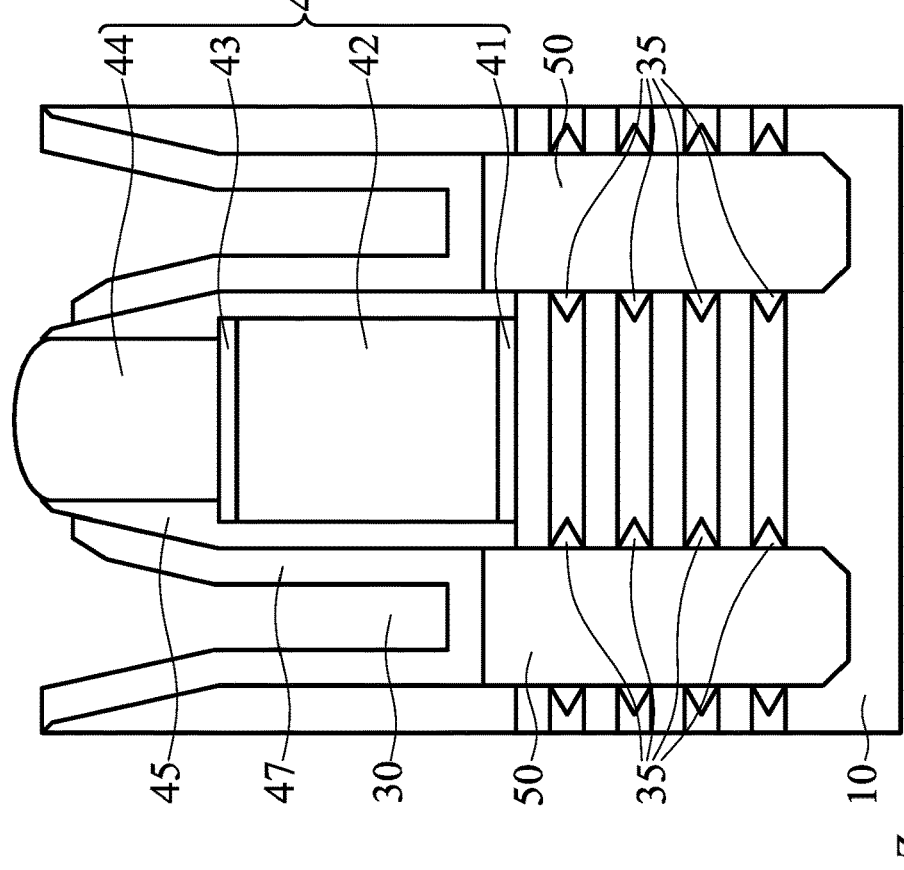
FIG. 17A
FIG. 17B

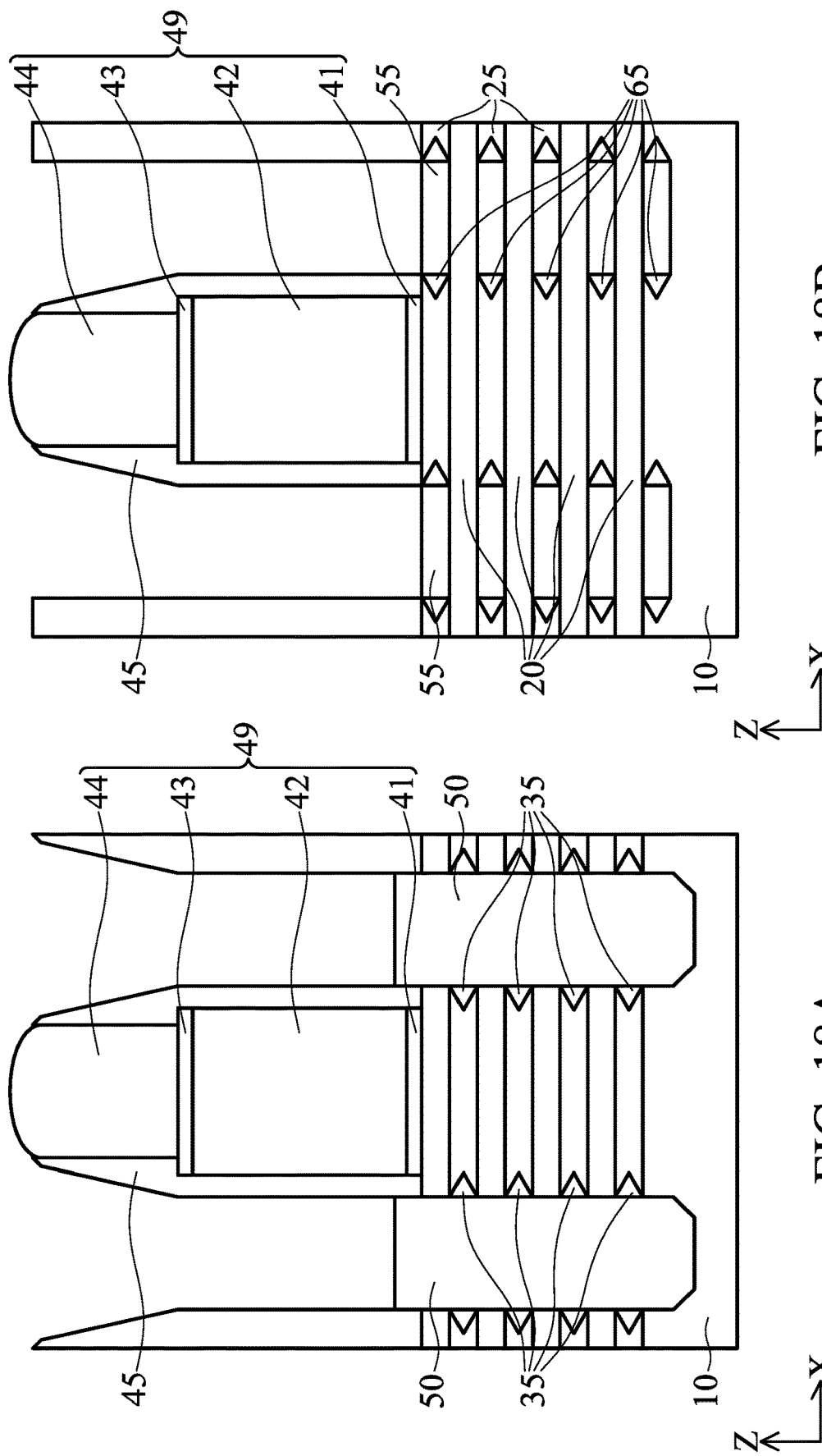

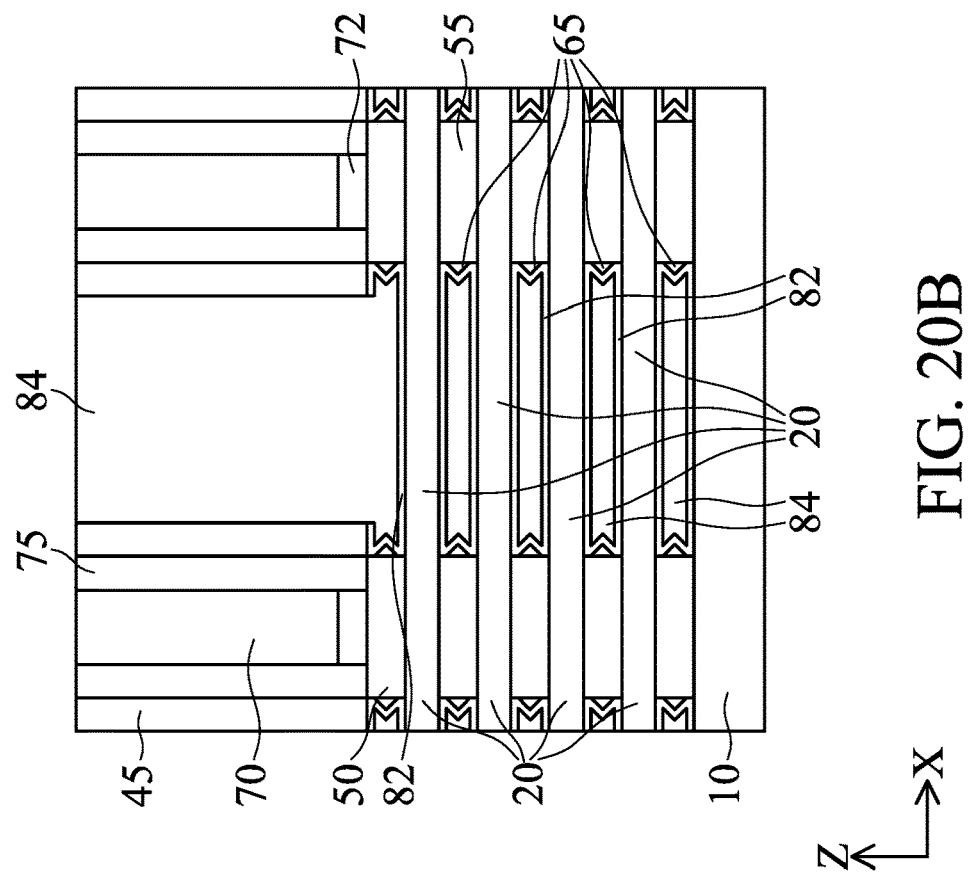
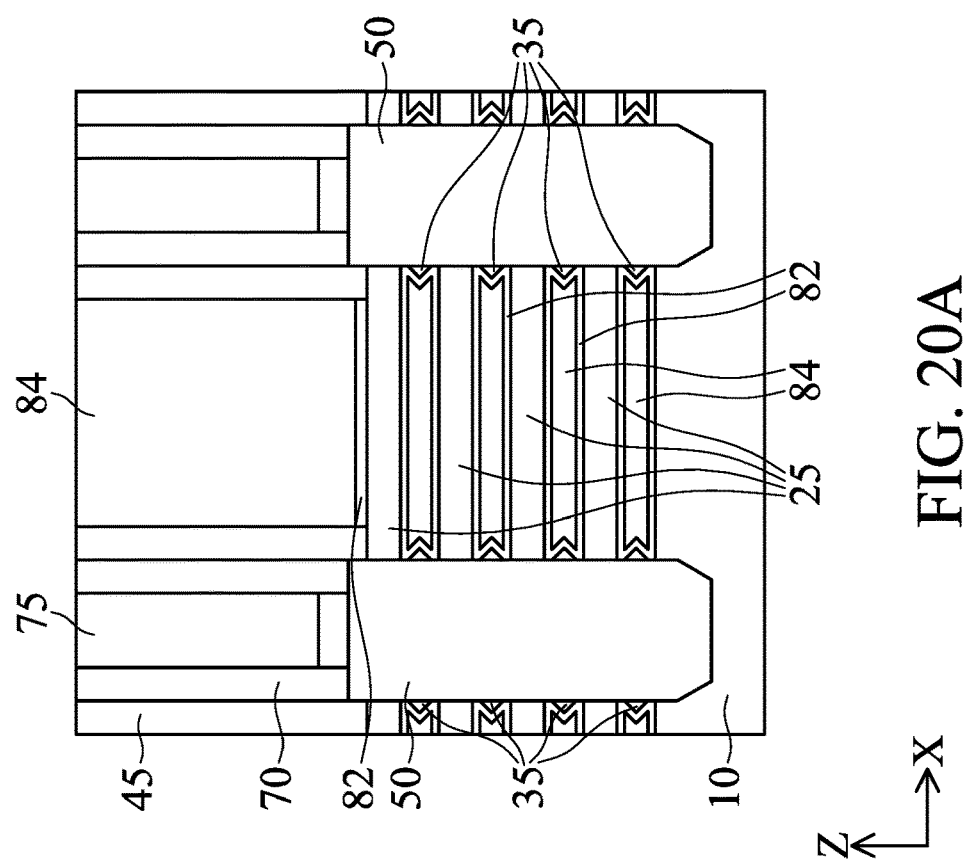
FIG. 20A
FIG. 20B

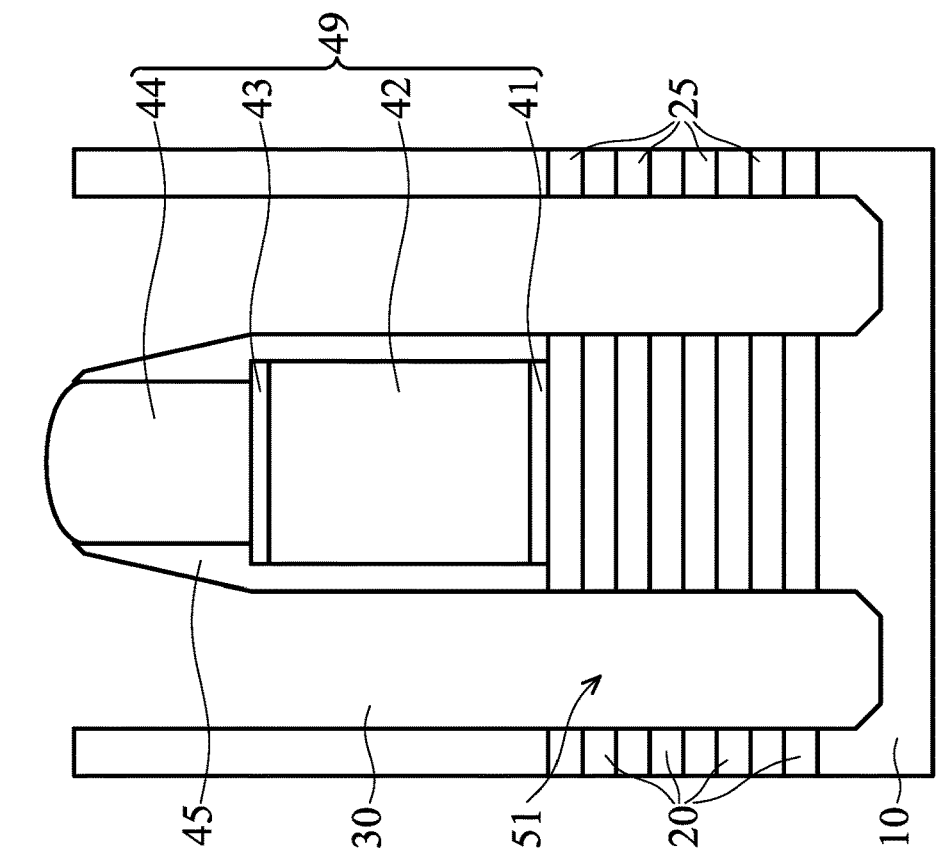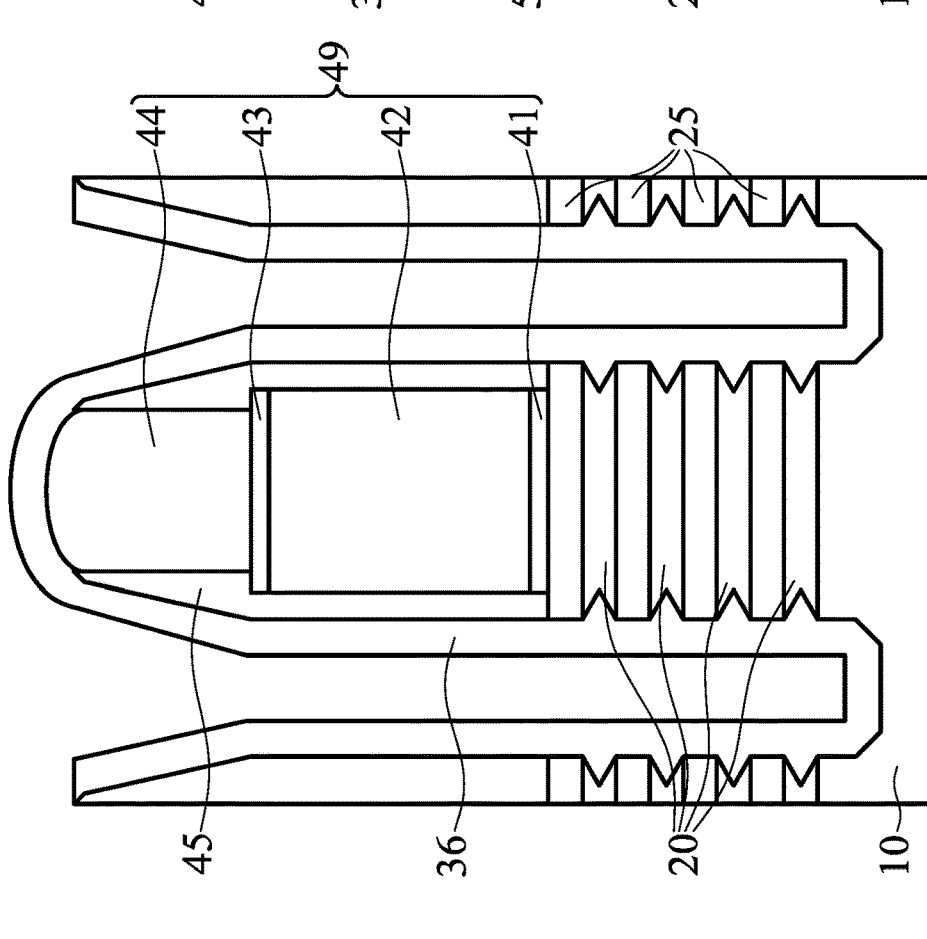
FIG. 22A
FIG. 22B

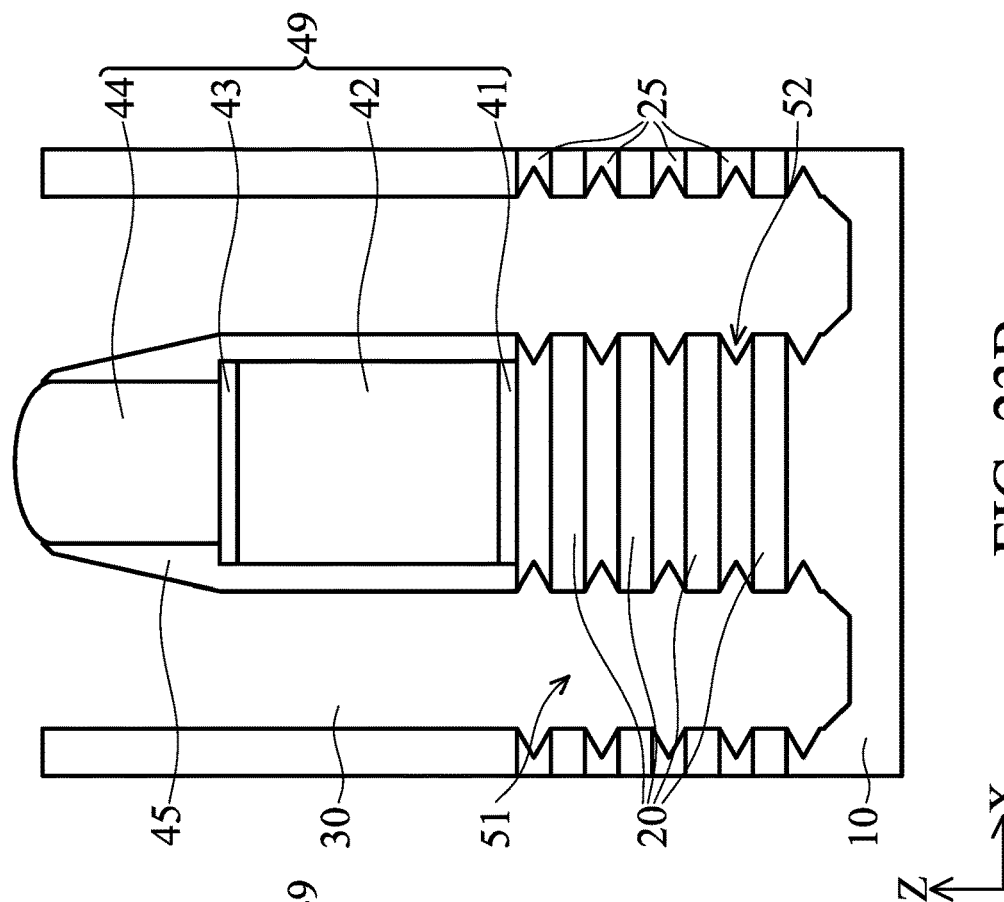
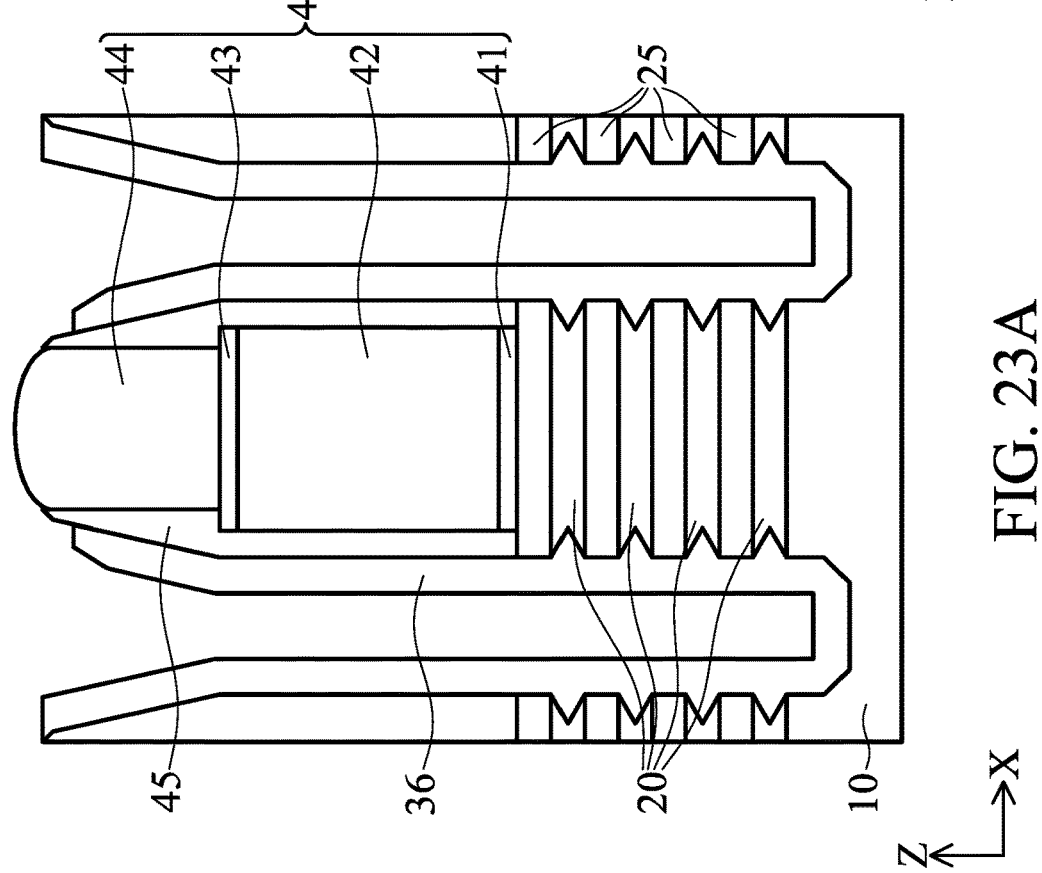

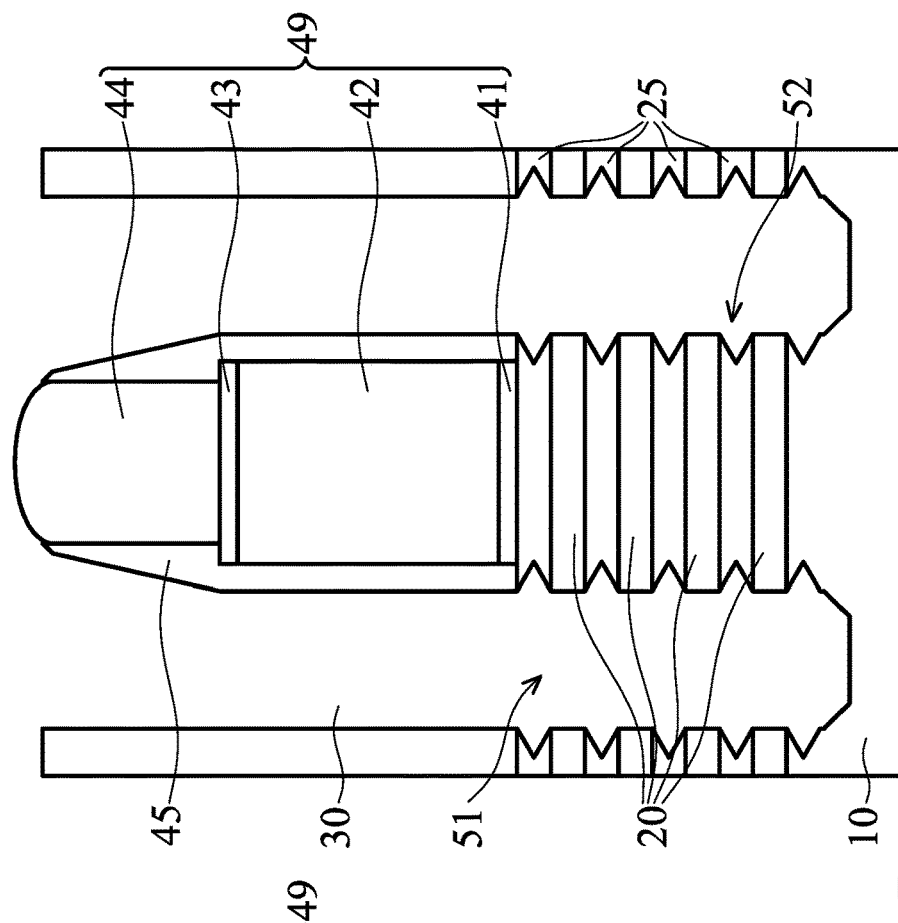
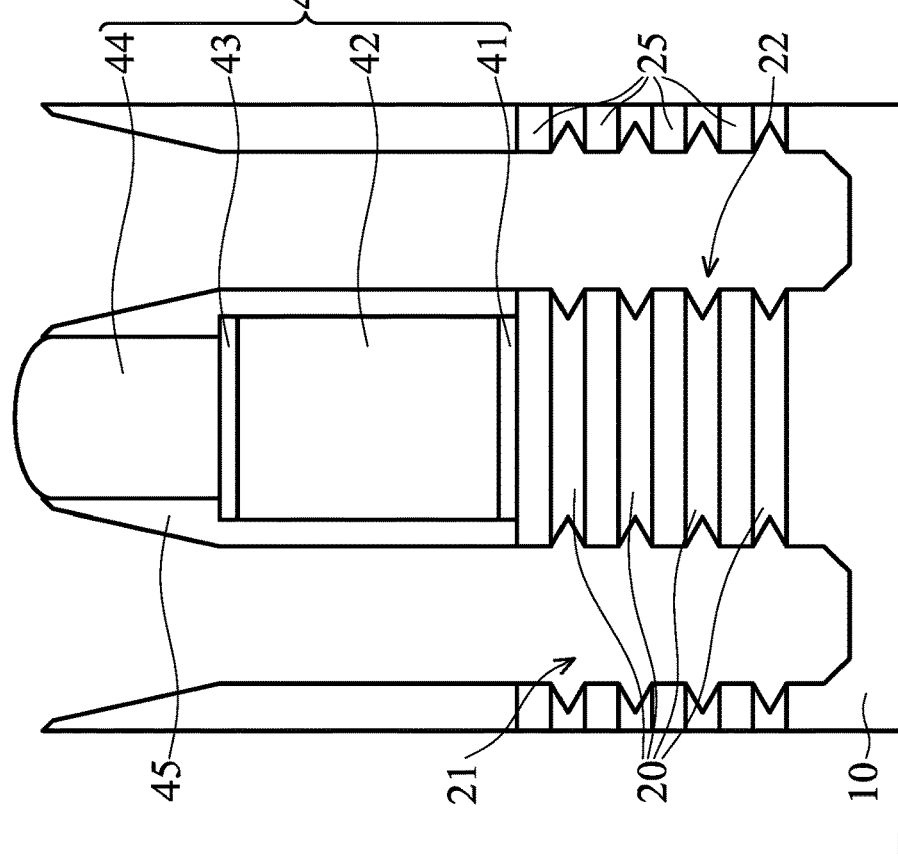
FIG. 24A
FIG. 24B

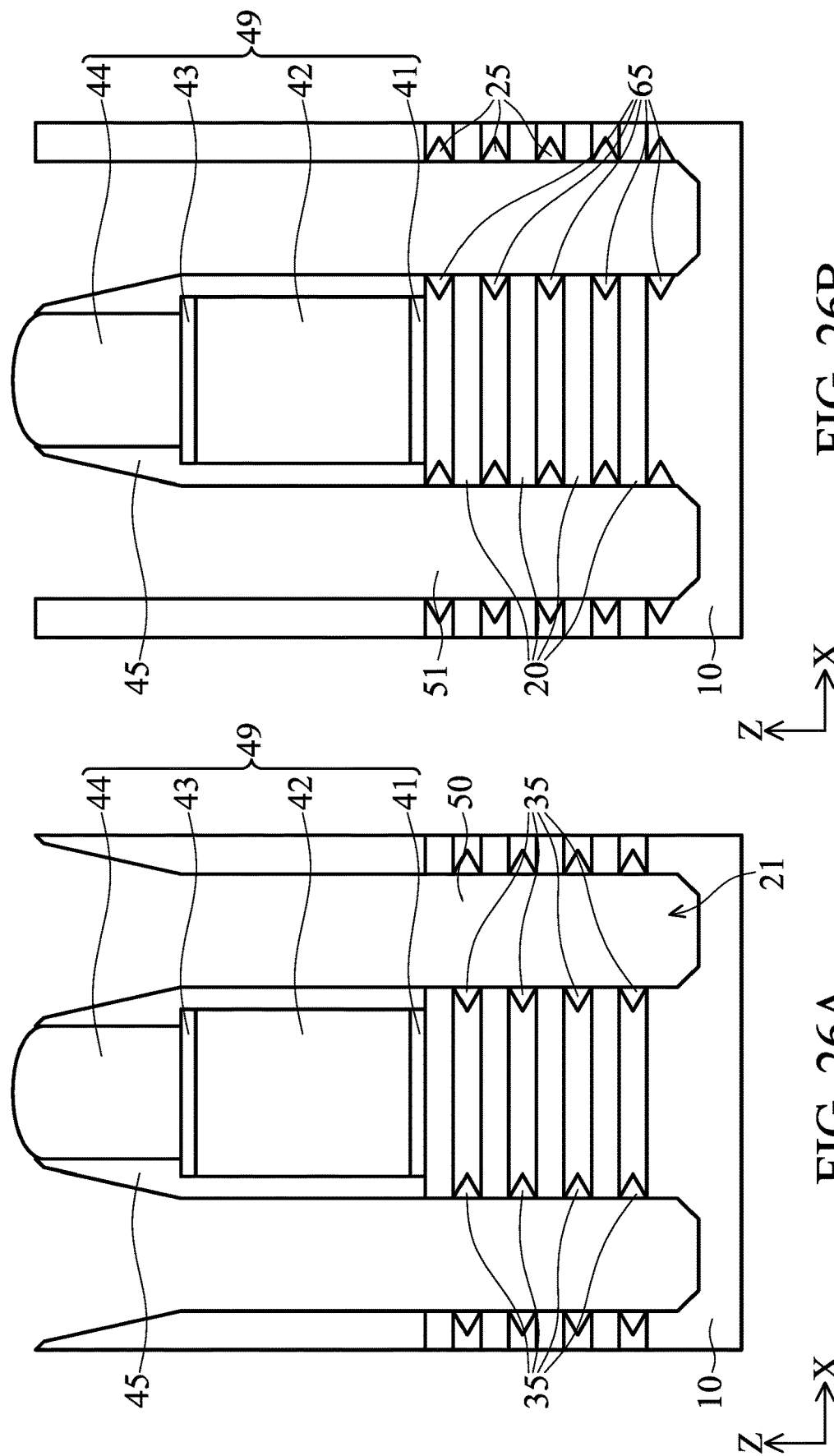

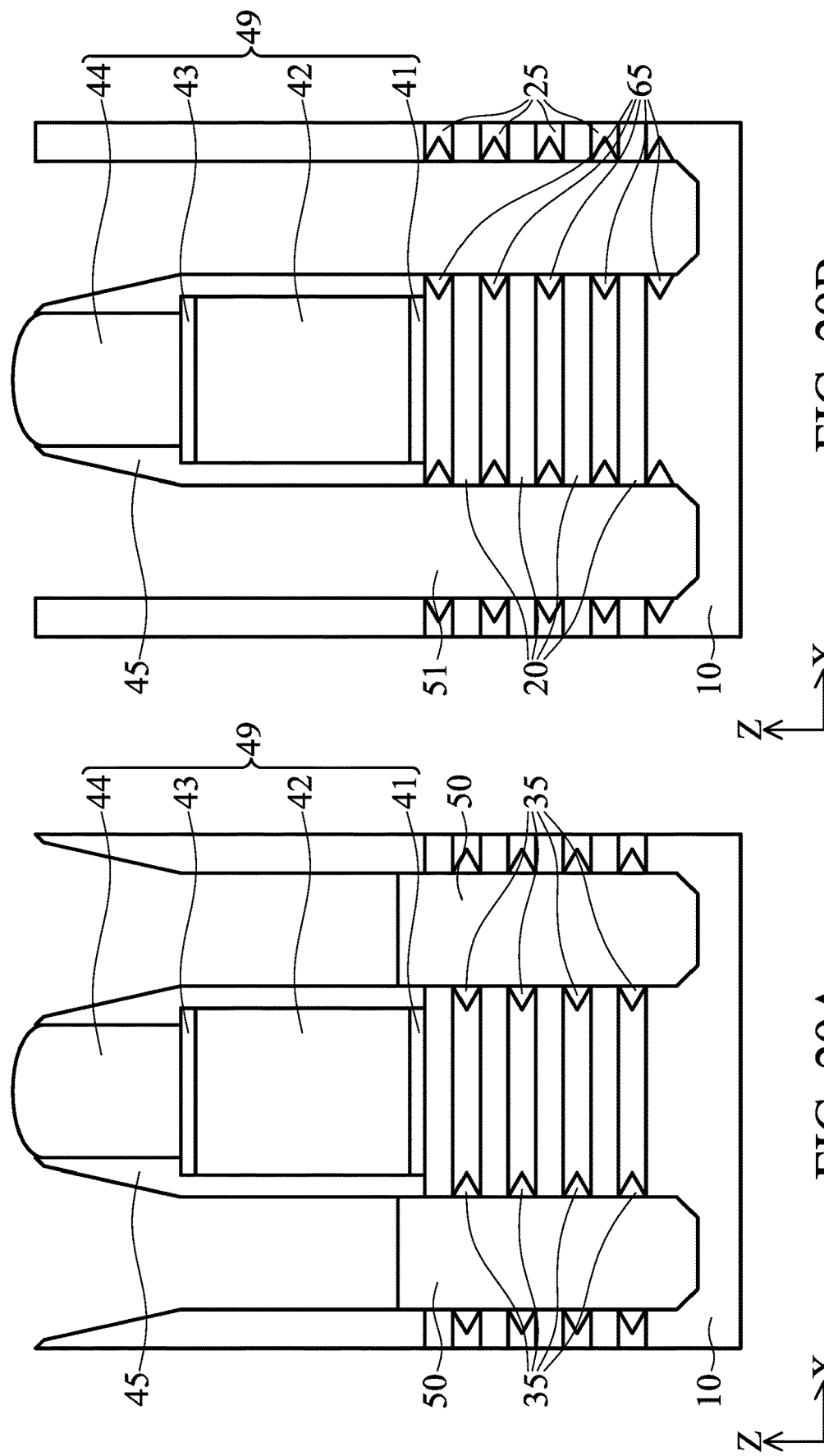

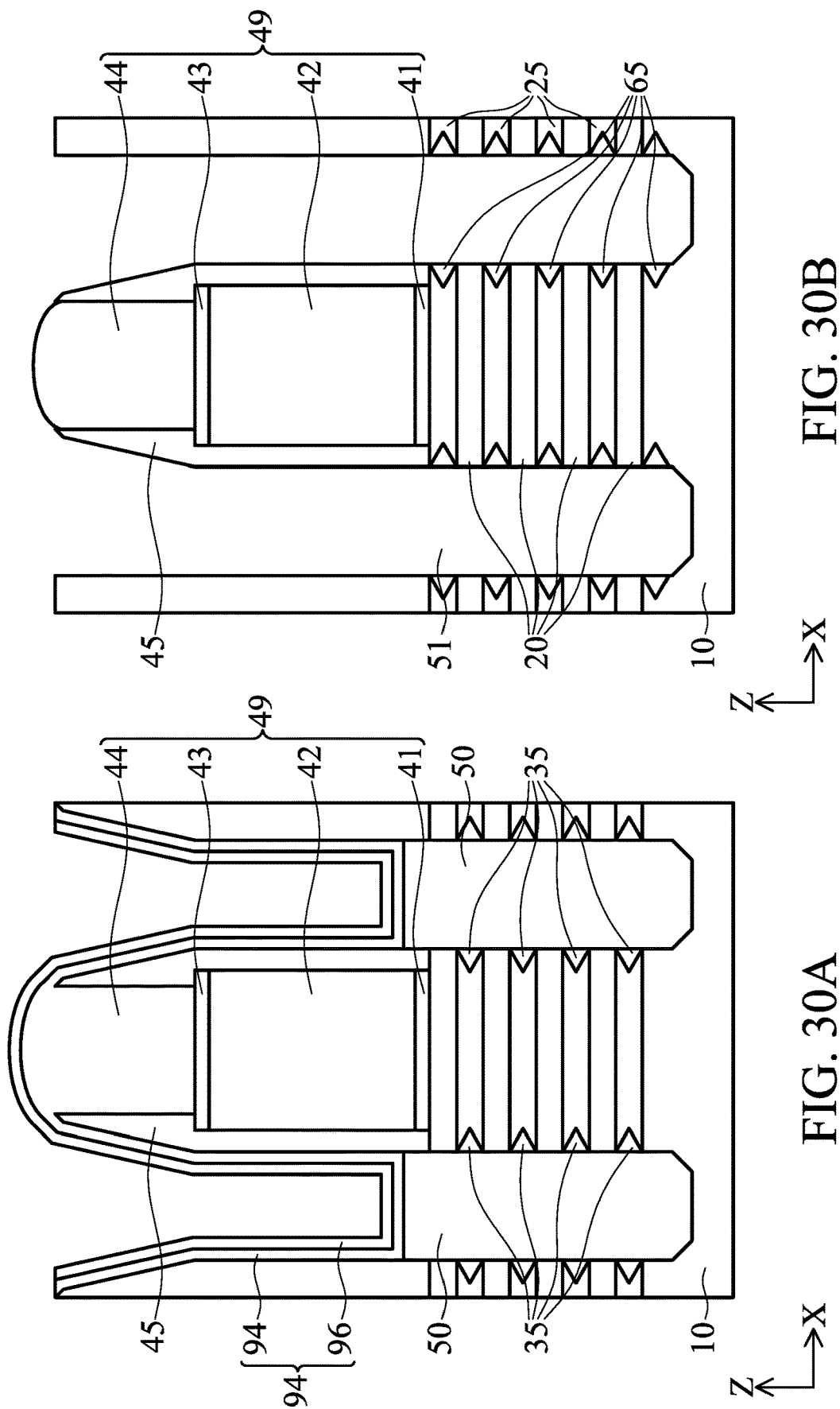

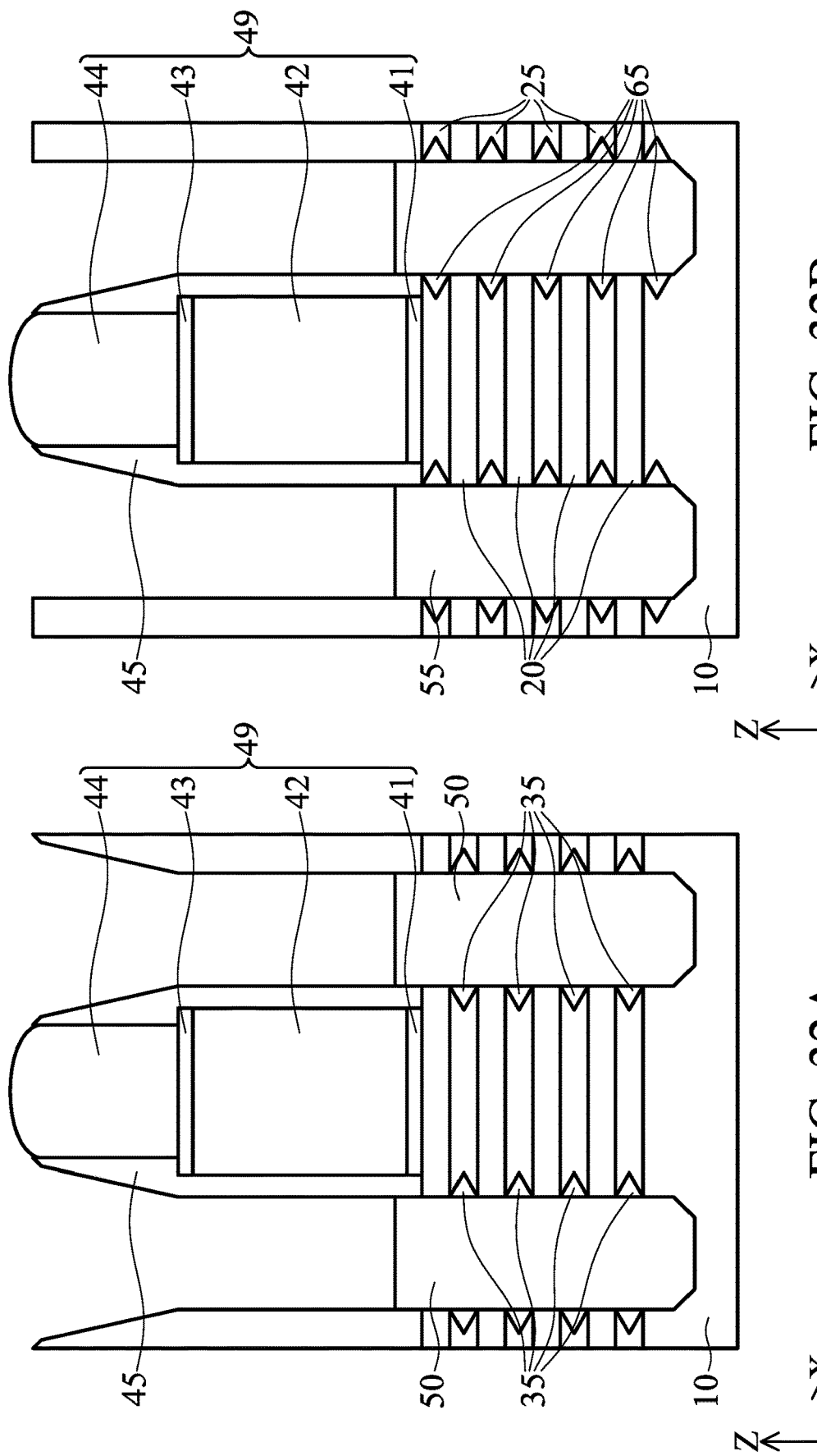

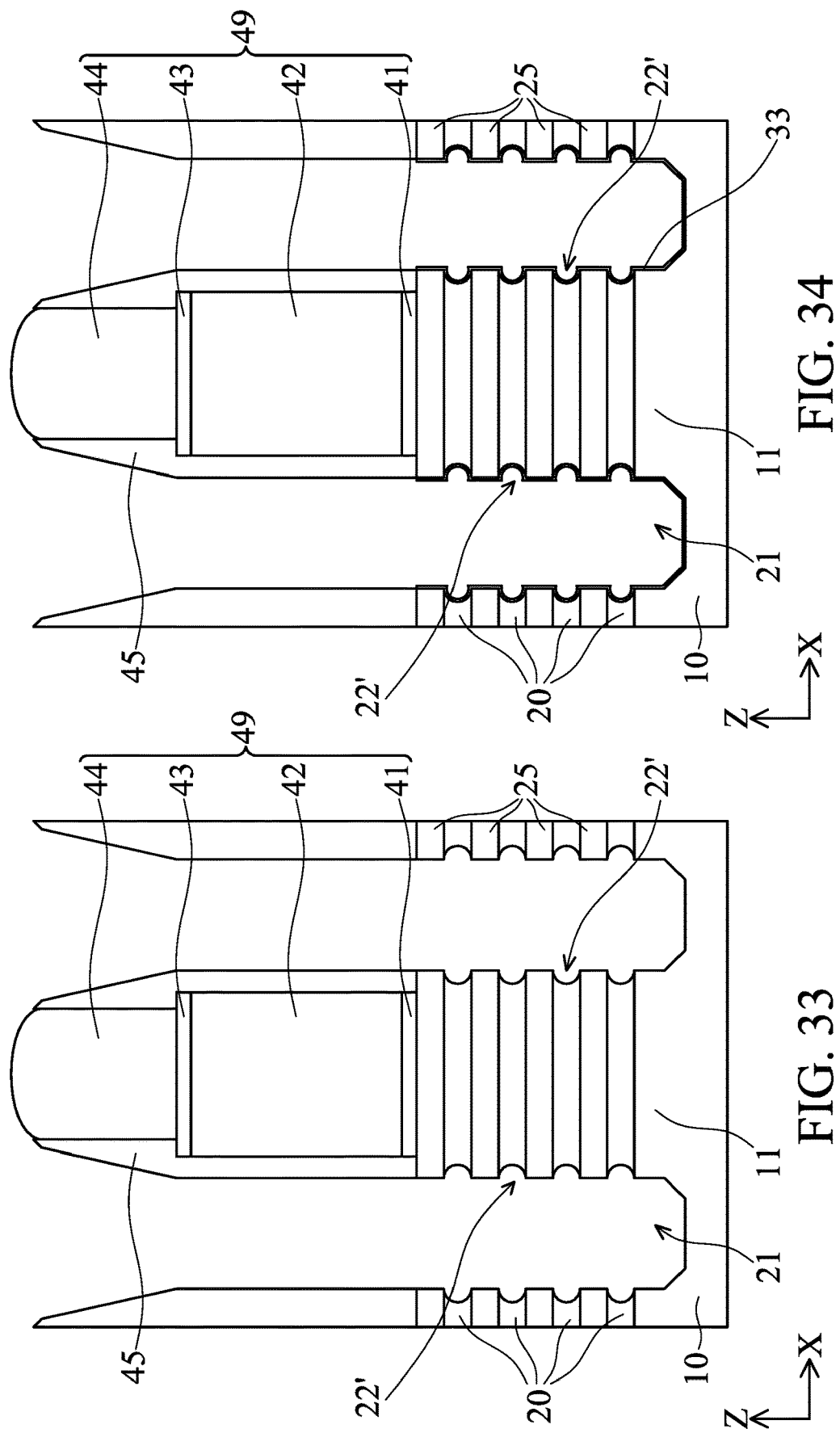

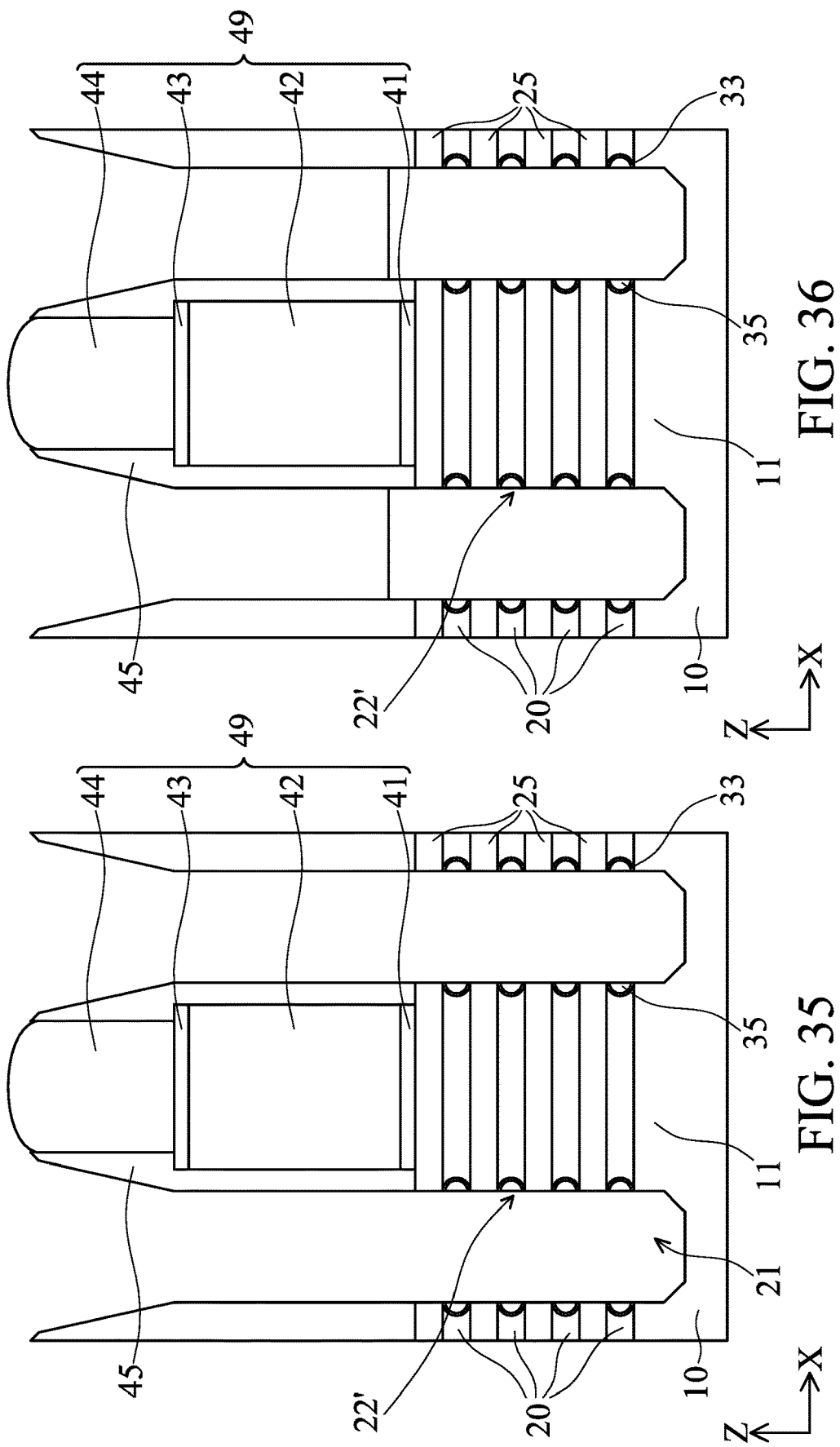

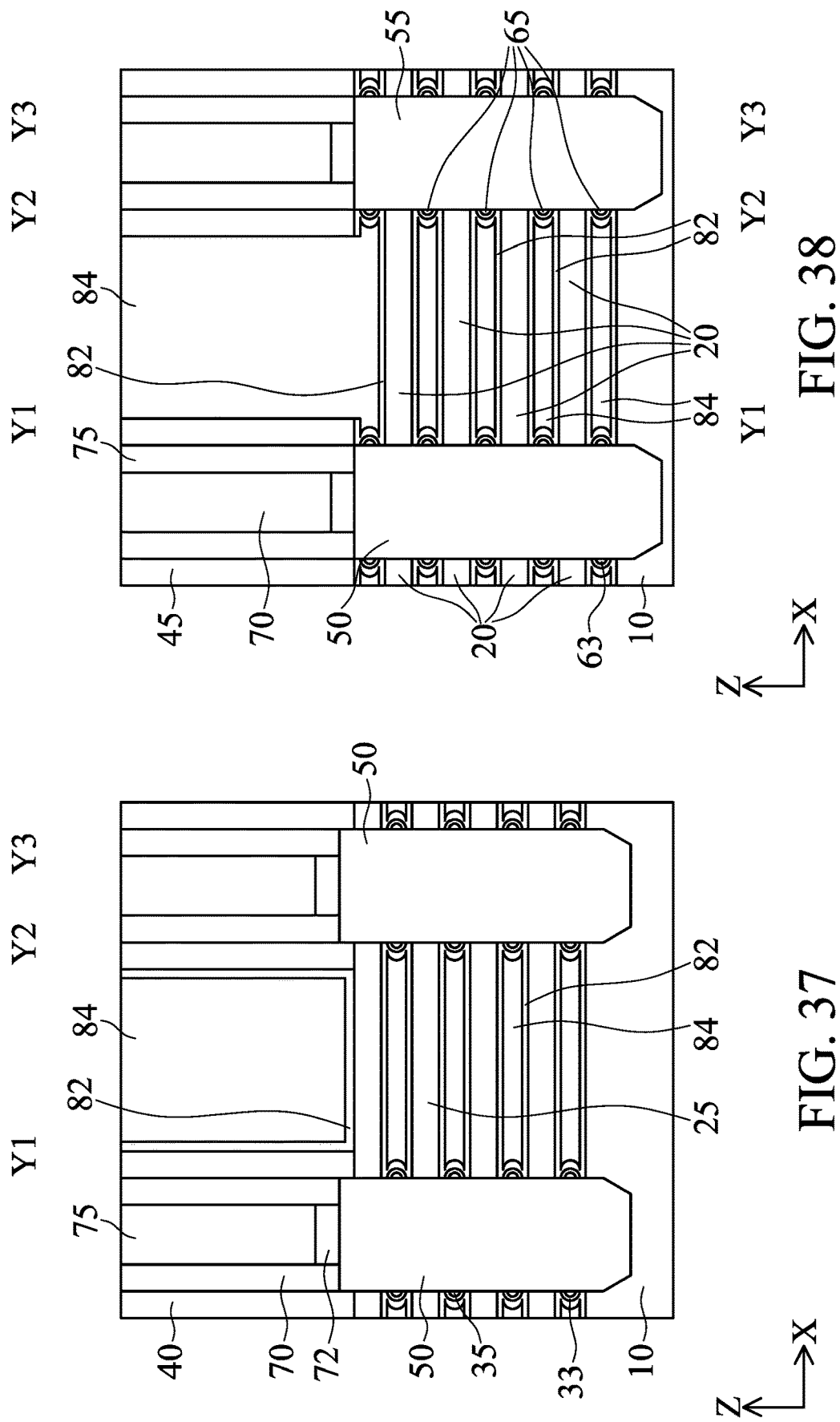

METHOD OF MANUFACTURING A SEMICONDUCTOR DEVICE AND A SEMICONDUCTOR DEVICE

RELATED APPLICATIONS

This application is a continuation of application Ser. No. 16/837,853 filed Apr. 1, 2020, now U.S. Pat. No. 10,828, 777, which is a continuation-in-part of application Ser. No. 15/798,270 filed Oct. 30, 2017, now U.S. Pat. No. 10,714, 592, the entire content of each of which is incorporated herein by reference.

TECHNICAL FIELD

The disclosure relates to method of manufacturing semiconductor integrated circuits, and more particularly to method of manufacturing semiconductor devices including fin field effect transistors (FinFETs) and/or gate-all-around (GAA) FETs, and semiconductor devices.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A-1D show various views of a semiconductor FET device according to an embodiment of the present disclosure. FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A.

FIGS. 2A-2D show various views of a semiconductor FET device according to an embodiment of the present disclosure. FIG. 2A is a cross sectional view along the X direction (source-drain direction), FIG. 2B is a cross sectional view corresponding to Y1-Y1 of FIG. 2A, FIG. 2C is a cross sectional view corresponding to Y2-Y2 of FIG. 2A and FIG. 2D shows a cross sectional view corresponding to Y3-Y3 of FIG. 2A.

FIGS. 3A-3D show various views of a semiconductor FET device according to an embodiment of the present disclosure. FIG. 3A is a cross sectional view along the X direction (source-drain direction), FIG. 3B is a cross sectional view corresponding to Y1-Y1 of FIG. 3A, FIG. 3C is a cross sectional view corresponding to Y2-Y2 of FIG. 3A and FIG. 3D shows a cross sectional view corresponding to Y3-Y3 of FIG. 3A.

FIGS. 4A-4D show various views of a semiconductor FET device according to an embodiment of the present disclosure. FIG. 4A is a cross sectional view along the X direction (source-drain direction), FIG. 4B is a cross sectional view corresponding to Y1-Y1 of FIG. 4A, FIG. 4C is a cross sectional view corresponding to Y2-Y2 of FIG. 1A and FIG. 4D shows a cross sectional view corresponding to Y3-Y3 of FIG. 4A.

FIGS. 6A and 6B show one of the various stages of manufacturing a semiconductor GAA FET device according to an embodiment of the present disclosure.

FIGS. 7A and 7B show one of the various stages of manufacturing a semiconductor GAA FET device according to an embodiment of the present disclosure. FIG. 7A shows a cross sectional view for an n-type GAA FET, and FIG. 7B shows a cross sectional view for a p-type GAA FET.

FIGS. 8A, 8B and 8C show one of the various stages of manufacturing a semiconductor GAA FET device according to an embodiment of the present disclosure. FIG. 8A shows a cross sectional view for an n-type GAA FET, and FIG. 8B shows a cross sectional view for a p-type GAA FET. FIG. 8C is a perspective view for an n-type GAA FET.

FIGS. 9A and 9B show one of the various stages of manufacturing a semiconductor GAA FET device according to an embodiment of the present disclosure. FIG. 9A shows a cross sectional view for an n-type GAA FET, and FIG. 9B shows a cross sectional view for a p-type GAA FET.

FIG. 10A shows a cross sectional view for an n-type GAA FET, and FIG. 10B shows a cross sectional view for a p-type GAA FET.

FIG. 11A shows a cross sectional view for an n-type GAA FET, and FIG. 11B shows a cross sectional view for a p-type GAA FET.

FIGS. 12A and 12B show one of the various stages of manufacturing a semiconductor GAA FET device according to an embodiment of the present disclosure. FIG. 12A shows a cross sectional view for an n-type GAA FET, and FIG. 12B shows a cross sectional view for a p-type GAA FET.

FIG. 13A shows a cross sectional view for an n-type GAA FET, and FIG. 13B shows a cross sectional view for a p-type GAA FET.

FIG. 14A shows a cross sectional view for an n-type GAA FET, and FIG. 14B shows a cross sectional view for a p-type GAA FET.

FIGS. 15A and 15B show one of the various stages of manufacturing a semiconductor GAA FET device according to an embodiment of the present disclosure. FIG. 15A shows a cross sectional view for an n-type GAA FET, and FIG. 15B shows a cross sectional view for a p-type GAA FET.

FIGS. 16A and 16B show one of the various stages of manufacturing a semiconductor GAA FET device according to an embodiment of the present disclosure. FIG. 16A shows a cross sectional view for an n-type GAA FET, and FIG. 16B shows a cross sectional view for a p-type GAA FET.

FIGS. 17A and 17B show one of the various stages of manufacturing a semiconductor GAA FET device according to an embodiment of the present disclosure. FIG. 17A shows a cross sectional view for an n-type GAA FET, and FIG. 17B shows a cross sectional view for a p-type GAA FET.

FIGS. 18A and 18B show one of the various stages of manufacturing a semiconductor GAA FET device according to an embodiment of the present disclosure. FIG. 18A shows a cross sectional view for an n-type GAA FET, and FIG. 18B shows a cross sectional view for a p-type GAA FET.

FIG. 19A shows a cross sectional view for an n-type GAA FET, and FIG. 19B shows a cross sectional view for a p-type GAA FET.

FIGS. 20A and 20B show one of the various stages of manufacturing a semiconductor GAA FET device according to an embodiment of the present disclosure. FIG. 20A shows a cross sectional view for an n-type GAA FET, and FIG. 20B shows a cross sectional view for a p-type GAA FET.

FIG. 21A shows a cross sectional view for an n-type GAA FET, and FIG. 21B shows a cross sectional view for a p-type GAA FET.

FIGS. 22A and 22B show one of the various stages of manufacturing a semiconductor GAA FET device according to another embodiment of the present disclosure. FIG. 22A shows a cross sectional view for an n-type GAA FET, and FIG. 22B shows a cross sectional view for a p-type GAA FET.

FIGS. 23A and 23B show one of the various stages of manufacturing a semiconductor GAA FET device according to another embodiment of the present disclosure. FIG. 23A shows a cross sectional view for an n-type GAA FET, and FIG. 23B shows a cross sectional view for a p-type GAA FET.

FIGS. 24A and 24B show one of the various stages of manufacturing a semiconductor GAA FET device according to another embodiment of the present disclosure. FIG. 24A shows a cross sectional view for an n-type GAA FET, and FIG. 24B shows a cross sectional view for a p-type GAA FET.

FIG. 25A shows a cross sectional view for an n-type GAA FET, and FIG. 25B shows a cross sectional view for a p-type GAA FET.

FIGS. 26A and 26B show one of the various stages of manufacturing a semiconductor GAA FET device according to another embodiment of the present disclosure. FIG. 26A shows a cross sectional view for an n-type GAA FET, and FIG. 26B shows a cross sectional view for a p-type GAA FET.

FIG. 27A shows a cross sectional view for an n-type GAA FET, and FIG. 27B shows a cross sectional view for a p-type GAA FET.

FIG. 28A shows a cross sectional view for an n-type GAA FET, and FIG. 28B shows a cross sectional view for a p-type GAA FET.

FIGS. 29A and 29B show one of the various stages of manufacturing a semiconductor GAA FET device according to another embodiment of the present disclosure. FIG. 29A shows a cross sectional view for an n-type GAA FET, and FIG. 29B shows a cross sectional view for a p-type GAA FET.

FIGS. 30A and 30B show one of the various stages of manufacturing a semiconductor GAA FET device according to another embodiment of the present disclosure. FIG. 30A shows a cross sectional view for an n-type GAA FET, and FIG. 30B shows a cross sectional view for a p-type GAA FET.

FIG. 31A shows a cross sectional view for an n-type GAA FET, and FIG. 31B shows a cross sectional view for a p-type GAA FET.

FIGS. 32A and 32B show one of the various stages of manufacturing a semiconductor GAA FET device according to another embodiment of the present disclosure. FIG. 32A shows a cross sectional view for an n-type GAA FET, and FIG. 32B shows a cross sectional view for a p-type GAA FET.

FIG. 33 shows one of the various stages of manufacturing a semiconductor n-type GAA FET device according to another embodiment of the present disclosure.

FIG. 34 shows one of the various stages of manufacturing a semiconductor n-type GAA FET device according to another embodiment of the present disclosure.

FIG. 35 shows one of the various stages of manufacturing a semiconductor n-type GAA FET device according to another embodiment of the present disclosure.

FIG. 36 shows one of the various stages of manufacturing a semiconductor n-type GAA FET device according to another embodiment of the present disclosure.

FIG. 37 shows a cross sectional view along the X direction (source-drain direction) of a semiconductor n-type GAA FET device according to another embodiment of the present disclosure.

FIG. 38 shows a cross sectional view along the X direction (source-drain direction) of a semiconductor n-type GAA FET device according to another embodiment of the present disclosure.

DETAILED DESCRIPTION

Figure 5B:
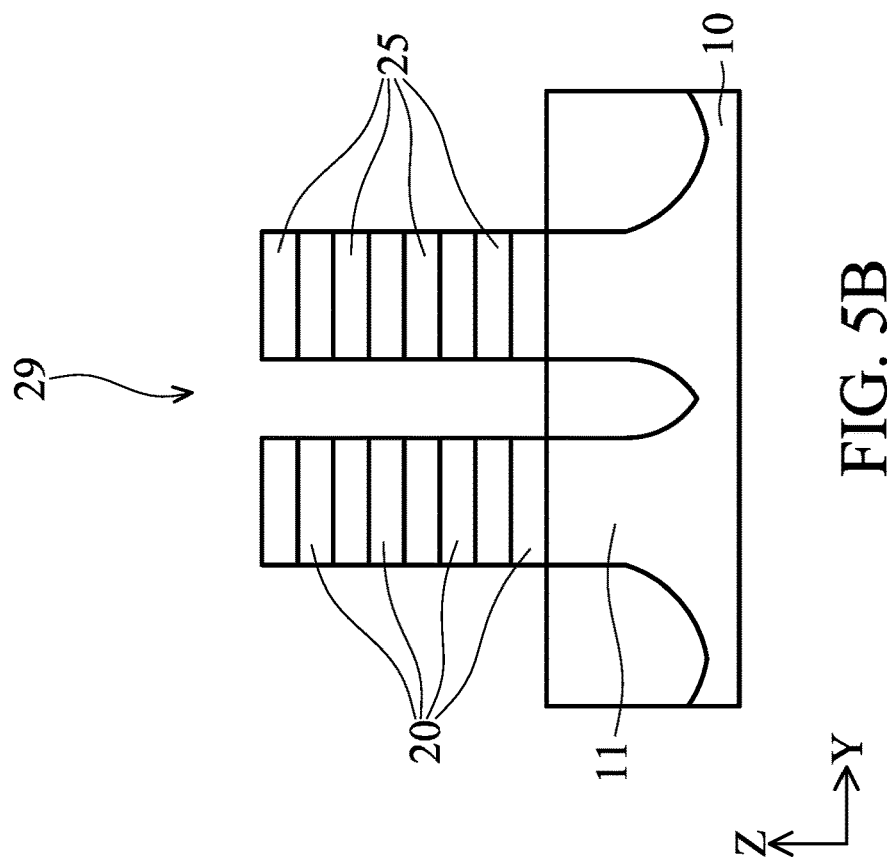
FIGS. 5A and 5B show one of the various stages of manufacturing a semiconductor GAA FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Generally, it is difficult to control lateral etching amounts when the nanowires (NWs) are released by selectively etching sacrificial semiconductor layers. The lateral ends of the NWs may be etched when the NW release etching process is performed after a dummy polysilicon gate is removed, because a lateral etching control or an etching budget for NW release etch is not sufficient. A gate electrode may touch a source/drain (source/drain) epitaxial layer if there is no etch stop layer. Further, there is a lager impact on gate to drain capacitance (Cgd). If no dielectric film existed between the gate and the source/drain region, Cgd becomes larger, which would reduce circuit speed.

Further, in a GAA FET, an inner spacer is provided between a metal gate electrode and a source/drain (source/drain) epitaxial layer. However, it is difficult to uniformly form inner spacers due to process variations not only in each device but also within the overall wafer and/or wafer-to-wafer. Further, it is necessary to provide better gate control for a GAA FET having inner spacers. The inner spacers act as an extra source of channel resistance, thereby hindering the gate control capability. A higher channel height in a GAA FET causes more difficulties in deposition and etching processes to more precisely control a uniformity of the structure from the channel bottom to the channel top. In particular, achieving a higher process uniformity within a 12-inch wafer becomes more difficult in a GAA FET fabrication method.

In the present disclosure, a novel method for fabricating an inner spacer between a metal gate electrode and a source/drain (source/drain) epitaxial layer for a GAA FET and a stacked channel FET are provided. In particular, in the present disclosure, the inner space has a wedge-shape cross section (triangular shape) defined by a (111) facet of a semiconductor crystal. In the present disclosure, the inner spacers can be more uniformly formed by a self-limited etch stop property. By employing a wedge-shape or a triangle shape inner spacer, it is possible to make more space for a gate dielectric layer and a gate electrode, thereby improving the gate control capability.

In this disclosure, a source/drain refers to a source and/or a drain. It is noted that in the present disclosure, a source and a drain are interchangeably used and the structures thereof are substantially the same.

FIGS. 1A-1D show various views of a semiconductor GAA FET device according to an embodiment of the present disclosure. FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A.

As shown in FIGS. 1A-1C, semiconductor wires 25 are provided over a semiconductor substrate 10, and vertically arranged along the Z direction (the normal direction of the principal surface of the substrate 10). In some embodiments, the substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

As shown in FIGS. 1A-1C, the semiconductor wires 25, which are channel layers, are disposed over the substrate 10. In some embodiments, the semiconductor wires 25 are disposed over a fin structure 11 (see, FIG. 5) protruding from the substrate 10. Each of the channel layers 25 is wrapped around by a gate dielectric layer 82 and a gate electrode layer 84. The thickness of the semiconductor wires 25 is in a range from about 5 nm to about 15 nm and the width of the semiconductor wires 25 is in a range from about 5 nm to about 15 nm in some embodiments. In some embodiments, the gate dielectric layer 82 includes an interfacial layer and a high-k dielectric layer. The gate structure includes the gate dielectric layer 82, the gate electrode layer 84 and sidewall spacers 40. Although FIGS. 1A-1C show four semiconductor wires 25, the number of the semiconductor wires 25 is not limited to four, and may be as small as one or more than four, and may be up to ten. By adjusting the numbers of the semiconductor wires, a driving current of the GAA FET device can be adjusted.

Further, a source/drain epitaxial layer 50 is disposed over the substrate 10. The source/drain epitaxial layer 50 is in direct contact with end faces of the channel layer 25, and is separated by insulating inner spacers 35 and the gate dielectric layer 82 from the gate electrode layer 84. In some embodiments, an additional insulating layer (not shown) is conformally formed on the inner surface of the spacer regions. As shown FIG. 1A, the cross section along the X direction of the inner spacer 35 has a wedge-shape or a substantially triangular shape.

An interlayer dielectric (ILD) layer 70 is disposed over the source/drain epitaxial layer 50 and a conductive contact layer 72 is disposed on the source/drain epitaxial layer 50, and a conductive plug 75 passing though the ILD layer 70 is disposed over the conductive contact layer 72. The conductive contact layer 72 includes one or more layers of conductive material. In some embodiments, the conductive contact layer 72 includes a silicide layer, such as WSi, NiSi, TiSi or CoSi or other suitable silicide material or an alloy of a metal element and silicon and/or germanium.

FIGS. 2A-2D show various views of a semiconductor FET device according to another embodiment of the present disclosure. FIG. 2A is a cross sectional view along the X direction (source-drain direction), FIG. 2B is a cross sectional view corresponding to Y1-Y1 of FIG. 2A, FIG. 2C is a cross sectional view corresponding to Y2-Y2 of FIG. 2A and FIG. 2D shows a cross sectional view corresponding to Y3-Y3 of FIG. 2A. Material, configuration, dimensions and/or processes the same as or similar to the foregoing embodiments described with respect to FIGS. 1A-1D may be employed in the embodiment of FIGS. 2A-2D, and detailed explanation thereof may be omitted.

In this embodiment, the source/drain epitaxial layer 50 wraps around end portions of the semiconductor wires 25 disposed at the source/drain regions, or the semiconductor wires 25 pass through the source/drain epitaxial layer 50.

In the embodiments of FIGS. 1A-1D and 2A-2D, the GAA FET is an n-type GAA FET. The semiconductor wires 25 are made of Si or $Si_{1-x}Ge_x$, where x is equal to or less than 0.2. The source/drain epitaxial layer 50 is made of one or more of Si, SiP, SiC or SiCP.

FIGS. 3A-3D show various views of a semiconductor FET device according to another embodiment of the present disclosure. FIG. 3A is a cross sectional view along the X direction (source-drain direction), FIG. 3B is a cross sectional view corresponding to Y1-Y1 of FIG. 3A, FIG. 3C is a cross sectional view corresponding to Y2-Y2 of FIG. 3A and FIG. 3D shows a cross sectional view corresponding to Y3-Y3 of FIG. 3A. Material, configuration, dimensions and/or processes the same as or similar to the foregoing embodiments described with respect to FIGS. 1A-2D may be employed in the embodiment of FIGS. 3A-3D, and detailed explanation thereof may be omitted.

In the embodiments of FIGS. 3A-3D, the GAA FET shown in FIGS. 1A-1D is a p-type GAA FET.

The semiconductor wires 20, which are channel layers and are made of $Si_{1-x}Ge_x$, where x is equal to or more than about 0.1 and equal to or less than about 0.6 (hereinafter may be merely referred to as SiGe), are disposed over the substrate 10. In some embodiments, the semiconductor wires 20 are disposed over a fin structure 11 (see, FIG. 5) protruding from the substrate 10. The thickness of the semiconductor wires 20 is in a range from about 5 nm to about 15 nm and the width of the semiconductor wires 20 is in a range from about 5 nm to about 15 nm in some embodiments. Each of the channel layers 20 is wrapped around by a gate dielectric layer 82 and a gate electrode layer 84. In some embodiments, the gate dielectric layer 82 includes an interfacial layer and a high-k dielectric layer. The gate structure includes the gate dielectric layer 82, the gate electrode layer 84 and sidewall spacers 40. Although FIGS. 3A-3C shows four semiconductor wires 20, the number of the semiconductor wires 20 is not limited to four, and may be as small as one or more than four and may be up to ten.

Further, a source/drain epitaxial layer 55 is disposed over the substrate 10. The source/drain epitaxial layer 55 is in direct contact with and faces of the channel layers 20, and is separated by insulating inner spacers 65 and the gate dielectric layer 82 from the gate electrode layer 84. The source/drain epitaxial layer 55 is made of one or more of Si, SGe and SiGeB. In some embodiments, an additional insulating layer (not shown) is conformally formed on the inner surface of the spacer regions.

As shown FIG. 3A, the cross section along the X direction of the inner spacer 65 has a wedge-shape or a substantially triangular shape. In some embodiments, the inner spacers 65 are disposed above the uppermost semiconductor wire 25.

FIGS. 4A-4D show various views of a p-type GAA FET device according to another embodiment of the present disclosure. FIG. 4A is a cross sectional view along the X direction (source-drain direction), FIG. 4B is a cross sectional view corresponding to Y1-Y1 of FIG. 4A, FIG. 4C is a cross sectional view corresponding to Y2-Y2 of FIG. 4A and FIG. 4D shows a cross sectional view corresponding to Y3-Y3 of FIG. 4A. Material, configuration, dimensions and/or processes the same as or similar to the foregoing embodiments described with respect to FIGS. 1A-3D may be employed in the embodiment of FIGS. 4A-4D, and detailed explanation thereof may be omitted.

In this embodiment, the source/drain epitaxial layer 55 wraps around end portions of the semiconductor wires 20 disposed at the source/drain regions, or the semiconductor wires 20 pass through the source/drain epitaxial layer 55.

In some embodiments, two or more of the GAA FETs shown in FIGS. 1A-4D are disposed on one semiconductor substrate (chip) to achieve various circuit functions.

FIGS. 5A to 20B show various stages of manufacturing a semiconductor FET device according to an embodiment of the present disclosure. In FIGS. 7A-20B, the "A" figures are a cross sectional view along the X direction (source-drain direction) for an n-type GAA FET, and the "B" figures are a cross sectional view along the X direction for a p-type GAA FET. It is understood that in FIGS. 7A-20B, the n-type GAA FET and the p-type GAA FET are formed on the same substrate (a chip) in some embodiments. It is understood that additional operations can be provided before, during, and after processes shown by FIGS. 5A-20B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-4D may be employed in the embodiment of FIGS. 5A-20B, and detailed explanation thereof may be omitted.

Figure 5A:
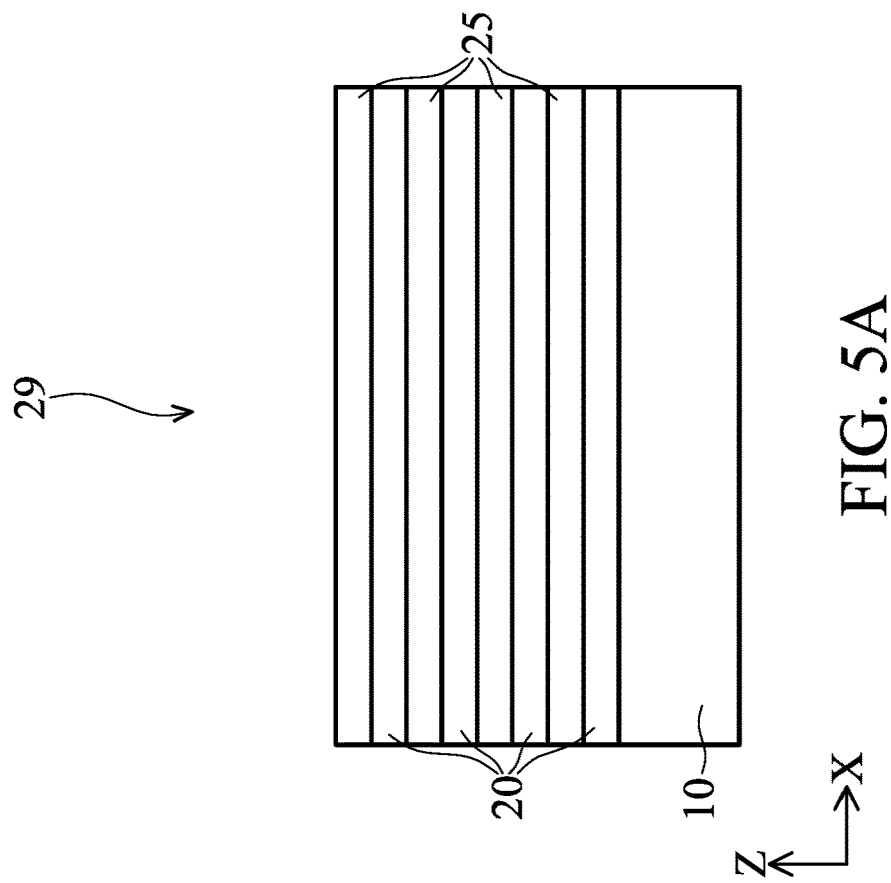

As shown in FIGS. 5A and 5B, fin structures 29, in which first semiconductor layers 20 and second semiconductor layers 25 are alternately stacked, are formed over the substrate 10. The fin structures 29 protrude from an isolation insulating layer 15. The fin structures 29 can be formed by the following operations.

Stacked semiconductor layers are formed over the substrate 10. The stacked semiconductor layers include the first semiconductor layers 20 and the second semiconductor layers 25. The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is equal to or more than about 0.1 and equal to or less than about 0.6, and the second semiconductor layers 25 are Si or $Si_{1-y}Ge_y$, where y is equal to or less than about 0.2. In this disclosure, an "M compound" or an "M based compound" means the majority of the compound is M.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 2 nm to about 20 nm in some embodiments, and is in a range from about 5 nm to about 15 nm in other embodiments. The thickness of the second semiconductor layers 25 is in a range from about 2 nm to about 20 nm in some embodiments, and is in a range from about 5 nm to about 15 nm in other embodiments. The thickness of each of the first semiconductor layers 20 may be the same, or may vary.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, a mask layer including a first mask layer and a second mask layer is formed over the stacked layers. The first mask layer is a pad oxide layer made of a silicon oxide, which can be formed by a thermal oxidation. The second mask layer is made of a silicon nitride, which is formed by chemical vapor deposition (CVD), including low pressure CVD (LPCVD) and plasma enhanced CVD (PECVD), physical vapor deposition (PVD), atomic layer deposition (ALD), or other suitable process. The mask layer is patterned into a mask pattern by using patterning operations including photo-lithography and etching.

Next, the stacked layers of the first and second semiconductor layers 20, 25 are patterned by using the patterned mask layer, thereby the stacked layers are formed into fin structures 29 extending in the X direction, as shown in FIGS. 5A and 5B. In FIG. 5B, two fin structures 29 are arranged in the Y direction. But the number of the fin structures is not limited to two, and may be as small as one and three or more. In some embodiments, one or more dummy fin structures are formed on both sides of the fin structures 29 to improve pattern fidelity in the patterning operations. As shown in FIG. 5B, the fin structures 29 have upper portions constituted by the stacked semiconductor layers 20, 25 and well portions 11.

The width of the upper portion of the fin structure 29 along the Y direction is in a range from about 10 nm to about 40 nm in some embodiments, and is in a range from about 20 nm to about 30 nm in other embodiments.

The stacked fin structure 29 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the stacked fin structure 29.

After the fin structures 29 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, one of more fin liner layers 16 (see, FIG. 8C) are formed over the fin structures before forming the insulating material layer. In some embodiments, the fin liner layers include a first fin liner layer formed over the substrate 10 and sidewalls of the bottom part of the fin structures 11, and a second fin liner layer formed on the first fin liner layer. The fin liner layers are made of silicon nitride or a silicon nitride-based material (e.g., SiON, SiCN or SiOCN). The fin liner layers may be deposited through one or more processes such as physical vapor deposition (PVD), chemical vapor deposition (CVD), or atomic layer deposition (ALD), although any acceptable process may be utilized.

Then, as shown in FIG. 5B, the insulating material layer is recessed to form an isolation insulating layer 15 so that the upper portions of the fin structures 29 are exposed. With this operation, the fin structures 29 are separated from each other by the isolation insulating layer 15, which is also called a shallow trench isolation (STI). The isolation insulating layer 15 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 15 is formed through a process such as CVD, flowable CVD (FCVD), or a spin-on-glass process, although any acceptable process may be utilized.

In some embodiments, the insulating material layer 15 is recessed until the upper portion of the fin structure (well layer) 11 is exposed. In other embodiments, the upper portion of the fin structure 11 is not exposed. The first semiconductor layers 20 are sacrificial layers which are subsequently partially removed, and the second semiconductor layers 25 are subsequently formed into semiconductor wires as channel layers of an n-type GAA FET. For a p-type GAA FET, the second semiconductor layers 25 are sacrificial layers which are subsequently partially removed, and the first semiconductor layers 20 are subsequently formed into semiconductor wires as channel layers.

After the isolation insulating layer 15 is formed, a sacrificial (dummy) gate structure 49 is formed, as shown in FIGS. 6A and 6B. FIGS. 6A and 6B illustrates a structure after a sacrificial gate structure 49 is formed over the exposed fin structures 29. The sacrificial gate structure 49 is formed over a portion of the fin structures which is to be a channel region. The sacrificial gate structure 49 defines the channel region of the GAA FET. The sacrificial gate structure 49 includes a sacrificial gate dielectric layer 41 and a sacrificial gate electrode layer 42. The sacrificial gate dielectric layer 41 includes one or more layers of insulating material, such as a silicon oxide-based material. In one embodiment, silicon oxide formed by CVD is used. The thickness of the sacrificial gate dielectric layer 41 is in a range from about 1 nm to about 5 nm in some embodiments.

The sacrificial gate structure 49 is formed by first blanket depositing the sacrificial gate dielectric layer 41 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad silicon nitride layer 43 and a silicon oxide mask layer 44.

Next, a patterning operation is performed on the mask layer and sacrificial gate electrode layer is patterned into the sacrificial gate structure 49, as shown in FIGS. 6A and 6B. The sacrificial gate structure includes the sacrificial gate dielectric layer 41, the sacrificial gate electrode layer 42 (e.g., poly silicon), the pad silicon nitride layer 43 and the silicon oxide mask layer 44. By patterning the sacrificial gate structure, the stacked layers of the first and second semiconductor layers are partially exposed on opposite sides of the sacrificial gate structure, thereby defining source/drain regions, as shown in FIGS. 6A and 6B. In this disclosure, a source and a drain are interchangeably used and the structures thereof are substantially the same. In FIGS. 6A and 6B, one sacrificial gate structure is formed over two fin structures, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Further, a first cover layer 45 for sidewall spacers is formed over the sacrificial gate structure 49, as shown in FIGS. 6A and 6B. The first cover layer 45 is deposited in a conformal manner so that it is formed to have substantially equal thicknesses on vertical surfaces, such as the sidewalls, horizontal surfaces, and the top of the sacrificial gate structure, respectively. In some embodiments, the first cover layer 45 has a thickness in a range from about 5 nm to about 20 nm. The first cover layer 45 includes one or more of silicon nitride, SiON, SiCN, SiCO, SiOCN or any other suitable dielectric material. The cover layer 45 can be formed by ALD or CVD, or any other suitable method.

FIG. 7A shows a cross sectional view along the X direction in an n-type region, and FIG. 7B shows a cross sectional view along the X direction in a p-type region. Next, as shown in FIGS. 7A and 7B, in the n-type region, the first cover layer 45 is anisotropicly etched to remove the first cover layer 45 disposed on the source/drain region, while leaving the first cover layer 45 as sidewall spacers on side faces of the sacrificial gate structure 49. Then the stacked structure of the first semiconductor layers 20 and the second semiconductor layer 25 is etched down at the source/drain region, by using one or more lithography and etching operations, thereby forming a source/drain space 21. In some embodiments, the substrate 10 (or the bottom part of the fin structures 11) is also partially etched. The p-type region is covered by a protective layer 101, such a photo resist layer, as shown in FIG. 7B.

Figure 8C:
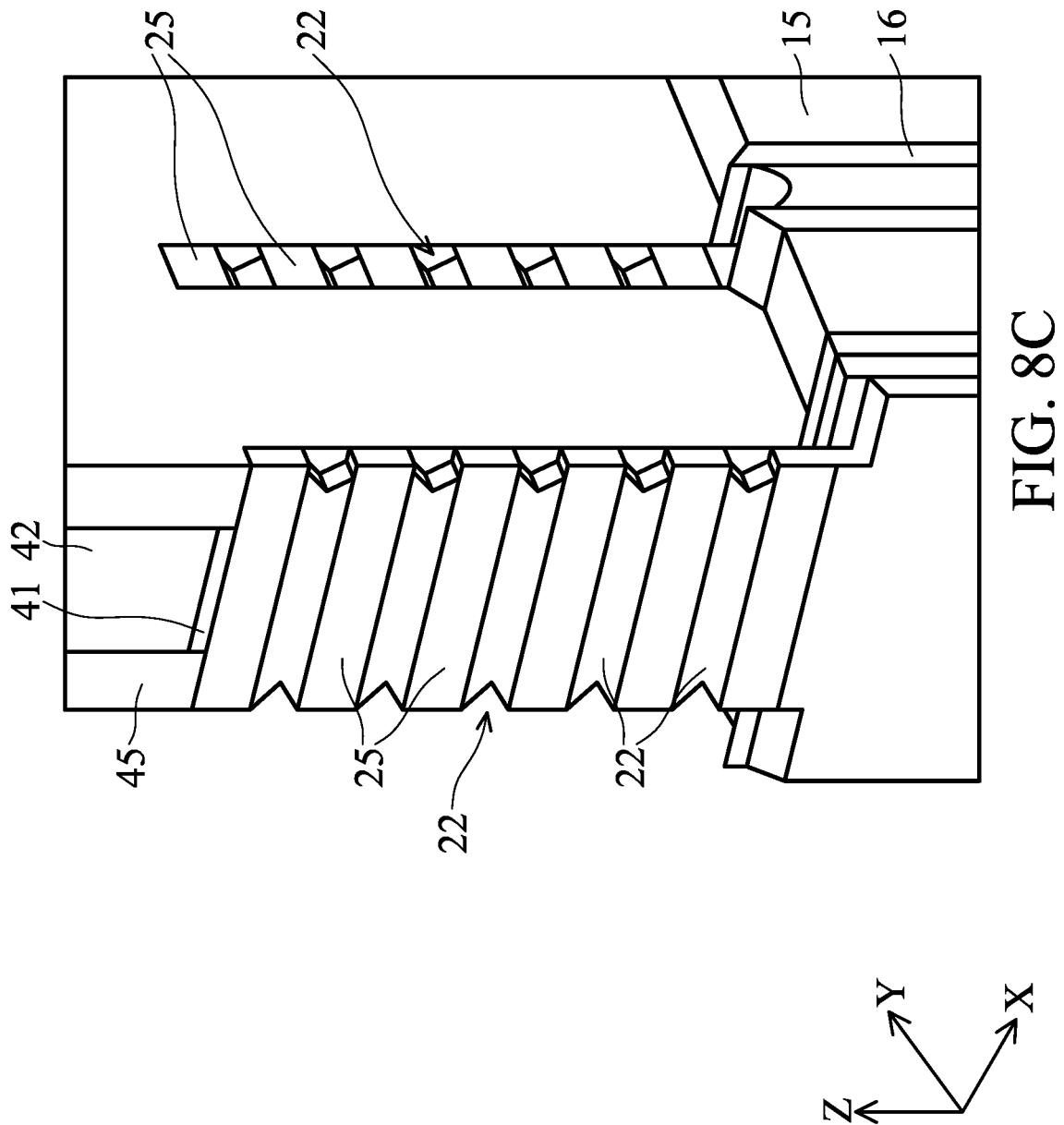

Further, as shown in FIGS. 8A-8C, the first semiconductor layers 20 are laterally etched in the X direction within the source/drain space 21, thereby forming cavities 22. The amount of etching of the first semiconductor layer 20 is in a range from about 2 nm to about 10 nm in some embodiments. When the first semiconductor layers 20 are Ge or SiGe and the second semiconductor layers 25 are Si, the first semiconductor layers 20 can be selectively etched by using a wet etchant such as, but not limited to, an HCl solution. By using the HCl acid solution and by selecting an appropriate crystal orientation of the first semiconductor layers 20, the etched surface of the end faces of the first semiconductor layers 20 have a V-shape (90 degree rotated) or a substantially triangular shape, defined by (111) facets of the first semiconductor layers 20. In other embodiments, a mixed solution of $NH_4OH$, $H_2O_2$ and $H_2O$ is used to selectively etch the first semiconductor layer 20 to obtain the etched surface of the end faces of the first semiconductor layers 20 having a V-shape (90 degree rotated) or a substantially triangular shape, defined by (111) facets of the first semiconductor layers 20. The mixed solution is used at a temperature in a range from about 60° C. to about 90° C. in some embodiments. After the lateral etching, the protective layer 101 in the p-type region is removed.

As shown in FIG. 9A, a first insulating layer 30 is conformally formed on the etched lateral ends of the first semiconductor layers 20 and on end faces of the second semiconductor layers 25 in the source/drain space 21 and over the sacrificial gate structure. The first insulating layer 30 includes one of silicon nitride and silicon oxide, SiON, SiOC, SiCN and SiOCN, or any other suitable dielectric material. The first insulating layer 30 is made of a different material than the sidewall spacers (first cover layer) 45. The first insulating layer 30 has a thickness in a range from about 1.0 nm to about 10.0 nm. In other embodiments, the first insulating layer 30 has a thickness in a range from about 2.0 nm to about 5.0 nm. The first insulating layer 30 can be formed by ALD or any other suitable methods. By conformally forming the first insulating layer 30, the cavities 22 are fully filled with the first insulating layer 30. In the p-type region, the first insulating layer 30 is formed on the first cover layer 45, as shown in FIG. 9B.

Figure 10B:
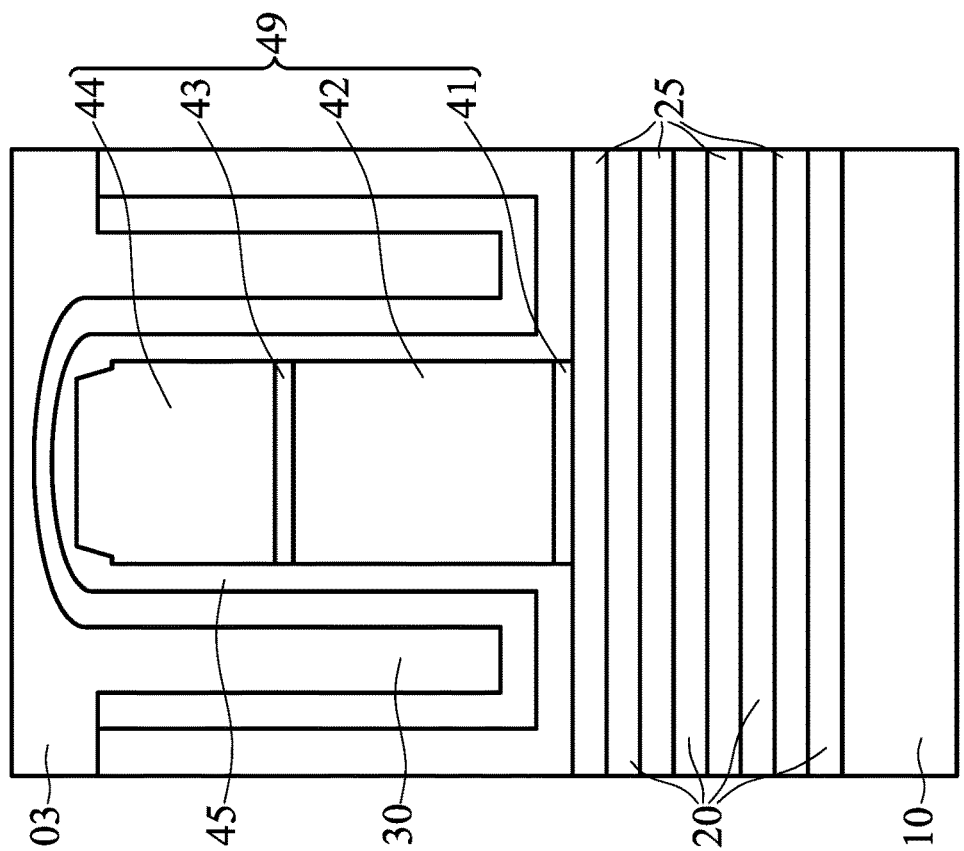
FIGS. 10A and 10B show one of the various stages of manufacturing a semiconductor GAA FET device according to an embodiment of the present disclosure.
Figure 10A:
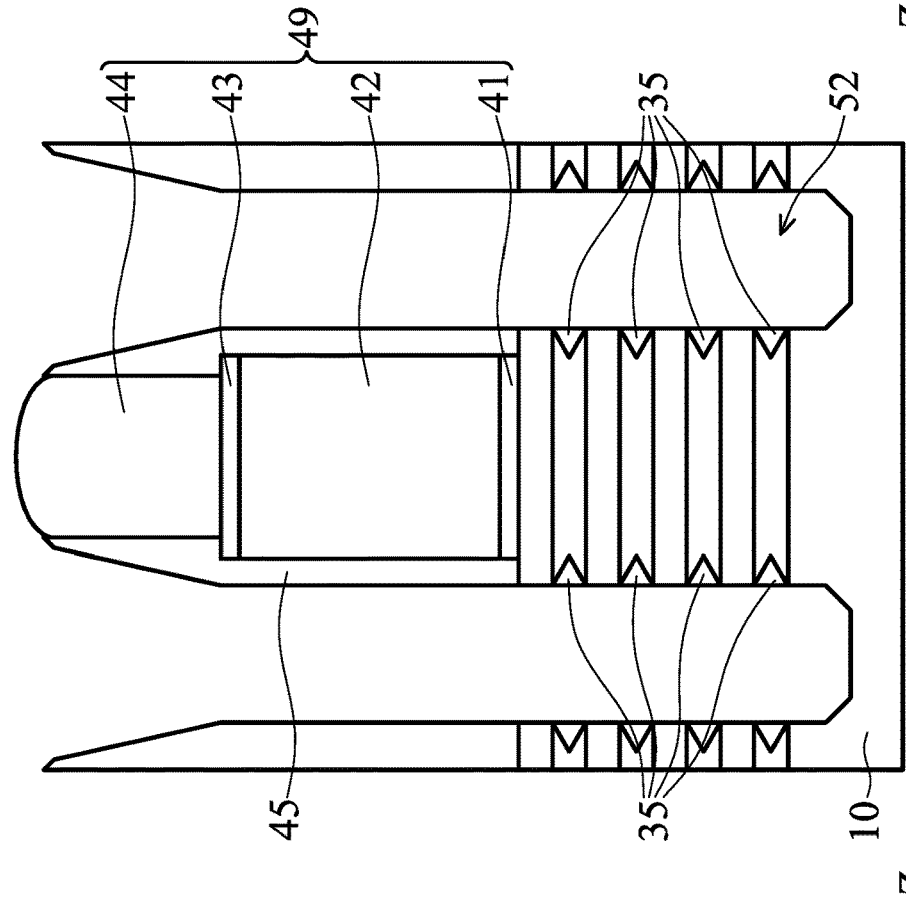

After the first insulating layer 30 is formed, an etching operation is performed to partially remove the first insulating layer 30, thereby forming inner spacers 35, as shown in FIG. 10A. In some embodiments, the p-type region is covered by a protective layer 103, for example, a photo resist pattern, as shown in FIG. 10B. In other embodiments, the protective layer 103 is not used, and in such a case, the first insulating layer 30 in the p-type region is simultaneously removed during the etching operation performed in the n-type region.

In some embodiments, before forming the first insulating layer 30, an additional insulating layer having a smaller thickness than the first insulating layer 30 is formed, and thus the inner spacers 35 have a two-layer structure.

Figures 11A, 11B:
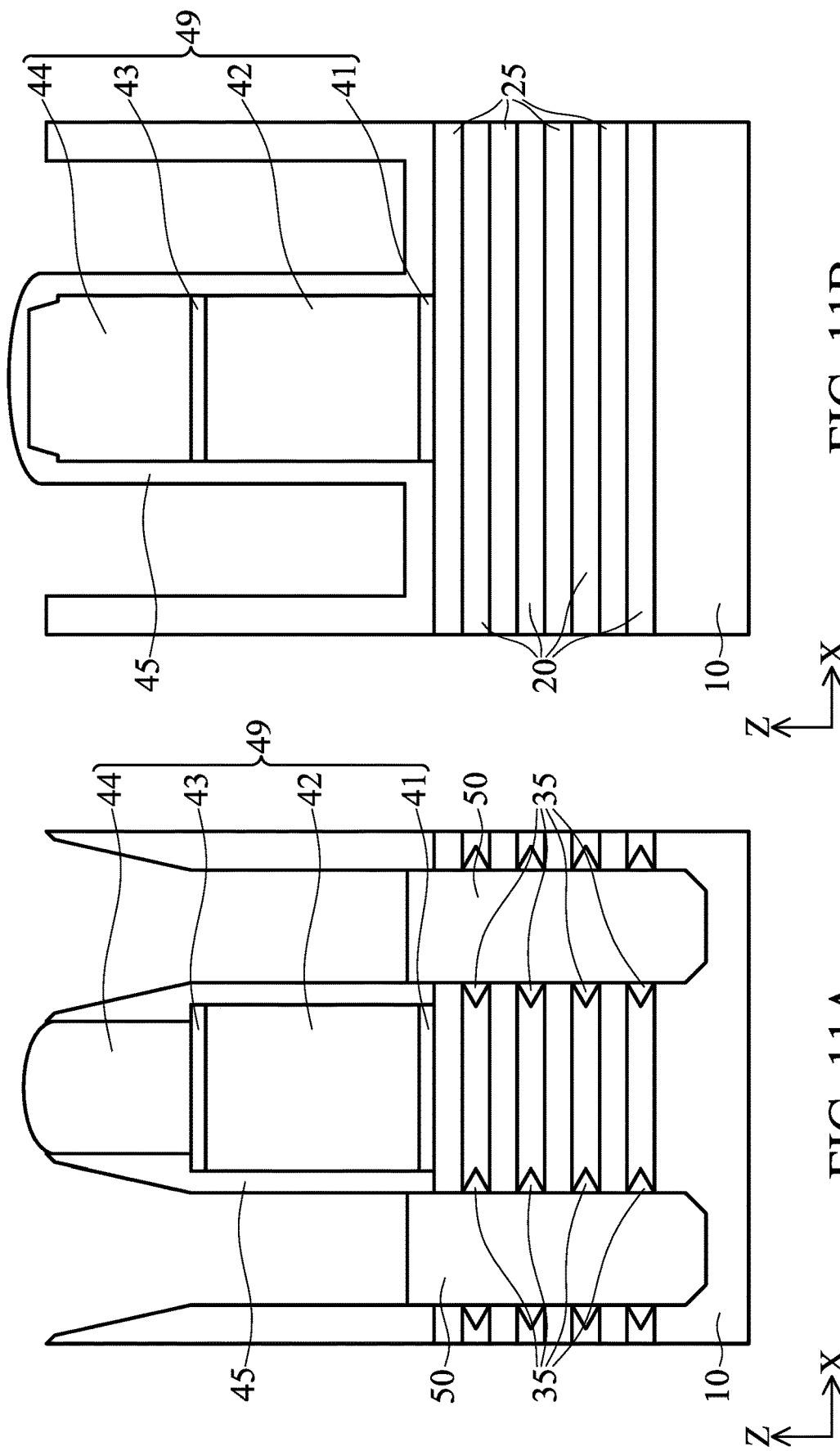
FIGS. 11A and 11B show one of the various stages of manufacturing a semiconductor GAA FET device according to an embodiment of the present disclosure.

Subsequently, as shown in FIG. 11A, a source/drain epitaxial layer 50 is formed in the source/drain space 21, in the n-type region. The source/drain epitaxial layer 50 includes one or more layers of Si, SiP, SiC and SiCP for an n-channel FET. The source/drain epitaxial layer 50 is formed by an epitaxial growth method using CVD, ALD or molecular beam epitaxy (MBE). As shown in FIGS. 11A and 11B, the source/drain epitaxial layer 50 is selectively formed on semiconductor regions. The source/drain epitaxial layer 50 is formed in contact with end faces of the second semiconductor layers 25, and formed in contact with the inner spacers 35.

Then, as shown in FIGS. 12A and 12B, a second cover layer 47 is formed both in the n-type region and the p-type region. The second cover layer 47 includes one of silicon nitride and silicon oxide, SiON, SiOC, SiCN and SiOCN, or any other suitable dielectric material. The second cover layer 47 is made of a different material than the sidewall spacers (first cover layer) 45. The second insulating layer 47 can be formed by ALD or any other suitable methods.

Figures 13A, 13B:
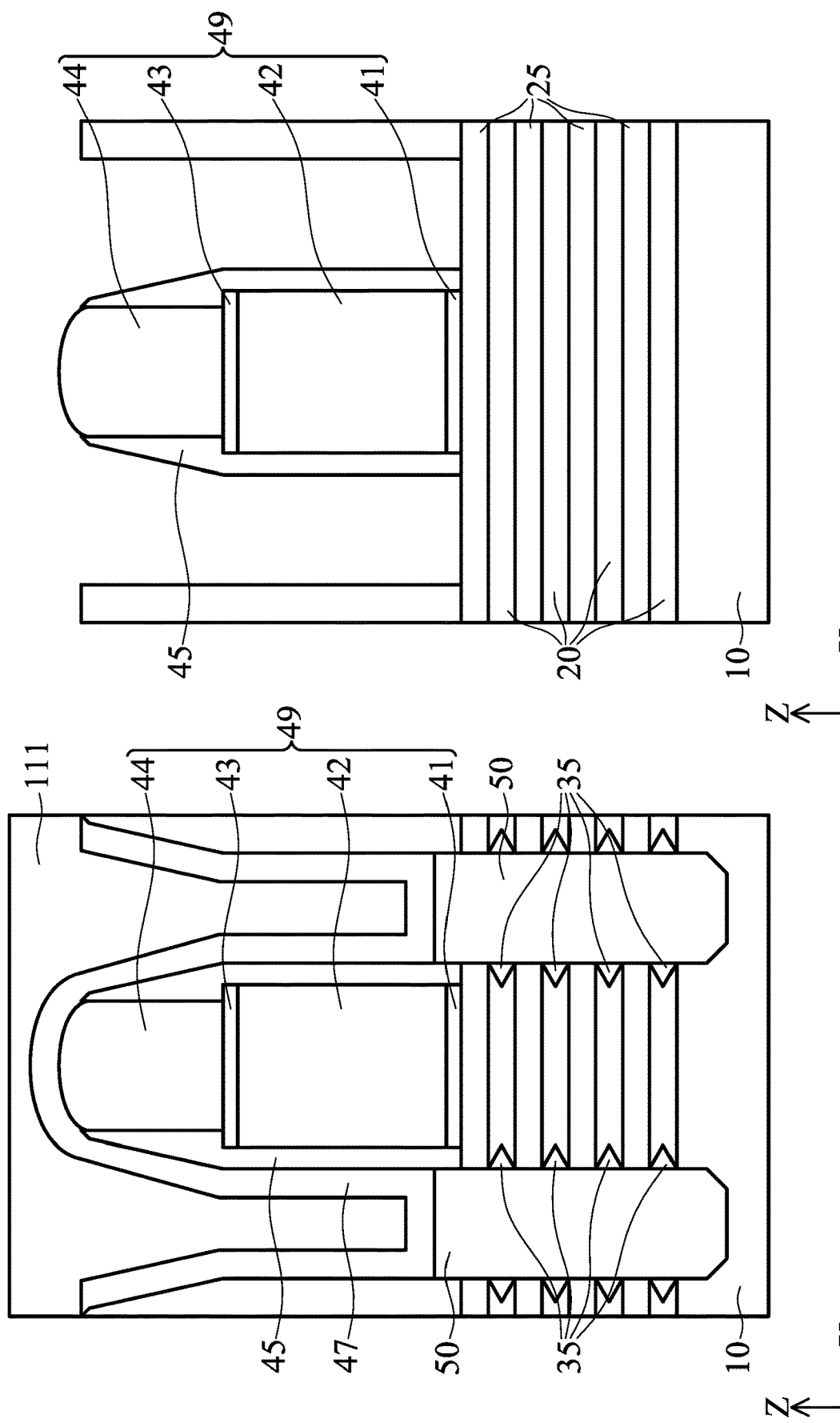
FIGS. 13A and 13B show one of the various stages of manufacturing a semiconductor GAA FET device according to an embodiment of the present disclosure.

Next, as shown in FIGS. 13A and 13B, while the n-type region is covered by a protective layer 111, for example, a photo resist pattern, the second cover layer 47 is removed from the p-type region. Further, the first cover layer 45 is anisotropicaly etched to remove the first cover layer 45 disposed on the source/drain region, while leaving the first cover layer 45 as sidewall spacers on side faces of the sacrificial gate structure 49 in the p-type region.

Figures 14A, 14B:
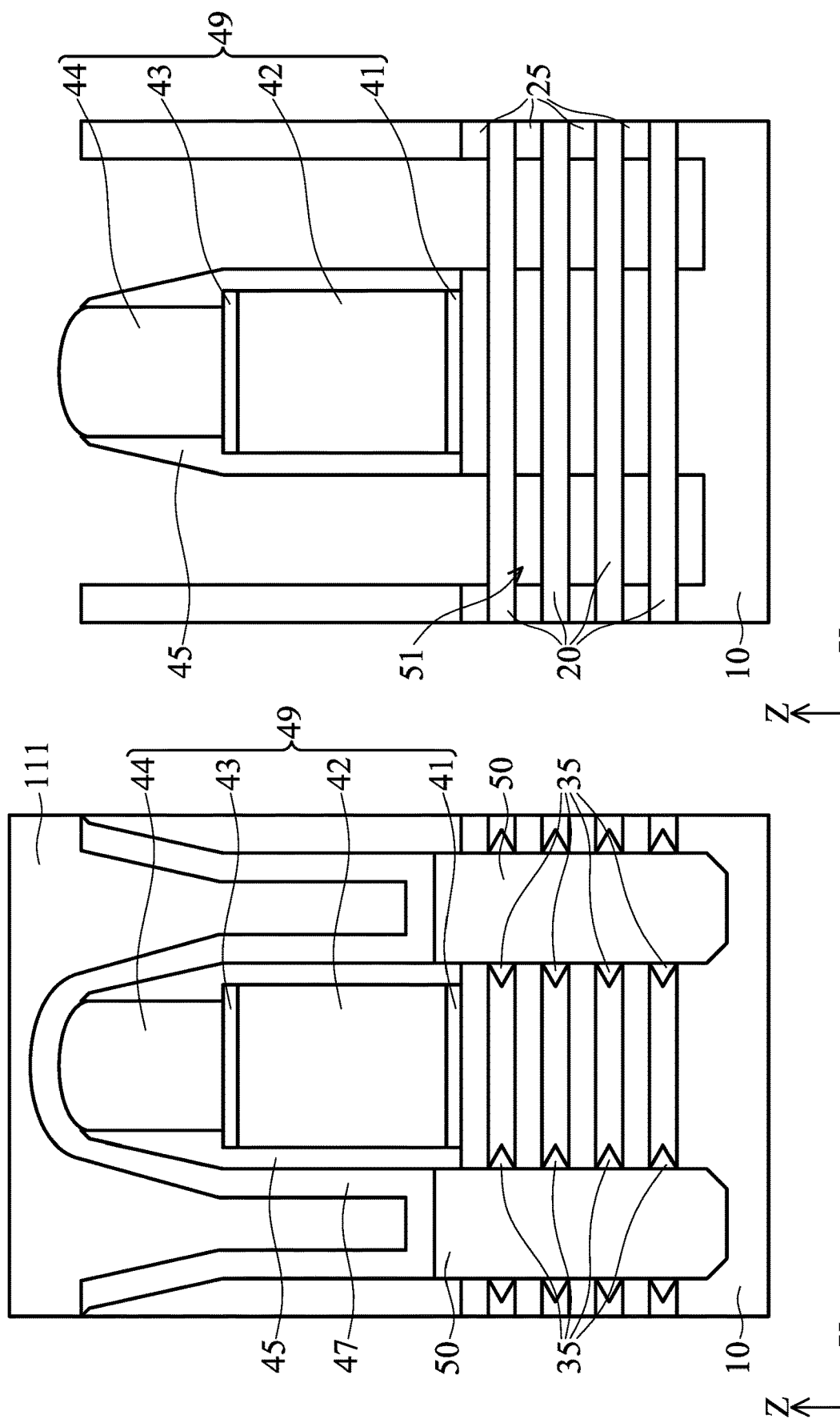
FIGS. 14A and 14B show one of the various stages of manufacturing a semiconductor GAA FET device according to an embodiment of the present disclosure.

Further, as shown in FIG. 14B, the second semiconductor layer 25 in the source/drain region of the fin structure, which is not covered by the sacrificial gate structure, is etched, thereby leaving the first semiconductor layers 20 remaining in the source/drain region. The n-type region is covered by the protective layer 111 in some embodiments, as shown in FIG. 14A. In other embodiments, the protective layer 111 is removed before etching the source/drain region in the p-type region, and the second cover layer 47 protects the n-type region.

In addition, the second semiconductor layers 25 are laterally etched in the X direction within the source/drain space 51, thereby forming cavities 52, as shown in FIG. 15B. The amount of etching of the second semiconductor layer 25 is in a range from about 2 nm to about 10 nm in some embodiments. When the first semiconductor layers 20 are Ge or SiGe and the second semiconductor layers 25 are Si, the second semiconductor layers 25 can be selectively etched by using a wet etchant such as, but not limited to, an ammonium hydroxide ($NH_4OH$) solution and/or a tetramethylammonium hydroxide (TMAH) solution. By using the ammonium hydroxide ($NH_4OH$) solution and/or the tetramethylammonium hydroxide (TMAH) solution and by selecting an appropriate crystal orientation of the second semiconductor layers 25, the etched surface of the end faces of the second semiconductor layers 25 have a V-shape (90 degree rotated) or a substantially triangular shape, defined by (111) facets of the second semiconductor layers 25. After the lateral etching, the protective layer 111, if remaining at this stage, in the p-type region is removed.

Then, as shown in FIGS. 16A and 16B, a second insulating layer 60 is formed over both the p-type region and the n-type region. In some embodiments, the second insulating layer 60 fully fills the source/drain space 51 between the adjacent first semiconductor layers 20. The second insulating layer 60 includes one of silicon nitride and silicon oxide, SiON, SiOC, SiCN and SiOCN, or any other suitable dielectric material. The second insulating layer 60 is made of a different material than the sidewall spacers (first cover layer) 45. The second insulating layer 60 has a thickness in a range from about 1.0 nm to about 10.0 nm. In other embodiments, the second insulating layer 60 has a thickness in a range from about 2.0 nm to about 5.0 nm. The second insulating layer 60 can be formed by ALD or any other suitable methods. By forming the second insulating layer 60, the cavity 52 is fully filled with the second insulating layer 60. In the n-type region, the second insulating layer 60 is formed on the second cover layer 47, as shown in FIG. 16B.

After the second insulating layer 60 is formed, an etching operation is performed to partially remove the second insulating layer 60, thereby forming inner spacers 65, as shown in FIG. 17B, while the n-type region is covered by the second cover layer 47, as shown in FIG. 17A. In some embodiments, before forming the second insulating layer 60, an additional insulating layer having a smaller thickness than the second insulating layer 60 is formed, and thus the inner spacers 65 has a two-layer structure.

Subsequently, as shown in FIGS. 18A and 18B, a source/drain epitaxial layer 55 is formed in the source/drain space 51, in the p-type region. The source/drain epitaxial layer 55 includes one or more layers of Si, SiGe and Ge for a p-channel FET. For the P-channel FET, boron (B) may also be contained in the source/drain. The source/drain epitaxial layer 55 is formed by an epitaxial growth method using CVD, ALD or molecular beam epitaxy (MBE). The source/drain epitaxial layer 55 is formed to wrap around end portions of the first semiconductor layers 20, and formed in contact with the inner spacers 65. In some embodiments, the first semiconductor layers 20 pass through the source/drain epitaxial layer 55. After the source/drain epitaxial layer 55 is selectively formed on semiconductor regions in the p-type region, the second cover layer 47 in the n-type region is removed, as shown in FIG. 18A.

Subsequently, an interlayer dielectric (ILD) layer 70 is formed over the source/drain epitaxial layers 50 and 55. The materials for the ILD layer 70 include compounds comprising Si, O, C and/or H, such as silicon oxide, SiCOH and SiOC. Organic materials, such as polymers, may be used for the ILD layer 70. After the ILD layer 70 is formed, a planarization operation, such as CMP, is performed, so that the top portion of the sacrificial gate electrode layer 42 is exposed.

Then, the sacrificial gate electrode layer 42 and sacrificial gate dielectric layer 41 are removed. The ILD layer 70 protects the source/drain epitaxial layers 50 and 55 during the removal of the sacrificial gate structures. The sacrificial gate structures can be removed using plasma dry etching and/or wet etching. When the sacrificial gate electrode layer 42 is polysilicon and the ILD layer 70 is silicon oxide, a wet etchant such as a TMAH solution can be used to selectively remove the sacrificial gate electrode layer 42. The sacrificial gate dielectric layer 41 is thereafter removed using plasma dry etching and/or wet etching.

Figures 19A, 19B:
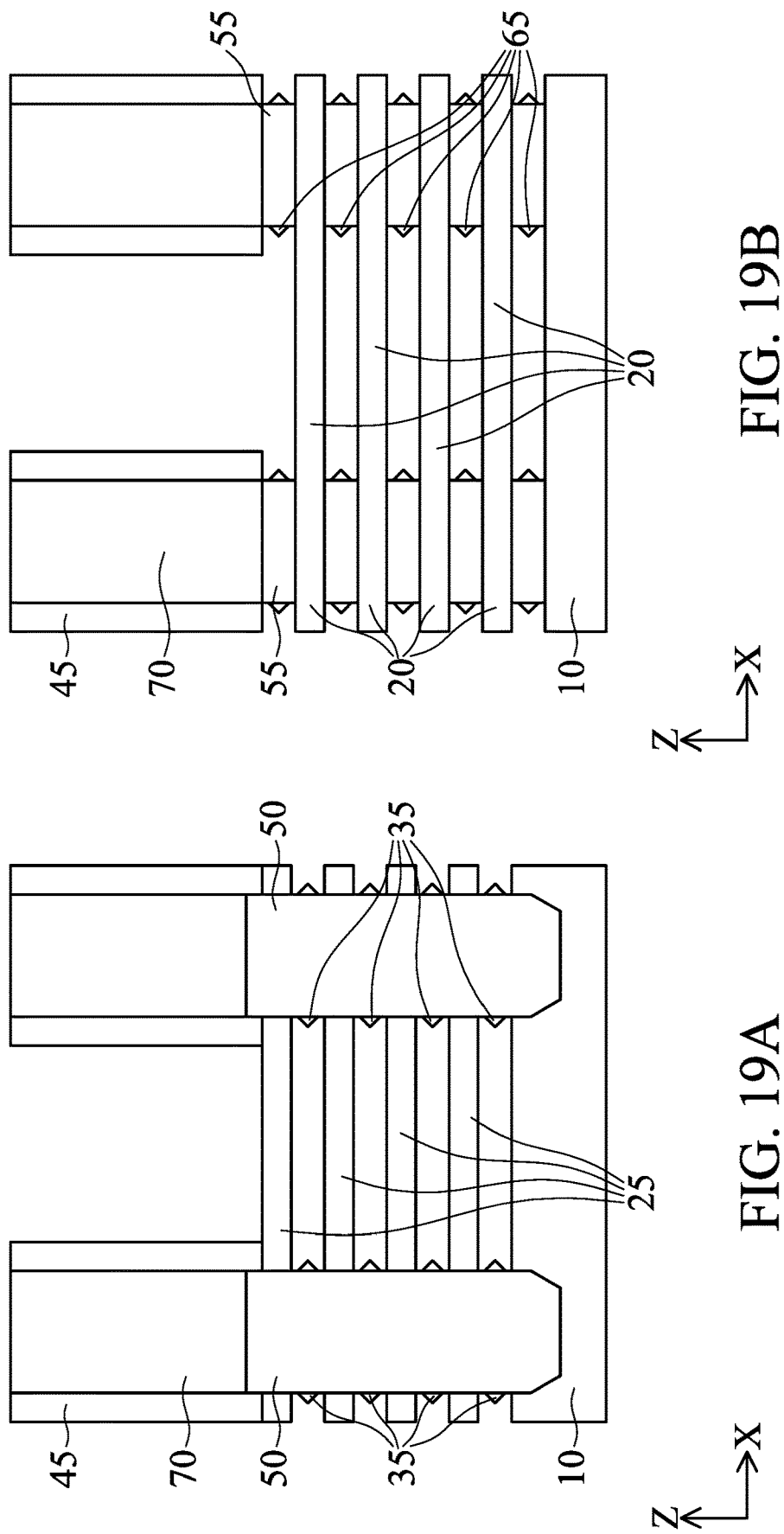
FIGS. 19A and 19B show one of the various stages of manufacturing a semiconductor GAA FET device according to an embodiment of the present disclosure.

After the sacrificial gate structures are removed, the first semiconductor layers 20 are removed in the n-type region, thereby forming wires (channel regions) of the second semiconductor layers 25, as shown in FIG. 19A. The first semiconductor layers 20 can be removed or etched using an etchant that can selectively etch the first semiconductor layers 20 against the second semiconductor layers 25, as set forth above. As shown in FIG. 19A, since the first insulating layers (inner spacers) 35 are formed, the etching of the first semiconductor layers 20 stops at the first insulating layer 35. In other words, the first insulating layer 35 functions as an etch-stop layer for etching of the first semiconductor layers 20. The channel formation operations for the n-type region are performed, while the p-type region is covered by a protective layer.

Similarly, the second semiconductor layers 25 are removed in the p-type region, thereby forming wires (channel regions) of the first semiconductor layers 20, as shown in FIG. 19B. The second semiconductor layers 25 can be removed or etched using an etchant that can selectively etch the second semiconductor layers 25 against the first semiconductor layers 20, as set forth above. As shown in FIG.

19B, since the second insulating layers (inner spacers) 65 are formed, the etching of the second semiconductor layers 25 stops at the second insulating layer 65. In other words, the second insulating layer 65 functions as an etch-stop layer for etching of the second semiconductor layers 25. The channel formation operations for the p-type region are performed, while the n-type region is covered by a protective layer. The formation of the channel regions for the p-type region can be performed after the formation of the channel regions for the n-type region.

After the semiconductor wires (channel regions) of the second semiconductor layers 25 in the n-type region and the first semiconductor layers 20 in the p-type region are formed, a gate dielectric layer 82 is formed around each channel regions for the n-type region and the p-type region. Further, a gate electrode layer 84 is formed on the gate dielectric layer 82, as shown in FIGS. 20A and 20B. In some embodiments, the structure and/or material of the gate electrode for the n-type GAA FET are different from the structure and/or material of the gate electrode for the p-type GAA FET.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer (not shown) formed between the channel layers and the dielectric material.

The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layers. The thickness of the gate dielectric layer 82 is in a range from about 1 nm to about 6 nm in one embodiment.

The gate electrode layer 84 is formed on the gate dielectric layer 82 to surround each channel layer. The gate electrode 84 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 84 may be formed by CVD, ALD, electro-plating, or other suitable method. The gate electrode layer is also deposited over the upper surface of the ILD layer 70. The gate dielectric layer and the gate electrode layer formed over the ILD layer 70 are then planarized by using, for example, CMP, until the top surface of the ILD layer 70 is revealed. In some embodiments, after the planarization operation, the gate electrode layer 84 is recessed and a cap insulating layer (not shown) is formed over the recessed gate electrode 84. The cap insulating layer includes one or more layers of a silicon nitride-based material, such as silicon nitride. The cap insulating layer can be formed by depositing an insulating material followed by a planarization operation.

In certain embodiments of the present disclosure, one or more work function adjustment layers (not shown) are interposed between the gate dielectric layer 82 and the gate electrode 84. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Subsequently, contact holes are formed in the ILD layer 70 by using dry etching, thereby exposing the upper portion of the source/drain epitaxial layer 50. In some embodiments, a silicide layer is formed over the source/drain epitaxial layer 50. The silicide layer includes one or more of WSi, CoSi, NiSi, TiSi, MoSi and TaSi. Then, a conductive contact layer 72 is formed in the contact holes as shown in FIGS. 1A-1D. The conductive contact layer 72 includes one or more of Co, Ni, W, Ti, Ta, Cu, Al, TiN and TaN. Further, a conductive contact plug 75 is formed on the conductive contact layer 72. The conductive contact plug 75 includes one or more layers of Co, Ni, W, Ti, Ta, Cu, Al, TiN and TaN.

It is noted that in the foregoing embodiments, the order of the processes for the n-type GAA FET and the processes for the p-tyep GAA FET can be interchangeable. For example, in the foregoing embodiments, the inner spacers 35 for the n-type GAA FET are first formed and then the inner spacers 65 for the p-type GAA FET are formed. In other embodiments, the inner spacers 65 for the p-type GAA FET are first formed and then the inner spacers 35 for the n-type GAA FET are formed.

It is understood that the GAA FETs undergo further CMOS processes to form various features such as contacts/vias, interconnect metal layers, dielectric layers, passivation layers, etc.

FIGS. 21A-32B show various stages of manufacturing a semiconductor FET device according to another embodiment of the present disclosure. In FIGS. 21A-32B, the "A" figures are a cross sectional view along the X direction (source-drain direction) for an n-type GAA FET, and the "B" figures are a cross sectional view along the X direction for a p-type GAA FET. It is understood that in FIGS. 21A-32B, the n-type GAA FET and the p-type GAA FET are formed on the same substrate (a chip) in some embodiments. It is understood that additional operations can be provided before, during, and after processes shown by FIGS. 21A-32B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-20B may be employed in the embodiment of FIGS. 21A-32B, and detailed explanation thereof may be omitted.

Figure 21A:
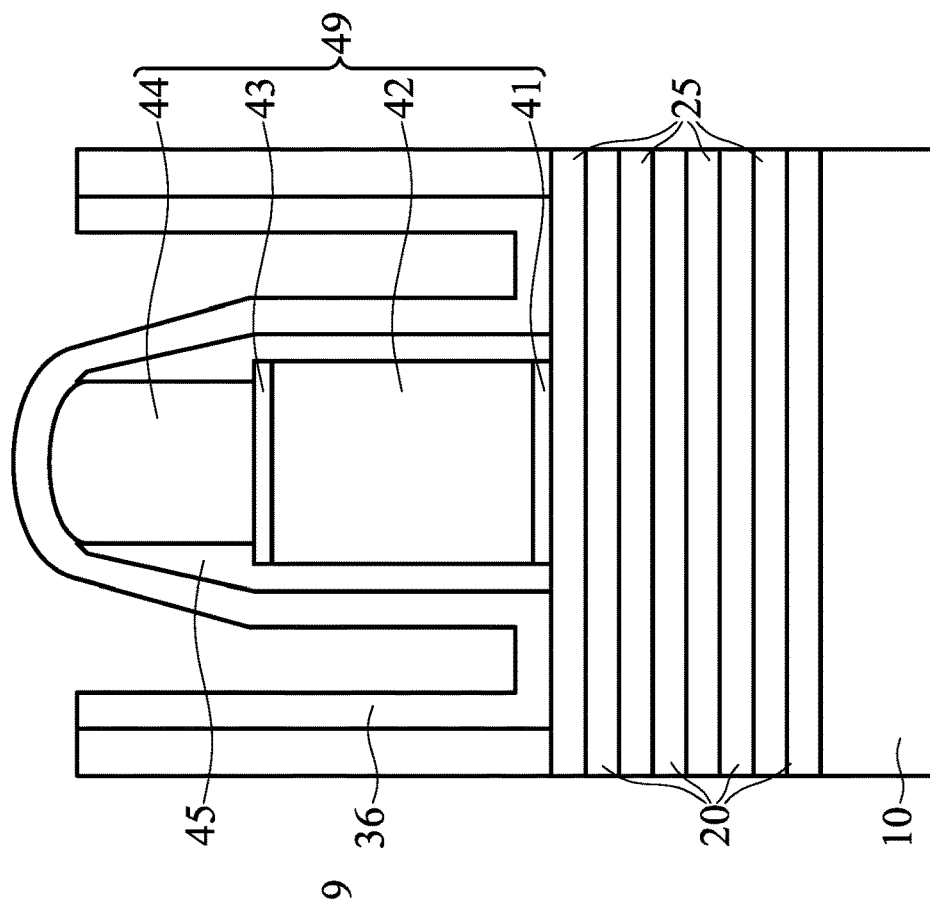
FIGS. 21A and 21B show one of the various stages of manufacturing a semiconductor GAA FET device according to another embodiment of the present disclosure.
Figure 21B:
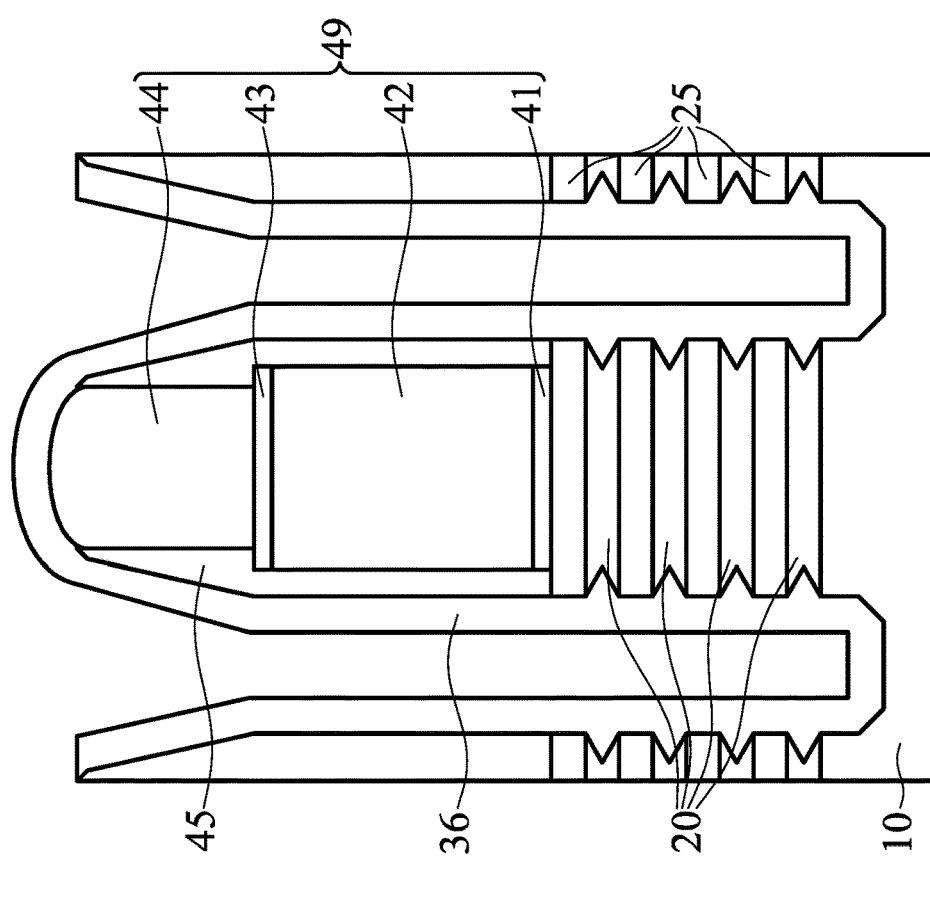

After the operations explained with respect to FIGS. 8A and 8B, a second cover layer 36 is formed both in the n-type region and the p-type region, as shown in FIGS. 21A and 21B. The second cover layer 36 includes one of silicon nitride and silicon oxide, SiON, SiOC, SiCN and SiOCN, or any other suitable dielectric material. The second cover layer 36 is made of a different material than the sidewall spacers (first cover layer) 45. The second insulating layer 36 can be formed by ALD or any other suitable methods.

Then, the second cover layer 36 in the p-type region is selectively removed by one or more lithography and etching operations. Further, the first cover layer 45 is anisotropicaly etched to remove the first cover layer 45 disposed on the source/drain region, while leaving the first cover layer 45 as sidewall spacers on side faces of the sacrificial gate structure 49 in the p-type region.

Further, as shown in FIG. 22B, the first and second semiconductor layers 20 and 25 in the source/drain region of the fin structure in the p-type region, which is not covered by the sacrificial gate structure 49, is etched, thereby forming a source/drain space 51. The n-type region is covered by the second cover layer 36, as shown in FIG. 22A.

In addition, the second semiconductor layers 25 are laterally etched in the X direction within the source/drain space 51, thereby forming cavities 52, as shown in FIG. 23B. The amount of etching of the second semiconductor layer 25 is in a range from about 2 nm to about 10 nm in some embodiments. When the first semiconductor layers 20 are Ge or SiGe and the second semiconductor layers 25 are Si, the second semiconductor layers 25 can be selectively etched by using a wet etchant such as, but not limited to, an ammonium hydroxide ($NH_4OH$) solution and/or a tetramethylammonium hydroxide (TMAH) solution. By using the ammonium hydroxide ($NH_4OH$) solution and/or the tetramethylammonium hydroxide (TMAH) solution and by selecting an appropriate crystal orientation of the second semiconductor layers 25, the etched surface of the end faces of the second semiconductor layers 25 have a V-shape (90 degree rotated) or a substantially triangular shape, defined by (111) facets of the second semiconductor layers 25. The n-type region is covered by the second cover layer 36, as shown in FIG. 23A.

Then, as shown in FIGS. 24A and 24B, the second cover layer 36 is removed in the n-type region by one or more etching operations. Since the second cover layer 36 is made of a different material than the sidewall spacers 45, the second cover layer 36 can be selectively removed.

Figure 25A:
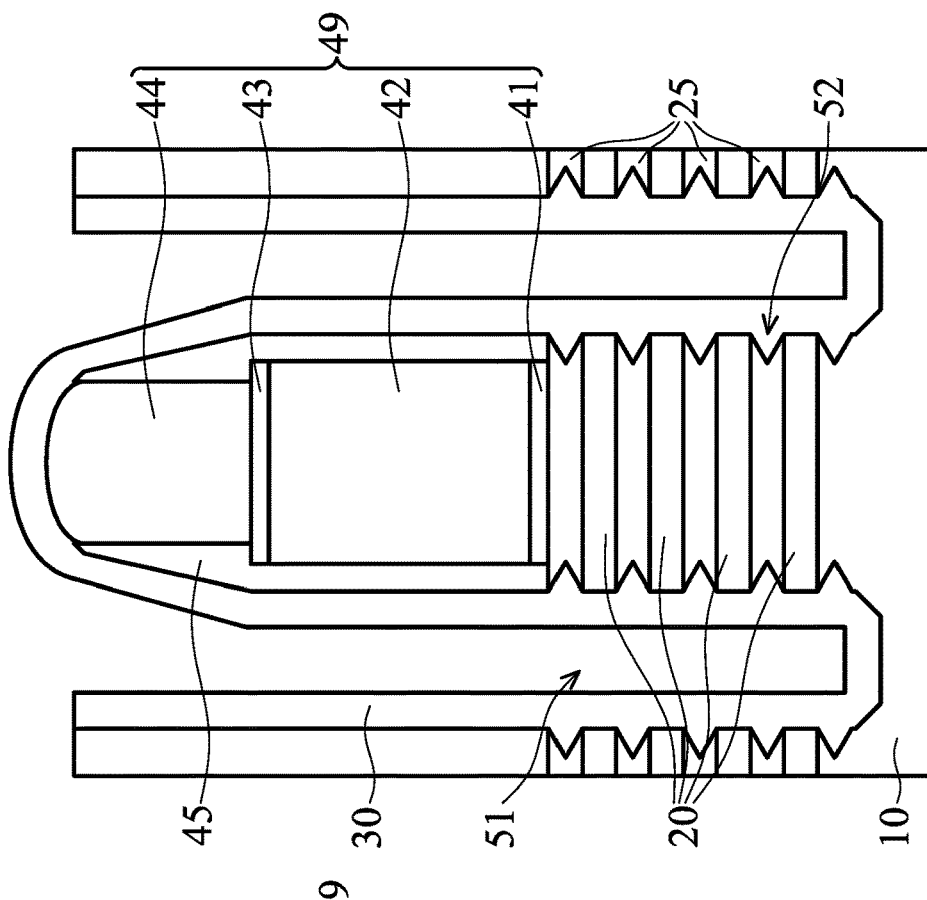
FIGS. 25A and 25B show one of the various stages of manufacturing a semiconductor GAA FET device according to another embodiment of the present disclosure.
Figure 25B:
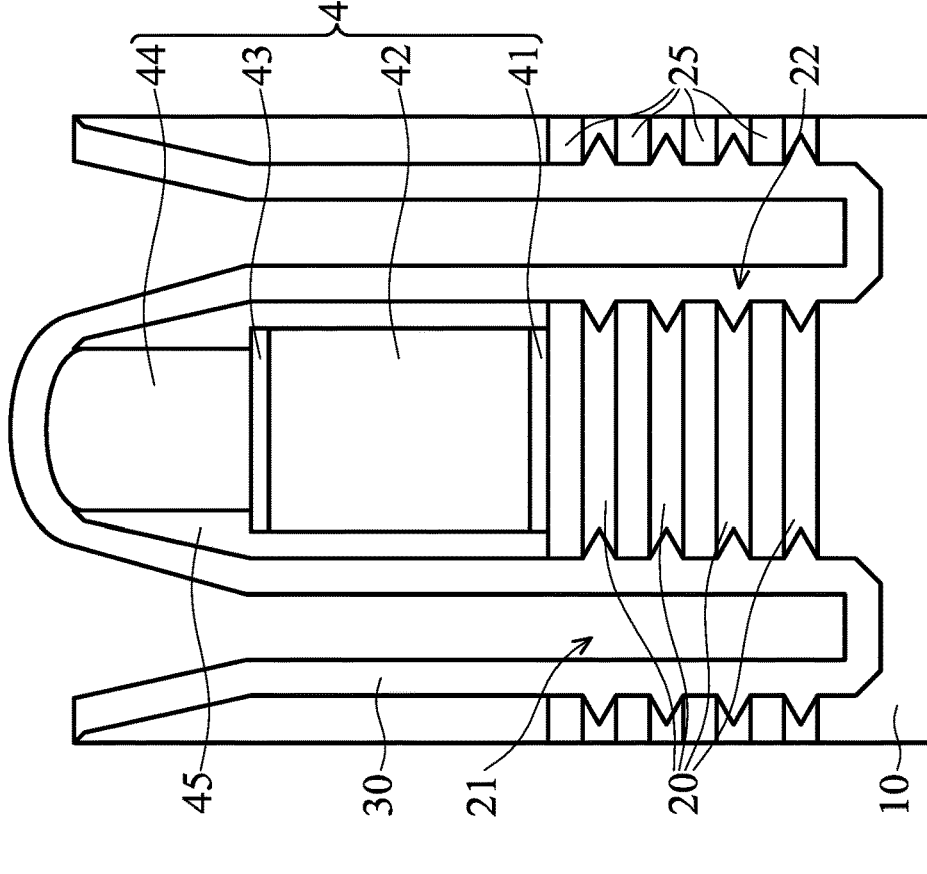

Then, a first insulating layer 30 is conformally formed on the etched lateral ends of the first semiconductor layer 20 and on end faces of the second semiconductor layer 25 in the source/drain space 21 in the n-type region, and on the etched lateral ends of the second semiconductor layers 25 and on end faces of the first semiconductor layer 20 in the source/drain space 51 in the p-type region, as shown in FIGS. 25A and 25B. The first insulating layer 30 is also formed over the sacrificial gate structure. The first insulating layer 30 includes one of silicon nitride and silicon oxide, SiON, SiOC, SiCN and SiOCN, or any other suitable dielectric material. The first insulating layer 30 is made of a different material than the sidewall spacers (first cover layer) 45. The first insulating layer 30 has a thickness in a range from about 1.0 nm to about 10.0 nm. In other embodiments, the first insulating layer 30 has a thickness in a range from about 2.0 nm to about 5.0 nm. The first insulating layer 30 can be formed by ALD or any other suitable methods. By conformally forming the first insulating layer 30, the cavities 22 and 52 are fully filled with the first insulating layer 30.

After the first insulating layer 30 is formed, an etching operation is performed to partially remove the first insulating layer 30, thereby forming inner spacers 35 and 65, as shown in FIGS. 26A and 26B.

In some embodiments, before forming the first insulating layer 30, an additional insulating layer having a smaller thickness than the first insulating layer 30 is formed, and thus the inner spacers 35 and 65 have a two-layer structure.

Figures 27A, 27B:
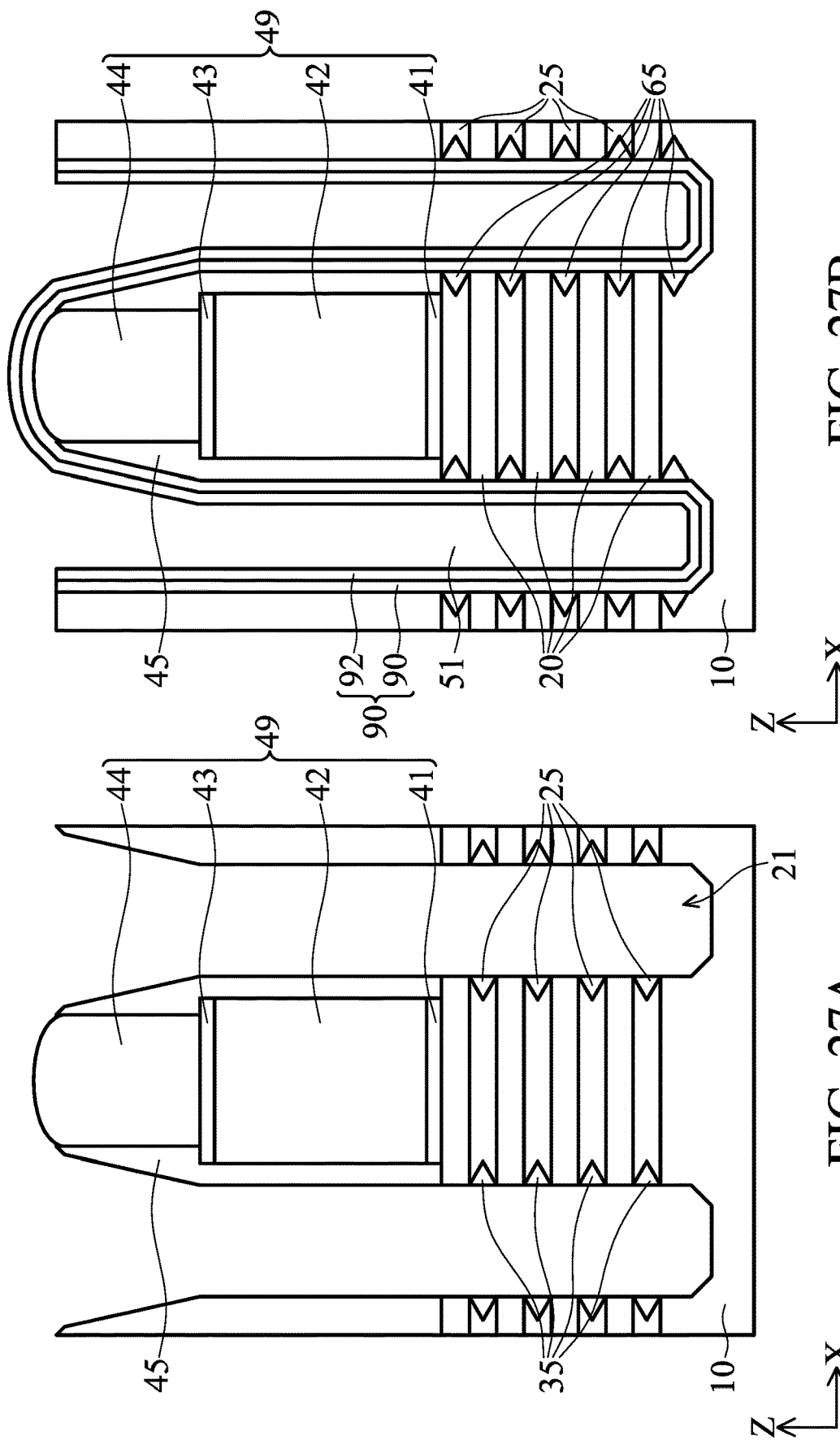
FIGS. 27A and 27B show one of the various stages of manufacturing a semiconductor GAA FET device according to another embodiment of the present disclosure.

After the inner spacers 35 and 65 are formed, a third cover layer 90 is formed to protect the p-type region, as shown in FIGS. 27A and 27B. The third cover layer 90 includes one or more layers of silicon nitride and silicon oxide, SiON, SiOC, SiCN and SiOCN, or any other suitable dielectric material. In some embodiments, the third cover layer 90 includes a under layer 91 made of a silicon oxide based material (e.g., silicon oxide or SiOC) and an upper layer 92 made of a silicon nitride based material (e.g., silicon nitride or SiON). The under layer 91 is made of a different material than the sidewall spacers (first cover layer) 45. The third cover layer 90 can be formed by ALD or any other suitable methods.

Figure 28A:
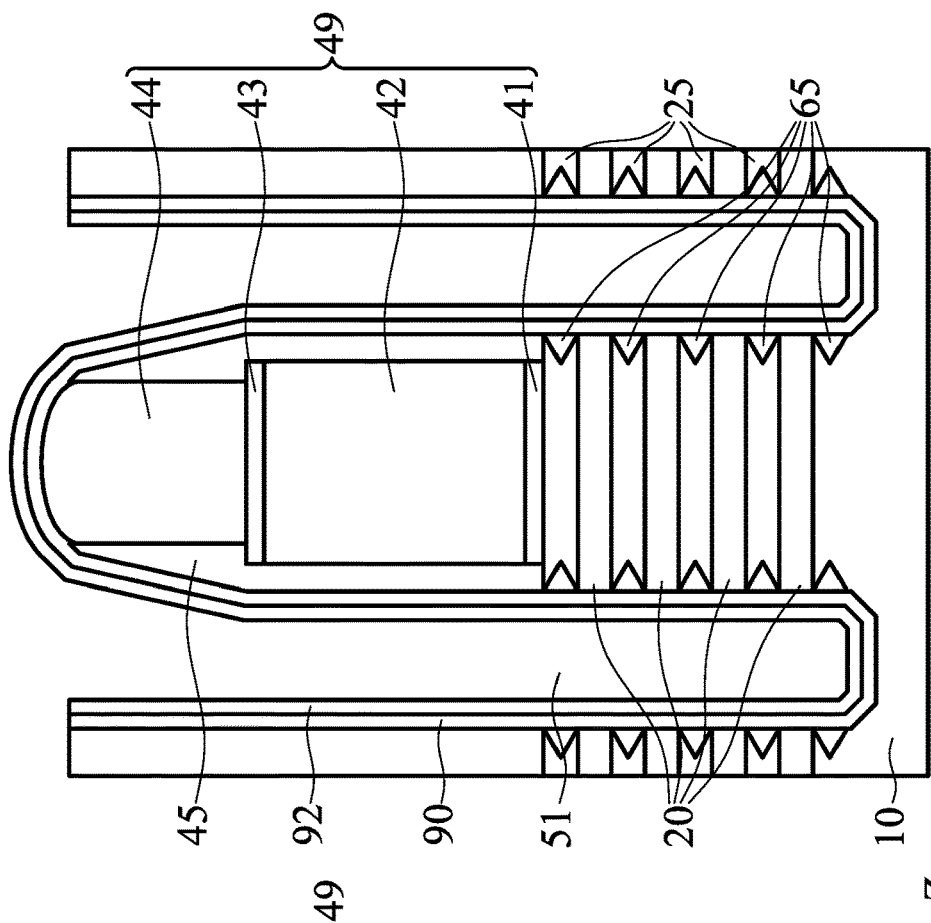
FIGS. 28A and 28B show one of the various stages of manufacturing a semiconductor GAA FET device according to another embodiment of the present disclosure.
Figure 28B:
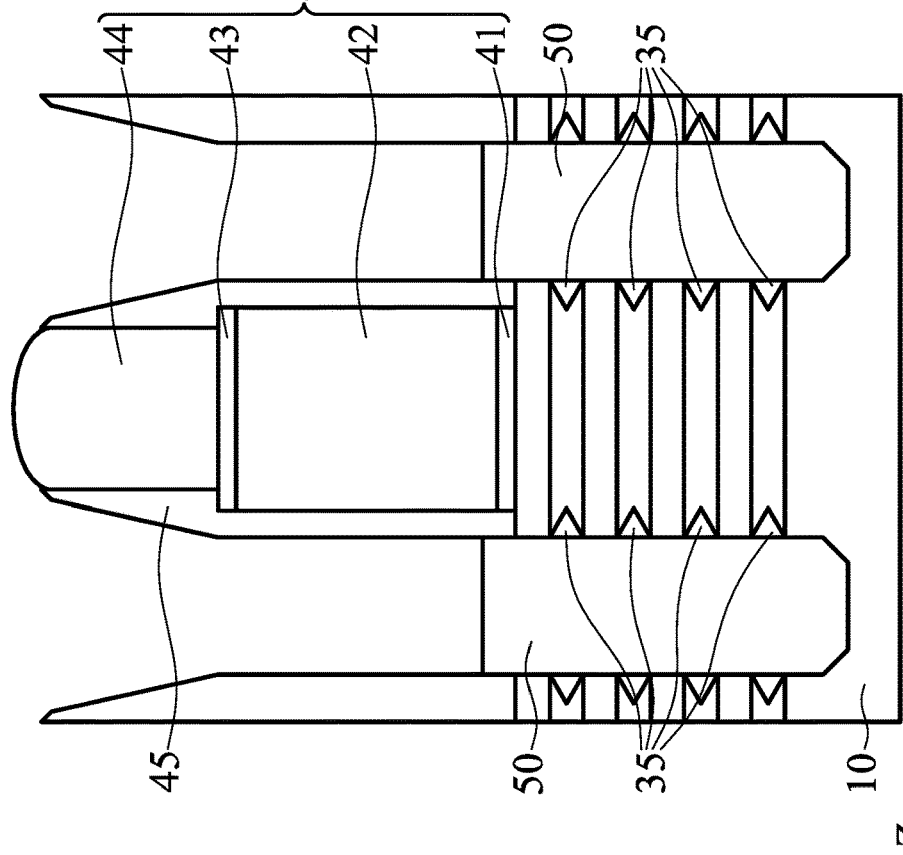

Subsequently, as shown in FIG. 28A, a source/drain epitaxial layer 50 is formed in the source/drain space 21, in the n-type region. The source/drain epitaxial layer 50 includes one or more layers of Si, SiP, SiC and SiCP for an n-channel FET. The source/drain epitaxial layer 50 is formed by an epitaxial growth method using CVD, ALD or molecular beam epitaxy (MBE). As shown in FIGS. 28A and 28B, the source/drain epitaxial layer 50 is selectively formed on semiconductor regions. The source/drain epitaxial layer 50 is formed in contact with end faces of the second semiconductor layers 25, and formed in contact with the inner spacers 35.

Then, as shown in FIG. 29B, the third cover layer 90 is removed from the p-type region, and a fourth cover layer 94 is formed to protect the n-type region, as shown in FIGS. 30A and 30B. The fourth cover layer 94 includes one or more layers of silicon nitride and silicon oxide, SiON, SiOC, SiCN and SiOCN, or any other suitable dielectric material. In some embodiments, the fourth cover layer 94 includes a under layer 95 made of a silicon oxide based material (e.g., $SiO_2$ or SiOC) and an upper layer 96 made of a silicon nitride based material (e.g., silicon nitride or SiON). The under layer 95 is made of a different material than the sidewall spacers (first cover layer) 45. The fourth cover layer 94 can be formed by ALD or any other suitable methods.

Figures 31A, 31B:
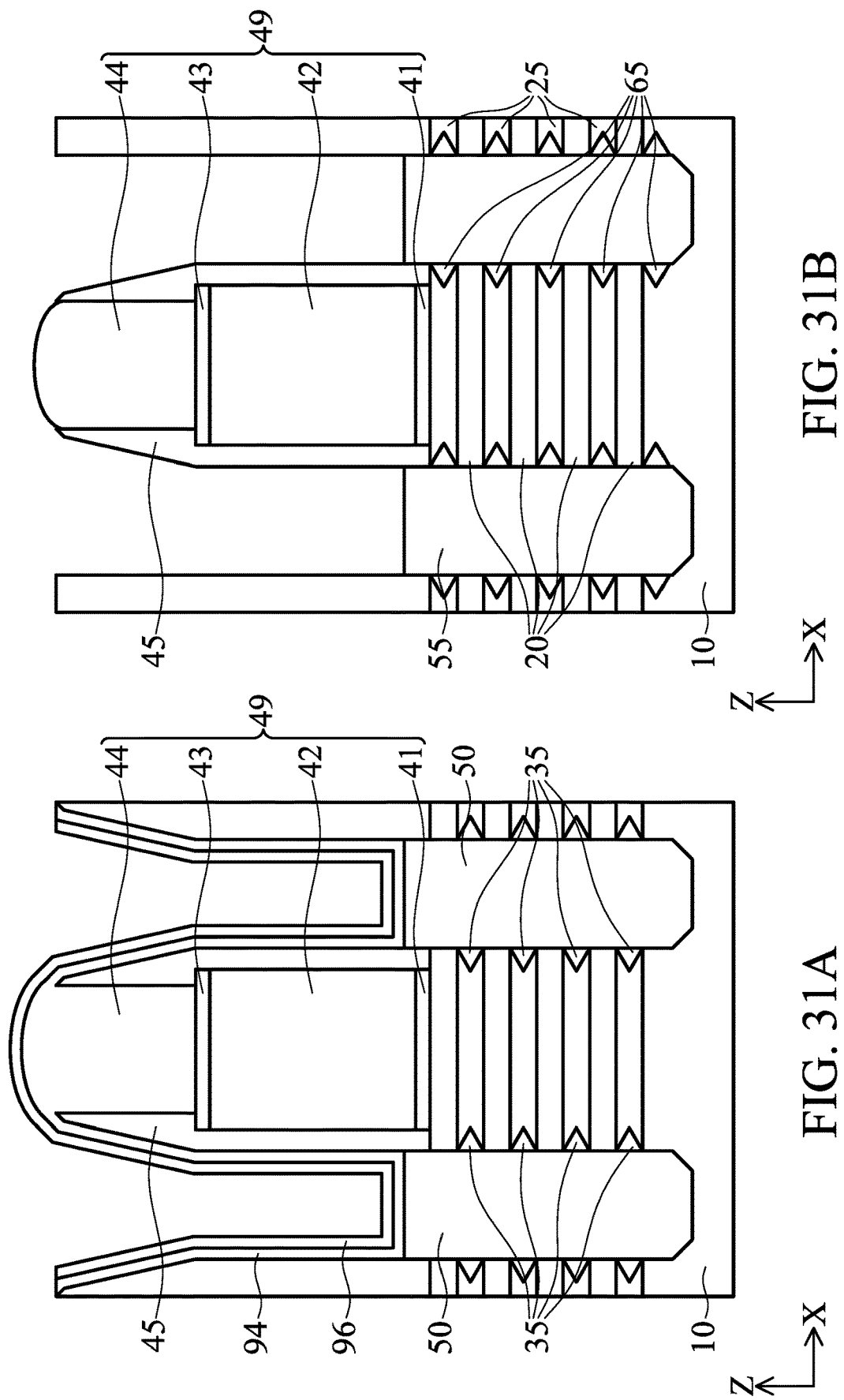
FIGS. 31A and 31B show one of the various stages of manufacturing a semiconductor GAA FET device according to another embodiment of the present disclosure.

Subsequently, as shown in FIG. 31B, a source/drain epitaxial layer 55 is formed in the source/drain space 51, in the p-type region. The source/drain epitaxial layer 55 is made of one or more of Si, SGe and SiGeB. The source/drain epitaxial layer 55 is formed by an epitaxial growth method using CVD, ALD or molecular beam epitaxy (MBE). As shown in FIGS. 31A and 31B, the source/drain epitaxial layer 55 is selectively formed on semiconductor regions. The source/drain epitaxial layer 55 is formed in contact with end faces of the first semiconductor layers 20, and formed in contact with the inner spacers 65. Then, as shown in FIGS. 32A and 32B, the fourth cover layer 94 is removed from the n-type region.

Subsequently, the same as or similar operations explained with respect to FIGS. 19A-20B are performed to form the metal gate structure and the contact structures. It is noted that in the foregoing embodiments, the order of the processes for the n-type GAA FET and the processes for the p-tyep GAA FET can be interchangeable. It is understood that the GAA FETs undergo further CMOS processes to form various features such as contacts/vias, interconnect metal layers, dielectric layers, passivation layers, etc.

FIGS. 33 to 38 show various stages of manufacturing a semiconductor GAA FET device according to another embodiment of the present disclosure. It is understood that additional operations can be provided before, during, and after processes shown by FIGS. 33-38, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-32B may be employed in the embodiment of FIGS. 33-38, and detailed explanation thereof may be omitted.

After the structure shown in FIG. 7A is formed, the first semiconductor layers 20 are laterally etched in the X direction within the source/drain space 21, thereby forming cavities 22', as shown in FIG. 33. The amount of etching of the first semiconductor layer 20 is in a range from about 2 nm to about 10 nm in some embodiments. When the first semiconductor layers 20 are Ge or SiGe and the second semiconductor layers 25 are Si, the first semiconductor layers 20 can be selectively etched by using a wet etchant such as, but not limited to, an HCl solution and/or a mixed solution of $NH_4OH$, $H_2O_2$ and $H_2O$, or any other suitable etchant is used. In some embodiments, chemical or plasma dry etching is used. In some embodiments, similar to FIG. 8A, the etched surface of the end faces of the first semiconductor layers 20 has a V-shape (90 degree rotated) or a substantially triangular shape, defined by (111) facets of the first semiconductor layers 20. In other embodiments, the etched surface of the end faces of the first semiconductor layers 20 has a rounded or a curved shape (e.g., a U-shape (90 degree rotated)) convex toward the first semiconductor layers 20, as shown in FIG. 33.

Then, as shown in FIG. 34, the side face of the first semiconductor layers 20 and the second semiconductor layers 25 are oxidized to form an oxide layer 33. The oxide layer 33 is a silicon oxide, germanium oxide or silicon-germanium oxide and can be expressed as $Si_{1-x}Ge_xO_y$, ($0 \leq x \leq 1$ and $0 < y \leq 2$). Depending on the Ge content of the first semiconductor layer 22 and the second semiconductor layers 25, the oxide layer 33 has portions having different composition. In some embodiments, the first semiconductor layers 20 are made of SiGe and the second semiconductor layers 25 are made of SiGe and the Ge content in the first semiconductor layers 20 is greater than the Ge content in the second semiconductor layers 25. The oxidation process includes thermal oxidation, plasma oxidation and/or wet chemical oxidation in some embodiments. The thickness of the oxide layer 33 on the end of the first semiconductor layer 20 is in a range from about 0.5 nm to about 2 nm in some embodiments and is in a range from about 1 nm to about 1.5 nm in other embodiments.

After the oxide layer 33 is formed, the operations explained with respect to FIGS. 9A and 10A are performed to form inner spacers. The inner spacers includes the oxide layer 33 as a first layer and a second layer 35, as shown in FIG. 35. In some embodiments, the oxide layer 33 formed on the ends of the second semiconductor layers 25 and over the fin structure 11 is fully or partially removed. The thickness of the oxide layer 33 on the end of the first semiconductor layer 20 is smaller than the thickness of the second layer 35 in some embodiments.

Then, the operations explained with respect to FIG. 11A are performed to form a source/drain epitaxial layer 50, as shown in FIG. 36.

Further, the gate replacement process and the contact formation process as set forth above are performed to obtain the n-type GAA FET as shown in FIG. 37. Similarly, the p-type GAA FET is formed as shown in FIG. 38, which also includes inner spacers including an oxide layer 63, which is formed by the same or similar process as the oxide layer 33 and has the same or similar properties as the oxide layer 33, as a first layer and a second layer 65.

In some embodiments, the source/drain epitaxial layers 50 (and/or 55) wrap around the second semiconductor layer 25 (and/or the first semiconductor layers 20) similar to FIG. 2A (and/or FIG. 4A).

It is understood that the GAA FETs undergo further CMOS processes to form various features such as contacts/vias, interconnect metal layers, dielectric layers, passivation layers, etc.

The various embodiments or examples described herein offer several advantages over the existing art. For example, in the present disclosure, in a GAA FET, an inner spacer having a triangle shape (or a wedge-shape) is provided between a metal gate electrode and a source/drain epitaxial layer. Compared with a rectangular shape, the triangle shape (or a wedge-shape) inner spacers can provide a larger effective gate width (source-drain direction) because more areas of the semiconductor wires can be wrapped around by the gate dielectric layer and the gate electrode. The methods disclosed herein uniformly form the inner spacers by using wet etching. Further, due to a self-limited etch stop property of the inner spacers, it is possible to more precisely control gate formation processes. With the foregoing embodiments, it is possible to more precisely control the thickness, the shape and/or the location of the inner spacers and thus to control capacitances around the source/drain and the gate.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a fin structure, in which first semiconductor layers and second semiconductor layers are alternately stacked, is formed. A sacrificial gate structure is formed over the fin structure. A source/drain region of the fin structure, which is not covered by the sacrificial gate structure, is etched, thereby forming a source/drain space. The first semiconductor layers are laterally etched through the source/drain space. An inner spacer made of a dielectric material is formed on an end of each of the etched first semiconductor layers. A source/drain epitaxial layer is formed in the source/drain space to cover the inner spacer. A lateral end of each of the first semiconductor layers has a V-shape cross section after the first semiconductor layers are laterally etched. In one or more of the foregoing or following embodiments, the lateral end of each of the first semiconductor layers has a (111) facet of a semiconductor crystal. In one or more of the foregoing or following embodiments, the first semiconductor layers are laterally etched by wet etching. In one or more of the foregoing or following embodiments, the wet etching utilizes an HCl acid solution or a mixed solution of $NH_4OH$, $H_2O_2$ and $H_2O$. In one or more of the foregoing or following embodiments, the inner spacer is formed by the following operations. A dielectric layer is formed in the source/drain space, and the dielectric layer is etched, thereby leaving the inner spacer on the end of each of the etched first semiconductor layers remaining. In one or more of the foregoing or following embodiments, before the first semiconductors are laterally etched, sidewall spacers are formed on side faces of the sacrificial gate structure. The sidewall spacers are made of a different material than the inner spacer. In one or more of the foregoing or following embodiments, the inner spacers include at least one of silicon nitride and silicon oxide. In one or more of the foregoing or following embodiments, the inner spacers include at least one of SiOC, SiOCN and SiCN. In one or more of the foregoing or following embodiments, in the etching a source/drain region of the fin structure, the first and second semiconductor layers of the source/drain region of the fin structure are etched. In one or more of the foregoing or following embodiments, in the etching a source/drain region of the fin structure, the first semiconductor layers of the source/drain region of the fin structure are selectively etched, thereby leaving the second semiconductor layers remaining. In one or more of the foregoing or following embodiments, after the source/drain epitaxial layer is formed, the sacrificial gate structure is removed, thereby exposing a part of the fin structure, the first semiconductor layers are removed from the exposed fin structure, thereby forming channel layers including the second semiconductor layers, and a gate dielectric layer and a gate electrode layer are formed around the channel layers. The gate electrode layer is isolated from the source/drain epitaxial layer by the inner spacer and the gate dielectric layer. In one or more of the foregoing or following embodiments, the first semiconductor layers are made of SiGe, and the second semiconductor layers are made of Si. In one or more of the foregoing or following embodiments, the first semiconductor layers are made of Si, and the second semiconductor layers are made of SiGe.

In accordance with another aspect of the present disclosure, in a method of manufacturing a semiconductor device, a first fin structure and a second fin structure, in both which first semiconductor layers and second semiconductor layers are alternately stacked, are formed. A first sacrificial gate structure is formed over the first fin structure and a second sacrificial gate structure over the second fin structure. While the second fin structure with the second sacrificial gate structure are protected, a source/drain region of the first fin structure, which is not covered by the first sacrificial gate structure, is etched thereby forming a first source/drain space, the first semiconductor layers are etched in the first source/drain space, a first inner spacer made of a dielectric material is formed on an end of each of the etched first semiconductor layers, and a first source/drain epitaxial layer is formed in the first source/drain space to cover the inner spacer, thereby forming a first structure. While the first structure is protected, the second semiconductor layers are etched in a source/drain region of the second fin structure, which is not covered by the second sacrificial gate structure, thereby forming a second source/drain space, the second semiconductor layers are laterally etched through the second source/drain space, a second inner spacer made of a dielectric material is formed on an end of each of the etched second semiconductor layers, and a second source/drain epitaxial layer is formed in the second source/drain space to cover the second inner spacer, thereby forming a second structure. A lateral end of each of the first semiconductor layers has a V-shape cross section after the first semiconductor layers are laterally etched, and a lateral end of each of the second semiconductor layers has a V-shape cross section after the second semiconductor layers are laterally etched. In one or more of the foregoing or following embodiments, in the etching the second semiconductor layers in a source/drain region of the second fin structure, the second semiconductor layers are selectively etched, thereby leaving the first semiconductor layers remaining, and the second source/drain epitaxial layer wraps around the first semiconductor layers. In one or more of the foregoing or following embodiments, the lateral end of each of the first semiconductor layers and the lateral end of each of the second semiconductor layers have a (111) facet of a semiconductor crystal, respectively. In one or more of the foregoing or following embodiments, the first semiconductor layers are laterally etched by wet etching utilizing an HCl acid solution or a mixed solution of $NH_4OH$, $H_2O_2$ and $H_2O$. In one or more of the foregoing or following embodiments, the second semiconductor layers are laterally etched by wet etching utilizing at least one of an ammonium hydroxide ($NH_4OH$) solution and tetramethylammonium hydroxide (TMAH) solution. In one or more of the foregoing or following embodiments, sidewall spacers are formed on side faces of the first sacrificial gate structure and on side faces of the second sacrificial gate structure. The sidewall spacers are made of a different material than the first and second inner spacers.

In accordance with another aspect of the present disclosure, in a method of manufacturing a semiconductor device, a first fin structure and a second fin structure, in both which first semiconductor layers and second semiconductor layers are alternately stacked, are formed. A first sacrificial gate structure is formed over the first fin structure and a second sacrificial gate structure over the second fin structure. A source/drain region of the first fin structure, which is not covered by the first sacrificial gate structure, is etched thereby forming a first source/drain space, and the first semiconductor layers are laterally etched in the first source/drain space. A source/drain region of the second fin structure, which is not covered by the second sacrificial gate structure, is etched thereby forming a second source/drain space. The second semiconductor layers are laterally etched in the second source/drain space. A dielectric layer is formed in the first and second spaces. A first inner spacer is formed on an end of each of the etched first semiconductor layers and a second inner spacer is formed on an end of each of the etched second semiconductor layers. A first source/drain epitaxial layer is formed in the first source/drain space to cover the first inner spacer, and a second source/drain epitaxial layer is formed in the second source/drain space to cover the second inner spacer. A lateral end of each of the first semiconductor layers has a V-shape cross section after the first semiconductor layers are laterally etched, and a lateral end of each of the second semiconductor layers has a V-shape cross section after the second semiconductor layers are laterally etched.

In accordance with one aspect of the present disclosure, a semiconductor device includes semiconductor wires disposed over a substrate, a source/drain epitaxial layer in contact with the semiconductor wires, a gate dielectric layer disposed on and wrapping around each channel region of the semiconductor wires, a gate electrode layer disposed on the gate dielectric layer and wrapping around the each channel region, and insulating spacers disposed in spaces, respectively. The spaces are defined by adjacent semiconductor wires, the gate electrode layer and the source/drain region. Each of the insulating spacers has a triangular or wedge-shaped cross section. In one or more of the foregoing or following embodiments, the insulating spacers are in contact with the source/drain epitaxial layer. In one or more of the foregoing or following embodiments, the semiconductor device further includes sidewall spacers disposed on side faces of the gate electrode layer. The sidewall spacers are made of a different material than the insulating spacers. In one or more of the foregoing or following embodiments, the insulating spacers include at least one of silicon nitride and silicon oxide. In one or more of the foregoing or following embodiments, the insulating spacers include at least one of SiOC, SiOCN and SiCN. In one or more of the foregoing or following embodiments, the source/drain epitaxial layer is in contact with lateral end faces of the semiconductor wires. In one or more of the foregoing or following embodiments, the semiconductor wires are made of Si. In one or more of the foregoing or following embodiments, the semiconductor wires are made of SiGe. In one or more of the foregoing or following embodiments, the source/drain epitaxial layer wraps around end portions of the semiconductor wires. In one or more of the foregoing or following embodiments, the semiconductor wires are made of SiGe.

In accordance with another aspect of the present disclosure, a semiconductor device includes semiconductor wires disposed over a substrate, a source/drain epitaxial layer in contact with the semiconductor wires, a gate dielectric layer disposed on and wrapping around each channel region of the semiconductor wires, a gate electrode layer disposed on the gate dielectric layer and wrapping around the each channel region, and insulating spacers disposed in spaces, respectively. The spaces are defined by adjacent semiconductor wires, the gate electrode layer and the source/drain region. In one or more of the foregoing or following embodiments, each of the insulating spacers has a triangular or wedge-shaped cross section, and at least one of the insulating spacers is disposed above an uppermost one of the semiconductor wires. In one or more of the foregoing or following embodiments, the semiconductor wires are made of SiGe. In one or more of the foregoing or following embodiments, the semiconductor device further includes sidewall spacers disposed on side faces of the gate electrode layer. The sidewall spacers are made of a different material than the insulating spacers. In one or more of the foregoing or following embodiments, the insulating spacers include at least one of silicon nitride and silicon oxide. In one or more of the foregoing or following embodiments, the insulating spacers include at least one of SiOC, SiOCN and SiCN. In one or more of the foregoing or following embodiments, the source/drain epitaxial layer is in contact with lateral end faces of the semiconductor wires.

In accordance with another aspect of the present disclosure, a semiconductor device includes semiconductor wires disposed over a substrate, a source/drain epitaxial layer in contact with the semiconductor wires, a gate dielectric layer disposed on and wrapping around each channel region of the semiconductor wires, a gate electrode layer disposed on the gate dielectric layer and wrapping around the each channel region, and insulating spacers disposed in spaces, respectively, the spaces being defined by adjacent semiconductor wires, the gate electrode layer and the source/drain region. Each of the insulating spacers has a triangular or wedge-shaped cross section, and the source/drain epitaxial layer wraps around end portions of the semiconductor wires. In one or more of the foregoing or following embodiments, the semiconductor wires are made of SiGe. In one or more of the foregoing or following embodiments, the insulating spacers are in contact with the source/drain epitaxial layer. In one or more of the foregoing or following embodiments, the insulating spacers include at least one of SiOC, SiOCN and SiCN.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
semiconductor wires disposed over a substrate each having a channel region and a source/drain region adjacent to the channel region;
a source/drain epitaxial layer wrapping around the source/drain region of each of the semiconductor wires;
a gate dielectric layer disposed on and wrapping around the channel region of each of the semiconductor wires;
a gate electrode layer disposed on the gate dielectric layer;
a gate sidewall spacer disposed on a side face of the gate electrode layer; and
insulating spacers each disposed between the gate dielectric layer and the source/drain epitaxial layer, wherein;
the source/drain region extends into the source/drain epitaxial layer beyond the gate sidewall spacer,
an additional insulating spacer made of a same material as the insulating spacers is disposed above an uppermost one of the semiconductor wires,
the additional insulating spacer is separated from the gate electrode layer by the gate dielectric layer, and
an entirely of the additional insulating spacer is located below the gate sidewall spacer.

2. The semiconductor device of claim 1, wherein each of the insulating spacers and the additional insulating spacer includes two layers.

3. The semiconductor device of claim 2, wherein the two layers are a first layer and a second layer formed on the first layer, and the first layer has a smaller thickness than the second layer.

4. The semiconductor device of claim 2, wherein the insulating spacers and the additional insulating spacer include at least one of SiOC, SiOCN and SiCN.

5. The semiconductor device of claim 3, wherein the first layer of the insulating spacers is in contact with the gate dielectric layer.

6. The semiconductor device of claim 5, wherein the gate sidewall spacer is made of a different material than the insulating spacers and the additional insulating spacer.

7. The semiconductor device of claim 1, wherein an interface between the gate dielectric layer and each of the insulating spacers is curved and convex toward the gate dielectric layer.

8. The semiconductor device of claim 1, wherein the semiconductor wires are made of SiGe.

9. A semiconductor device, comprising:
semiconductor wires disposed over a substrate;
a source/drain epitaxial layer in contact with the semiconductor wires;
a gate dielectric layer disposed on and wrapping around each channel region of the semiconductor wires;
a gate electrode layer disposed on the gate dielectric layer and wrapping around the each channel region;
a gate sidewall spacer disposed on a side face of the gate electrode layer; and
insulating spacers each enclosed by adjacent semiconductor wires, the gate dielectric layer and the source/drain region,
wherein each of the insulating spacers includes two layers having a first layer and a second layer formed on the first layer, and the first layer having a smaller thickness than the second layer, and
the first layer includes silicon germanium oxide.

10. The semiconductor device of claim 9, wherein the second layer of the insulating spacers includes at least one of SiOC, SiOCN and SiCN.

11. The semiconductor device of claim 9, wherein the first layer is in contact with the gate dielectric layer.

12. The semiconductor device of claim 9, wherein an interface between the gate dielectric layer and the first layer of the insulating spacers is convex toward the gate dielectric layer.

13. The semiconductor device of claim 12, wherein an interface between the first layer and the second layer of the insulating spacers is convex toward the gate dielectric layer.

14. A semiconductor device, comprising:
   semiconductor wires disposed over a bottom fin structure disposed over a substrate;
   a source/drain epitaxial layer in contact with the semiconductor wires, a bottom of the source/drain epitaxial layer partially penetrating into the bottom fin structure;
   a gate dielectric layer disposed on and wrapping around each channel region of the semiconductor wires;
   a gate electrode layer disposed on the gate dielectric layer and wrapping around the each channel region;
   a gate sidewall spacer disposed on a side face of the gate electrode layer; and
   insulating spacers each enclosed by adjacent semiconductor wires, the gate dielectric layer and the source/drain region,
   wherein each of the insulating spacers includes two layers having a first layer and a second layer formed on the first layer, and the first layer is germanium oxide.

15. The semiconductor device of claim 14, wherein the first layer has a smaller thickness than the second layer.

16. The semiconductor device of claim 15, wherein the first layer is in contact with the gate dielectric layer.

17. The semiconductor device of claim 15, wherein an interface between the gate dielectric layer and the first layer of the insulating spacers is convex toward the gate dielectric layer.

18. The semiconductor device of claim 17, wherein an interface between the first layer and the second layer of the insulating spacers is convex toward the gate dielectric layer.

19. The semiconductor device of claim 14, wherein the source/drain epitaxial layer is in contact with ends of the semiconductor wires.

20. The semiconductor device of claim 14, wherein a source/drain epitaxial layer wraps around a source/drain region of each of the semiconductor wires.

* * * * *